(12) United States Patent
Yanagidaira

(10) Patent No.: US 12,148,481 B2
(45) Date of Patent: Nov. 19, 2024

(54) SEMICONDUCTOR MEMORY DEVICE WITH FIRST AND SECOND SENSE AMPLIFIERS

(71) Applicant: KIOXIA CORPORATION, Tokyo (JP)

(72) Inventor: Kosuke Yanagidaira, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/362,289

(22) Filed: Jul. 31, 2023

(65) Prior Publication Data
US 2023/0410916 A1 Dec. 21, 2023

Related U.S. Application Data

(63) Continuation of application No. 17/326,954, filed on May 21, 2021, now Pat. No. 11,756,628, which is a
(Continued)

(30) Foreign Application Priority Data

Sep. 14, 2017 (JP) .................................. 2017-176657

(51) Int. Cl.
*G11C 16/26* (2006.01)
*G11C 11/56* (2006.01)
(Continued)

(52) U.S. Cl.
CPC .......... *G11C 16/26* (2013.01); *G11C 11/5642* (2013.01); *G11C 16/0483* (2013.01);
(Continued)

(58) Field of Classification Search
CPC . G11C 16/26; G11C 11/5642; G11C 16/0483; G11C 16/08; G11C 16/24;
(Continued)

(56) References Cited

U.S. PATENT DOCUMENTS 8,760,937 B2 6/2014 Honda
8,773,917 B2 7/2014 Yuh
(Continued)

FOREIGN PATENT DOCUMENTS

CN 105976863 A 9/2016
JP 2013-232262 11/2013

*Primary Examiner* — Jerome Leboeuf
(74) *Attorney, Agent, or Firm* — Oblon, McClelland, Maier & Neustadt, L.L.P.

(57) ABSTRACT

According to one embodiment, a semiconductor memory device includes a first conductor extending in a first direction, bit lines, sense amplifiers, and a second conductor extending in the first direction. A plurality of first memory cells being connected to the first conductor. The bit lines respectively connected to the first memory cells. The first sense amplifiers are respectively connected to a plurality of first bit lines included in the bit lines, each of the first sense amplifiers including a first sense node, and a first transistor connected between the first sense node and a corresponding one of the first bit lines. The second conductor function as gate electrodes of the first transistors included in the first sense amplifiers.

13 Claims, 36 Drawing Sheets

Related U.S. Application Data continuation of application No. 16/681,310, filed on Nov. 12, 2019, now Pat. No. 11,049,571, which is a continuation of application No. 15/911,383, filed on Mar. 5, 2018, now Pat. No. 10,515,703.

(51) Int. Cl.

| | |
|---|---|
| *G11C 16/04* | (2006.01) |
| *G11C 16/08* | (2006.01) |
| *G11C 16/24* | (2006.01) |
| *G11C 16/32* | (2006.01) |
| *H10B 41/10* | (2023.01) |
| *H10B 41/27* | (2023.01) |
| *H10B 41/35* | (2023.01) |
| *H10B 43/35* | (2023.01) |
| *G11C 16/10* | (2006.01) |
| *H10B 43/10* | (2023.01) |
| *H10B 43/27* | (2023.01) |

(52) U.S. Cl.
CPC ............ *G11C 16/08* (2013.01); *G11C 16/24* (2013.01); *G11C 16/32* (2013.01); *H10B 41/10* (2023.02); *H10B 41/27* (2023.02); *H10B 41/35* (2023.02); *H10B 43/35* (2023.02); *G11C 11/5671* (2013.01); *G11C 16/10* (2013.01); *H10B 43/10* (2023.02); *H10B 43/27* (2023.02)

(58) Field of Classification Search
CPC ..... G11C 16/32; G11C 11/5671; G11C 16/10; H10B 41/10; H10B 41/27; H10B 41/35; H10B 43/35; H10B 43/10; H10B 43/27
See application file for complete search history.

(56) References Cited

U.S. PATENT DOCUMENTS

| | | | |
|---|---|---|---|
| 9,190,156 | B2 | 11/2015 | Sako |
| 11,049,571 | B2* | 6/2021 | Yanagidaira ............ G11C 16/32 |
| 11,756,628 | B2* | 9/2023 | Yanagidaira ......... G11C 11/5642 |
| | | | 365/185.21 |
| 2007/0147113 | A1 | 6/2007 | Mokhlesi et al. |
| 2009/0154217 | A1 | 6/2009 | Kurjanowicz et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0103152 | A1 | 5/2011 | Yoshihara |
| 2011/0284946 | A1 | 11/2011 | Kiyotoshi |
| 2012/0069663 | A1 | 3/2012 | Itagaki et al. |
| 2013/0279255 | A1 | 10/2013 | Kamata |
| 2015/0009756 | A1 | 1/2015 | D'Alessandro |
| 2016/0078954 | A1 | 3/2016 | Shirakawa |
| 2016/0189770 | A1 | 6/2016 | Abe |
| 2016/0267991 | A1 | 9/2016 | Hashimoto et al. |
| 2016/0307638 | A1 | 10/2016 | Shirakawa et al. |
| 2017/0365348 | A1 | 12/2017 | Kamata et al. |

\* cited by examiner

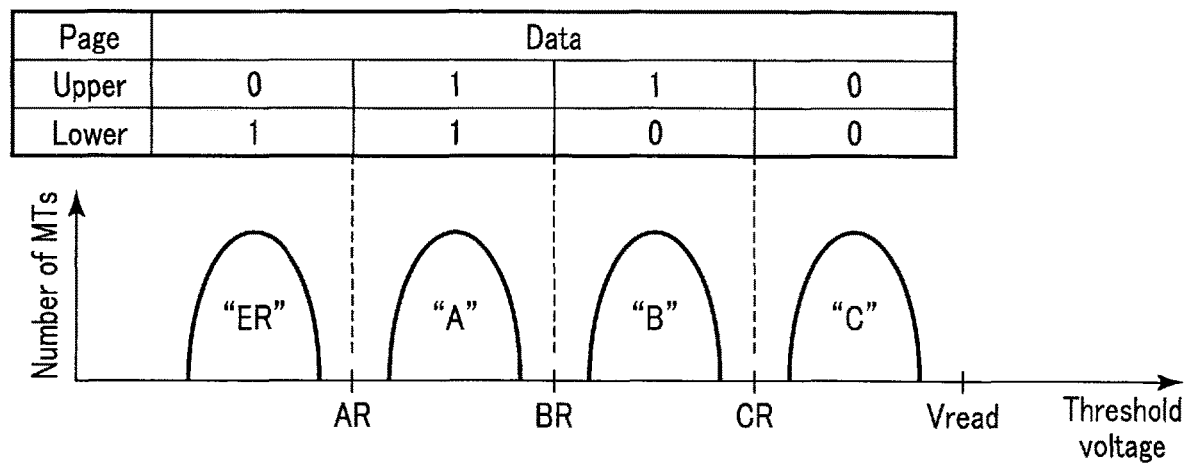
F I G. 3

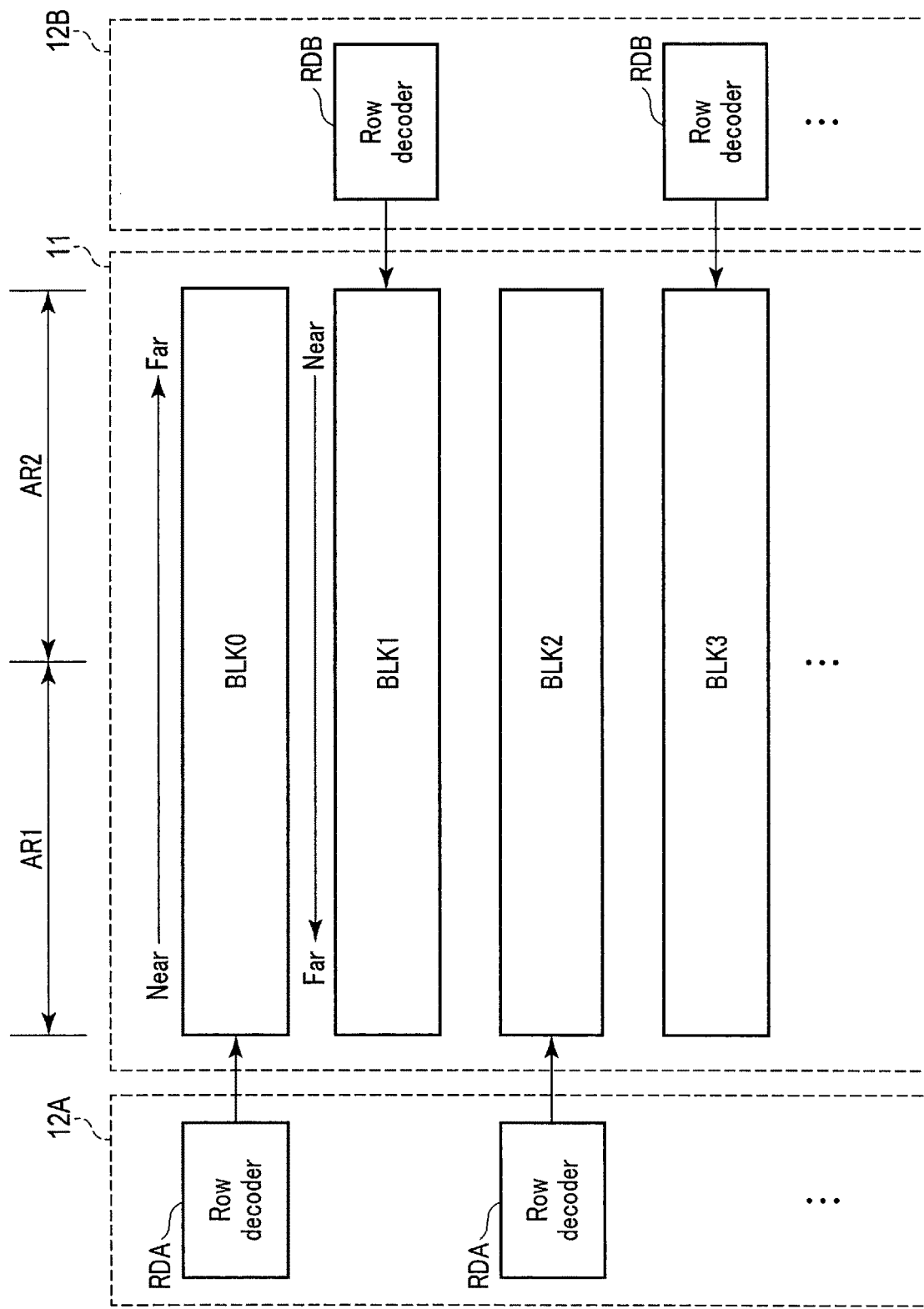
F I G. 4

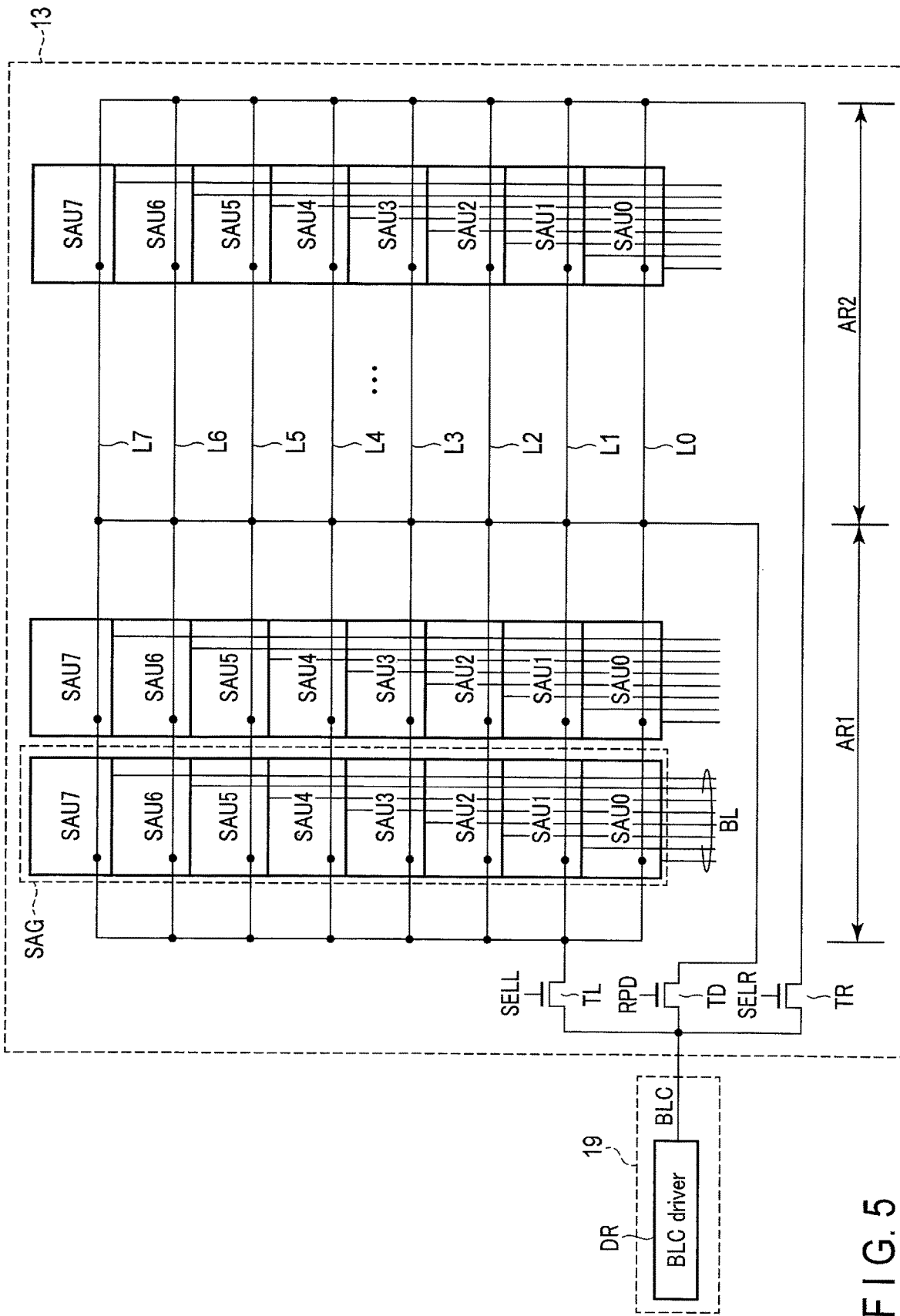
F I G. 5

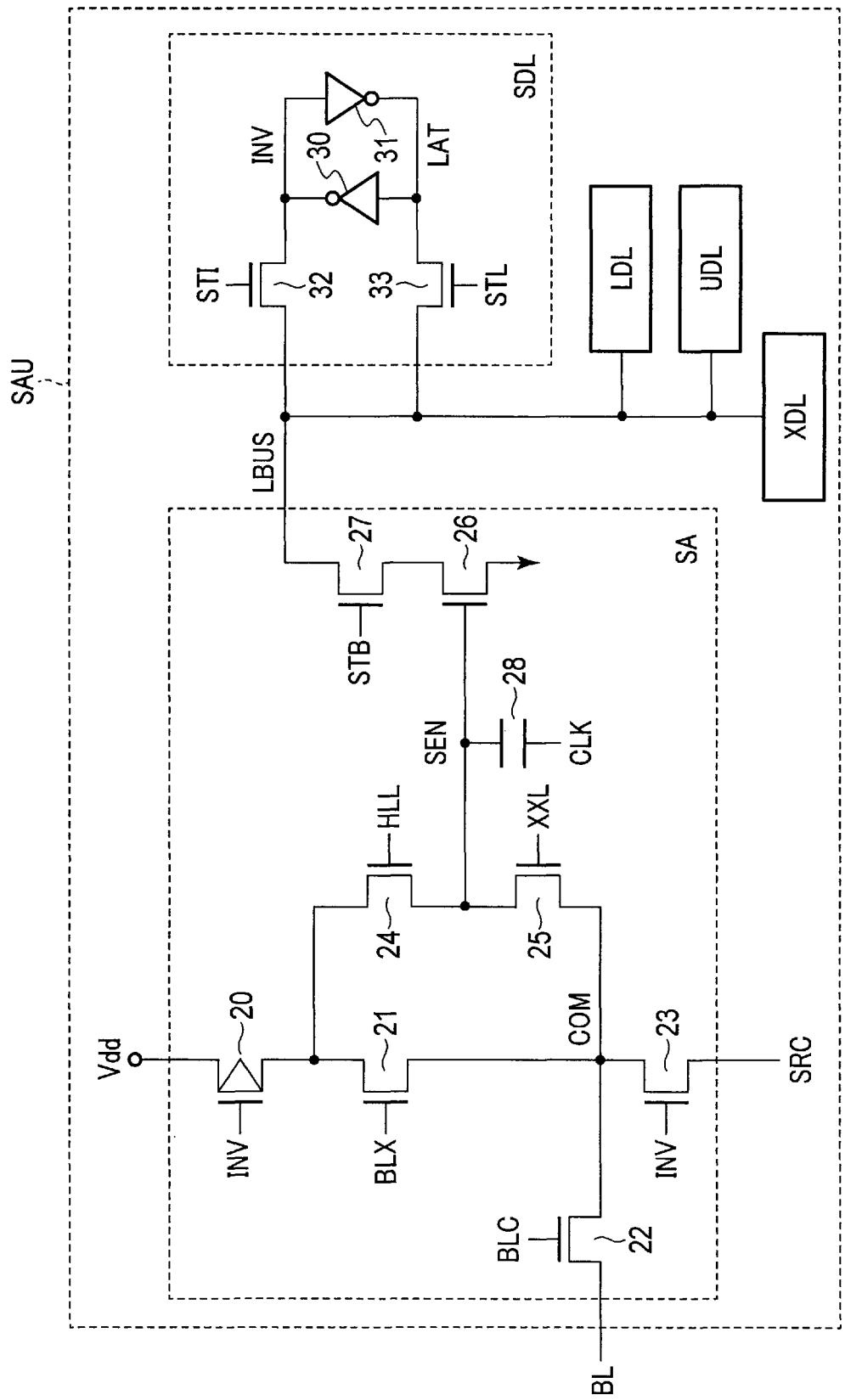
F I G. 6

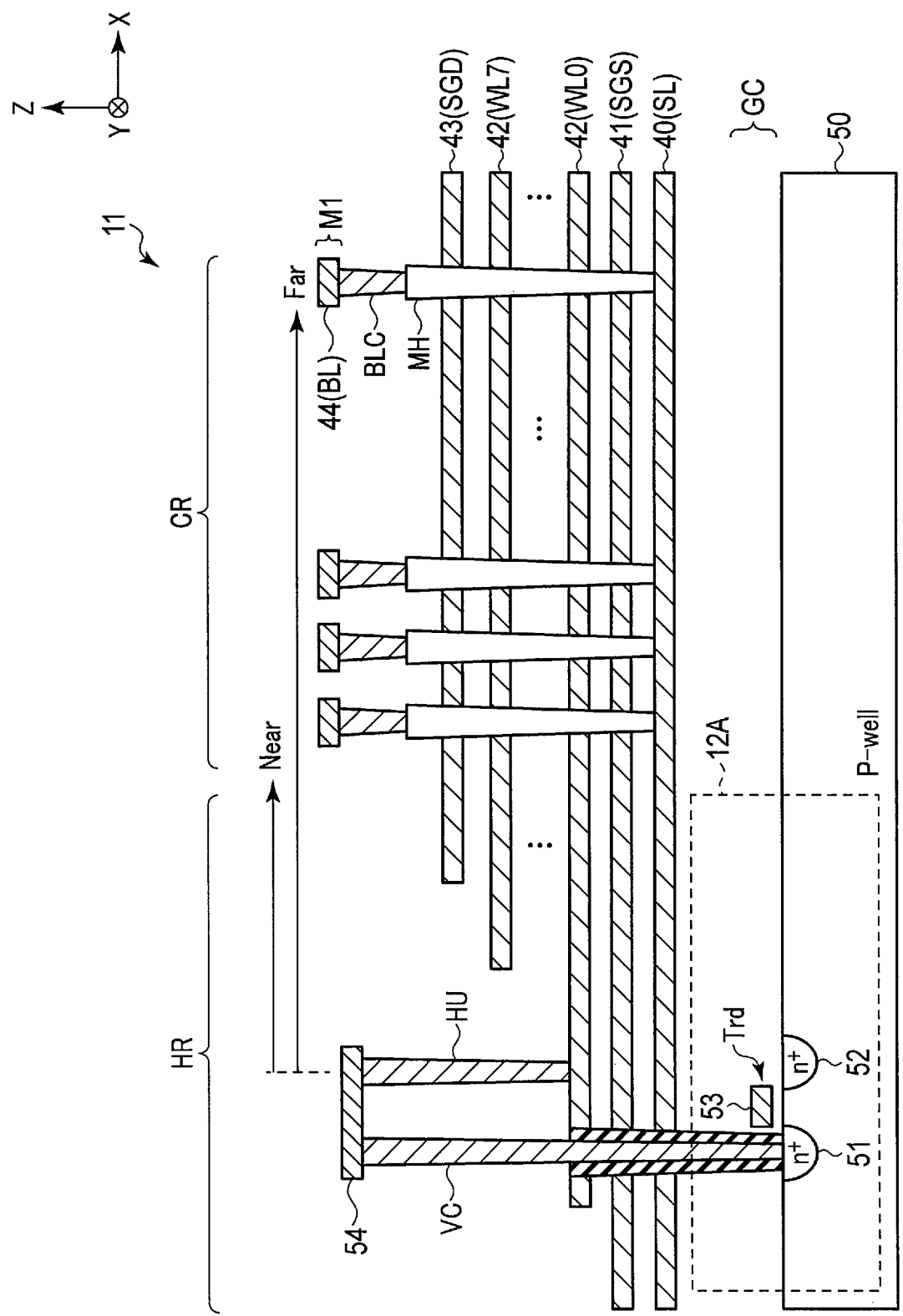
F I G. 9

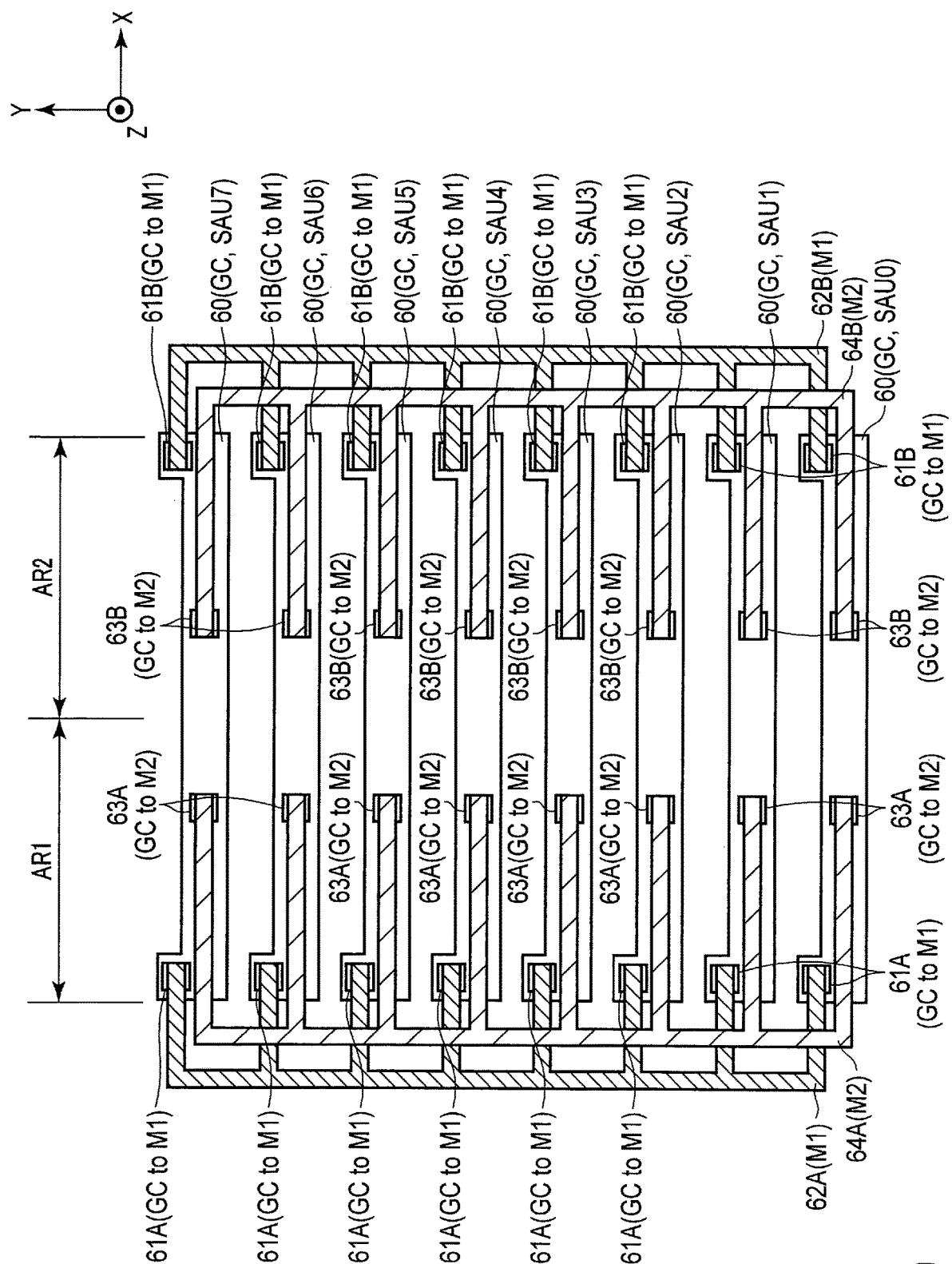
F I G. 10

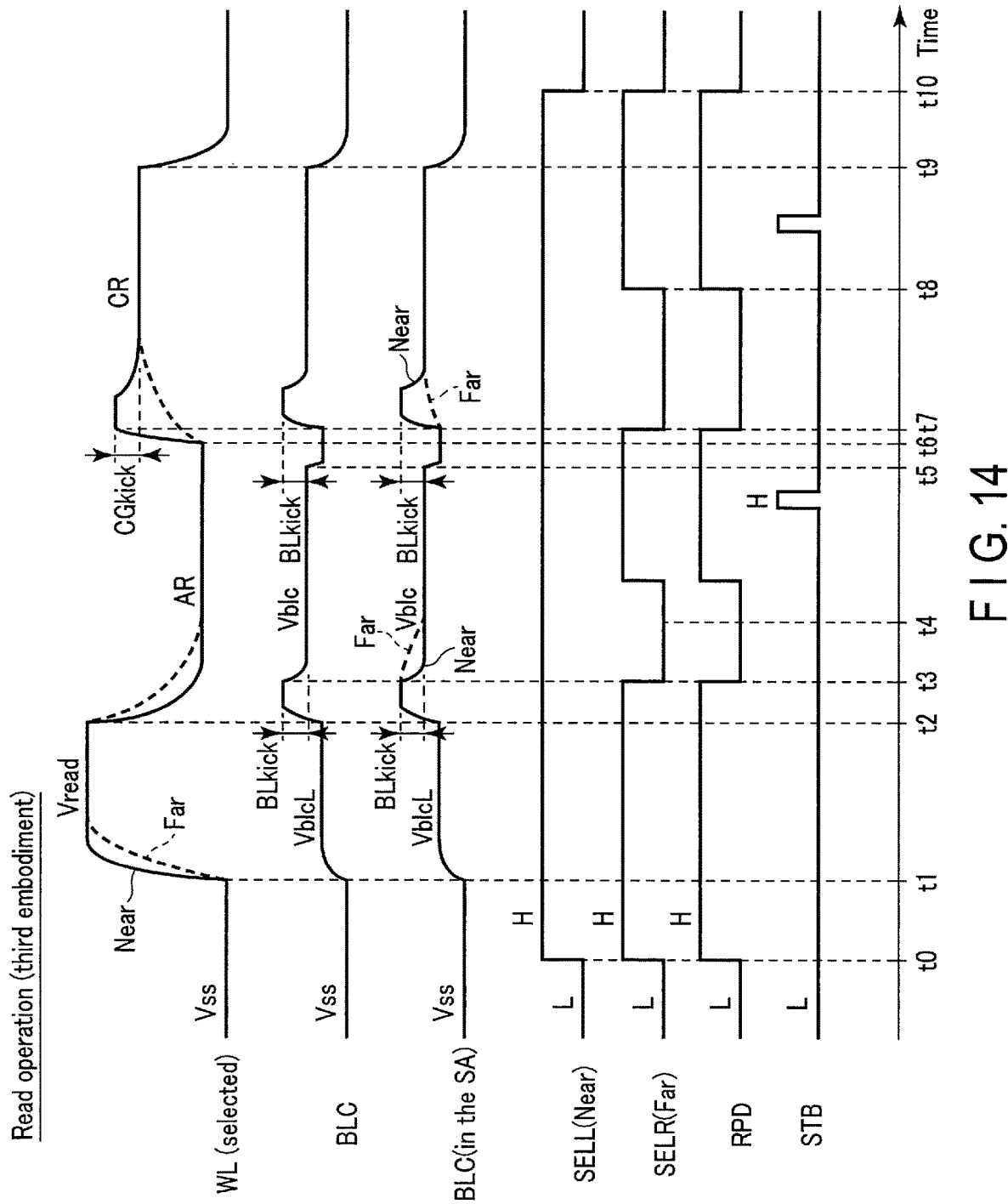
F I G. 14

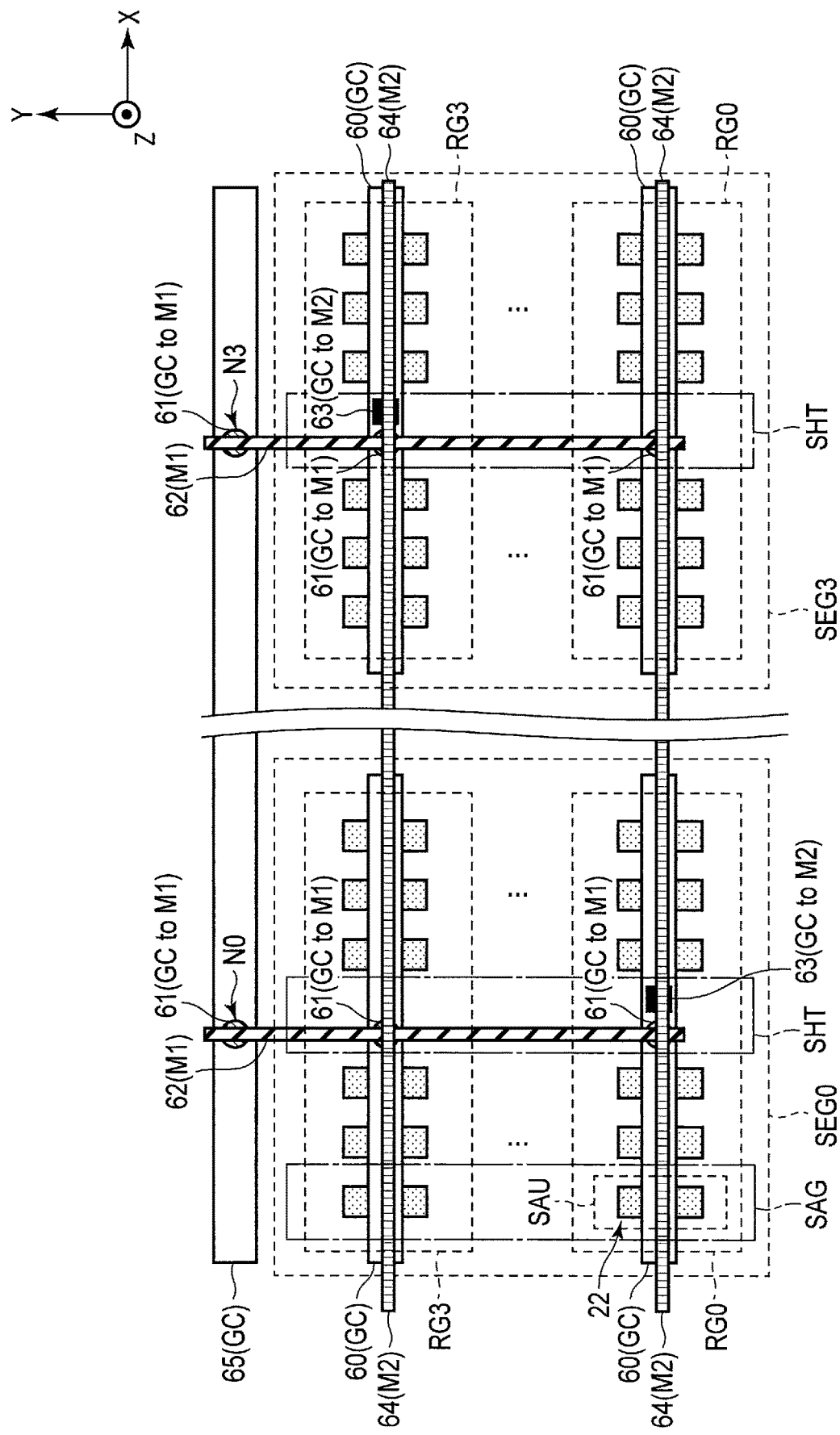
F I G. 16

| Selected block | Delay amount between "Near" and "Far" | Gate voltage | | |
|---|---|---|---|---|
| | | SELL | SELR | SELC |
| Even | Large | "H" | "L" | "L" |
| | Small | "H" | "L" | "H" |
| Odd | Large | "L" | "H" | "L" |
| | Small | "L" | "H" | "H" |

FIG. 18

| Selected block | Selected bit line | Gate voltage | | | |
|---|---|---|---|---|---|
| | | SELLa | SELLb | SELRa | SELRb |
| Even | Odd | "H" | "L" | "L" | "L" |
| | Even | "L" | "H" | "L" | "L" |
| Odd | Odd | "L" | "L" | "H" | "L" |
| | Even | "L" | "L" | "L" | "H" |

F I G. 20

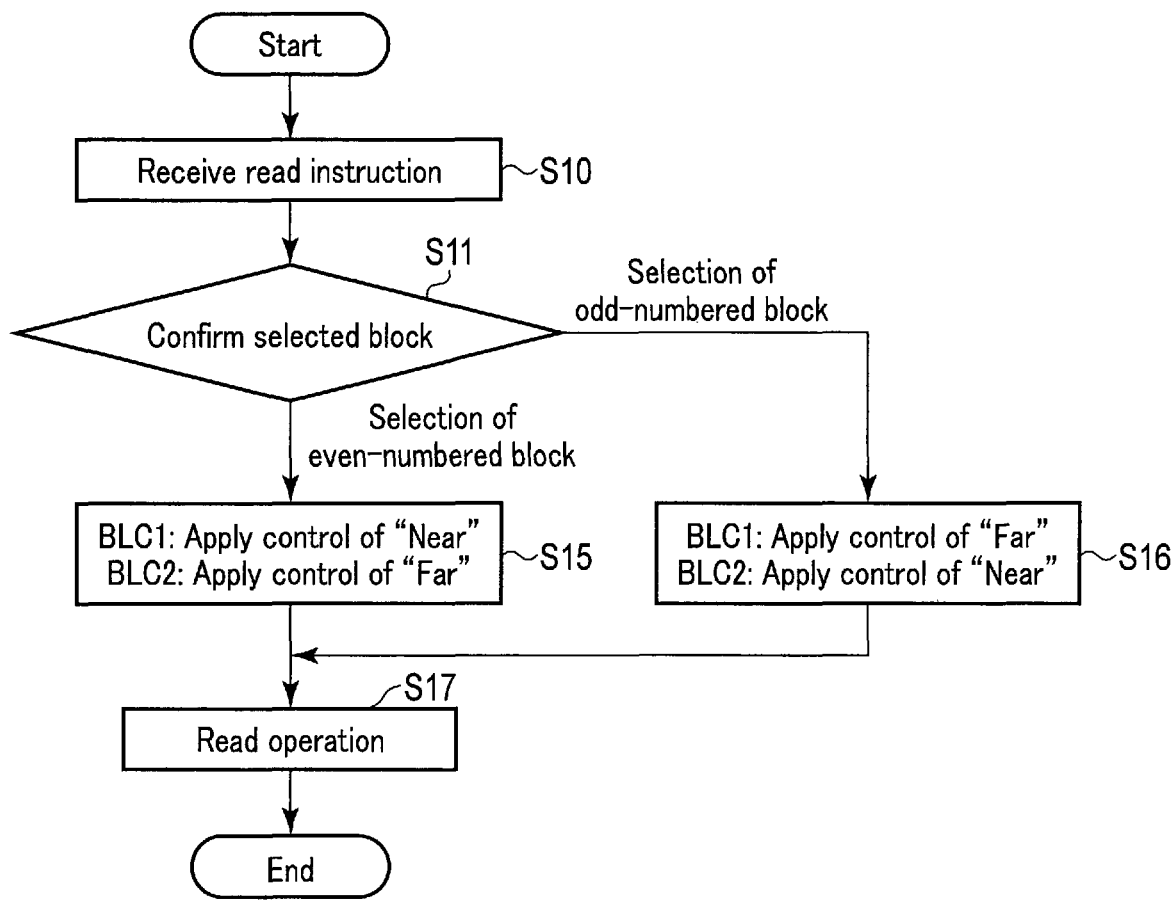
F I G. 22

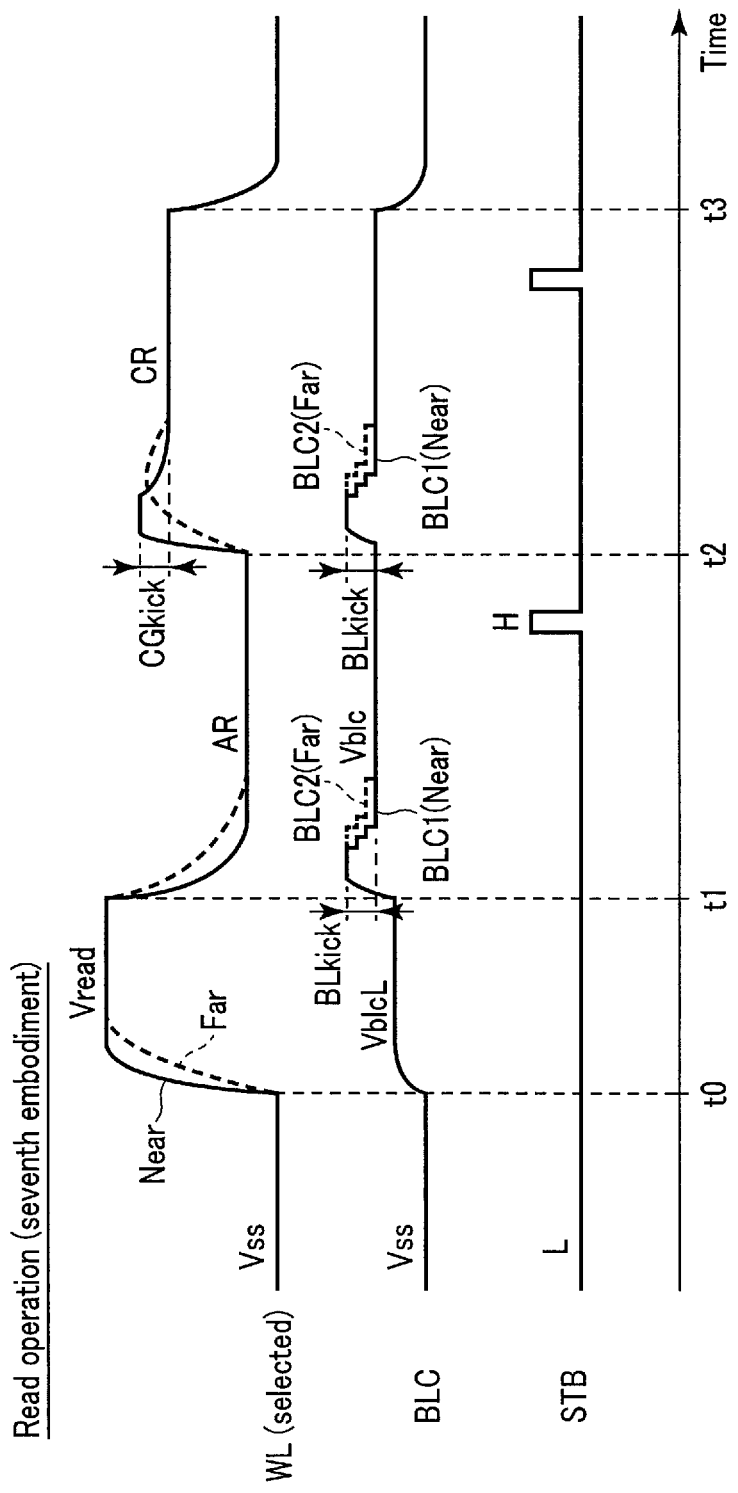
F I G. 23

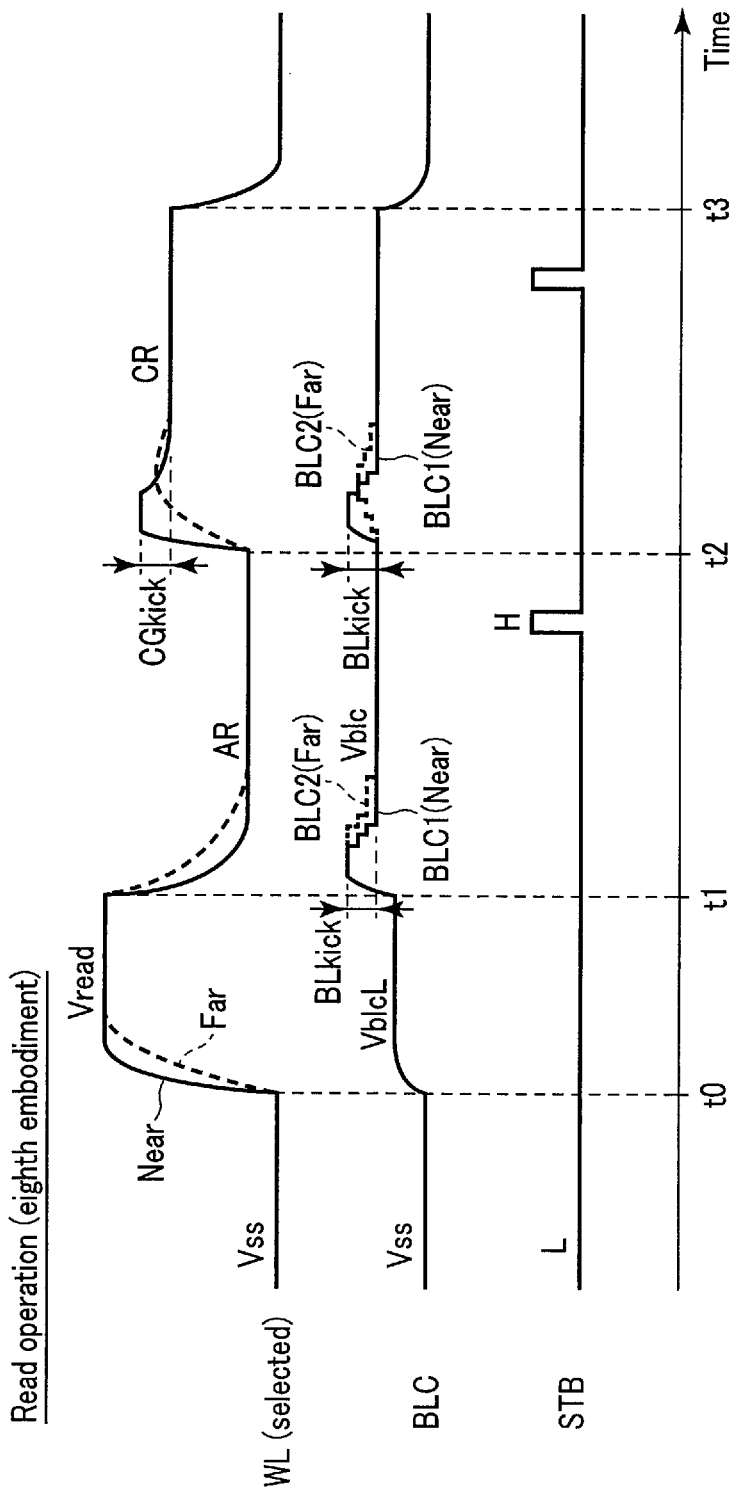
F I G. 24

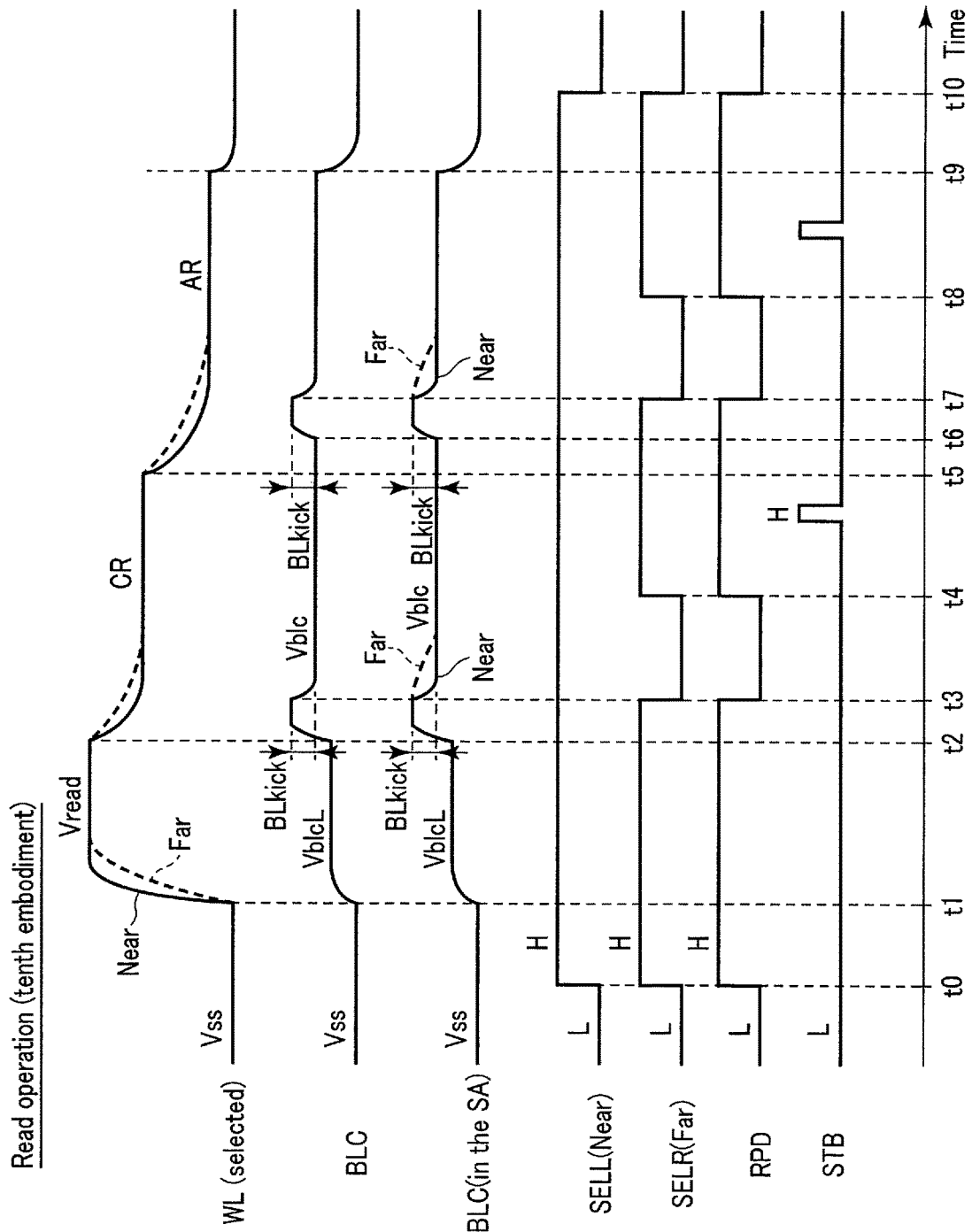
F I G. 26

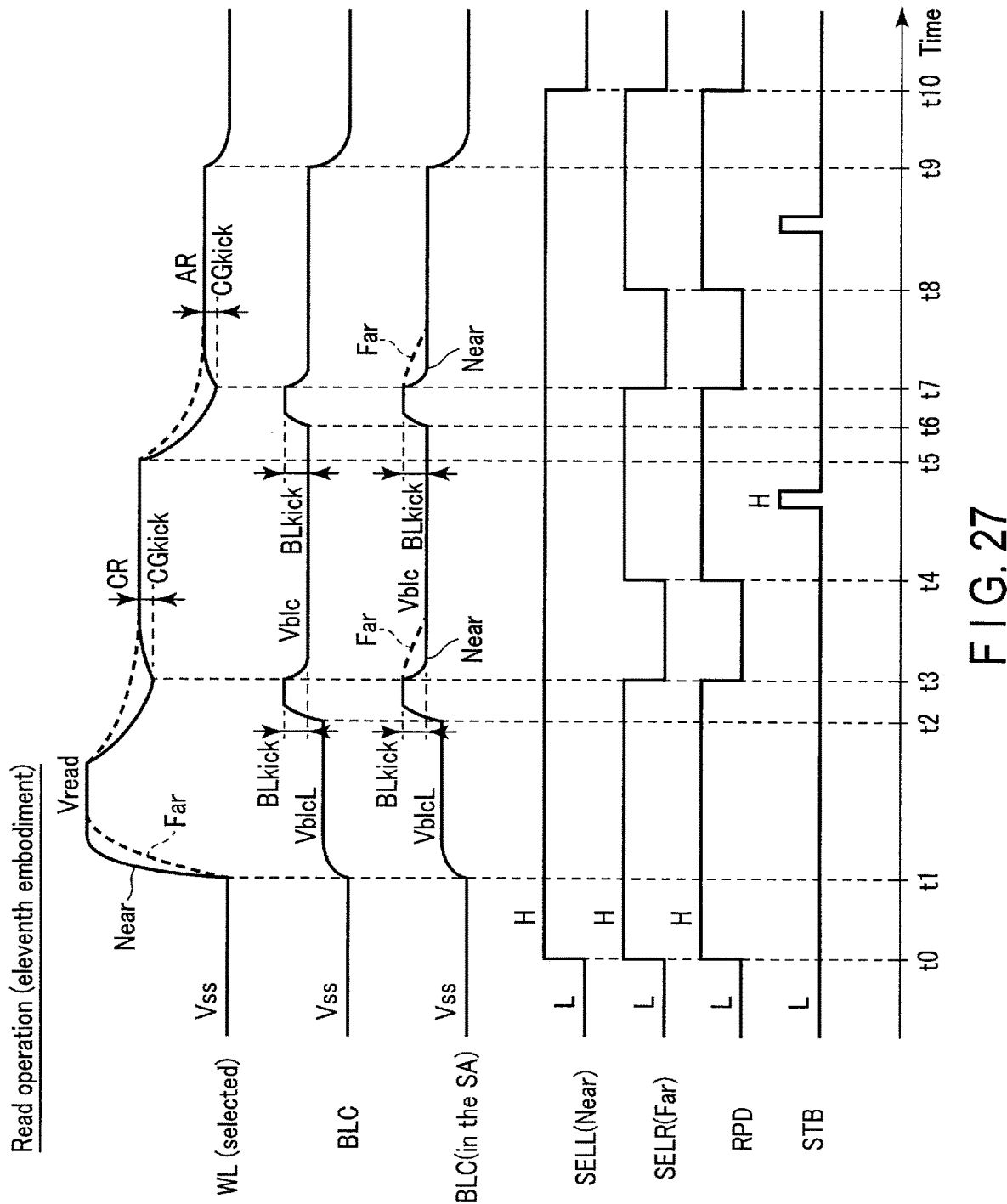
F I G. 27

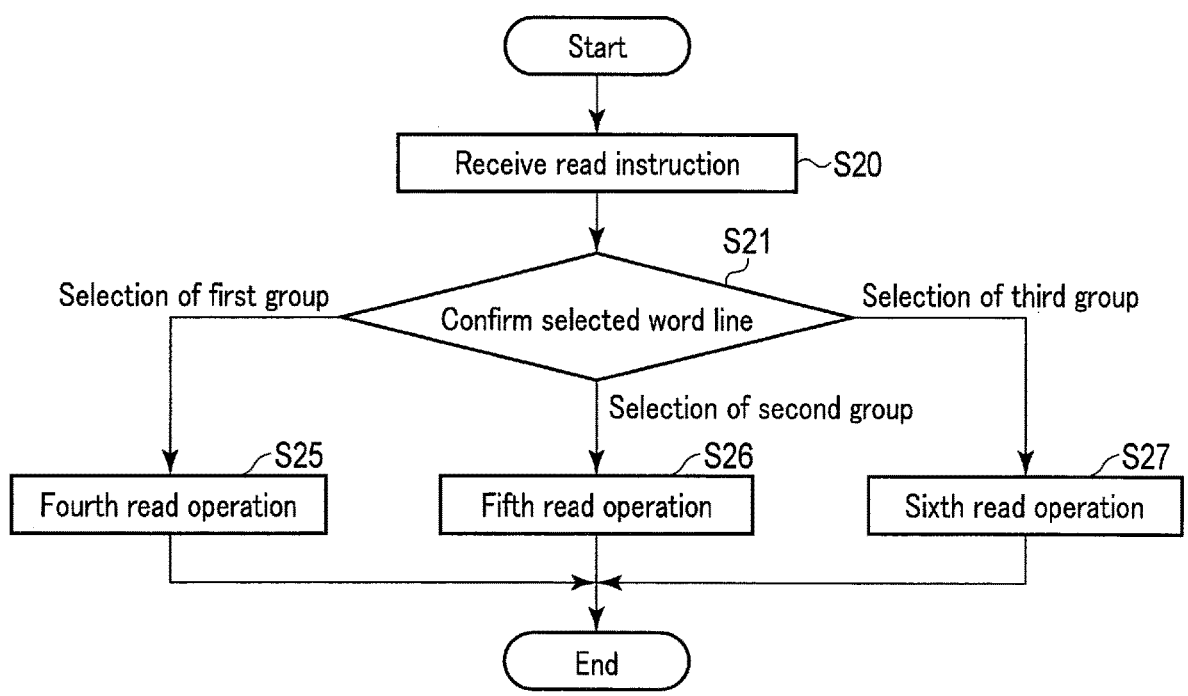
F I G. 32

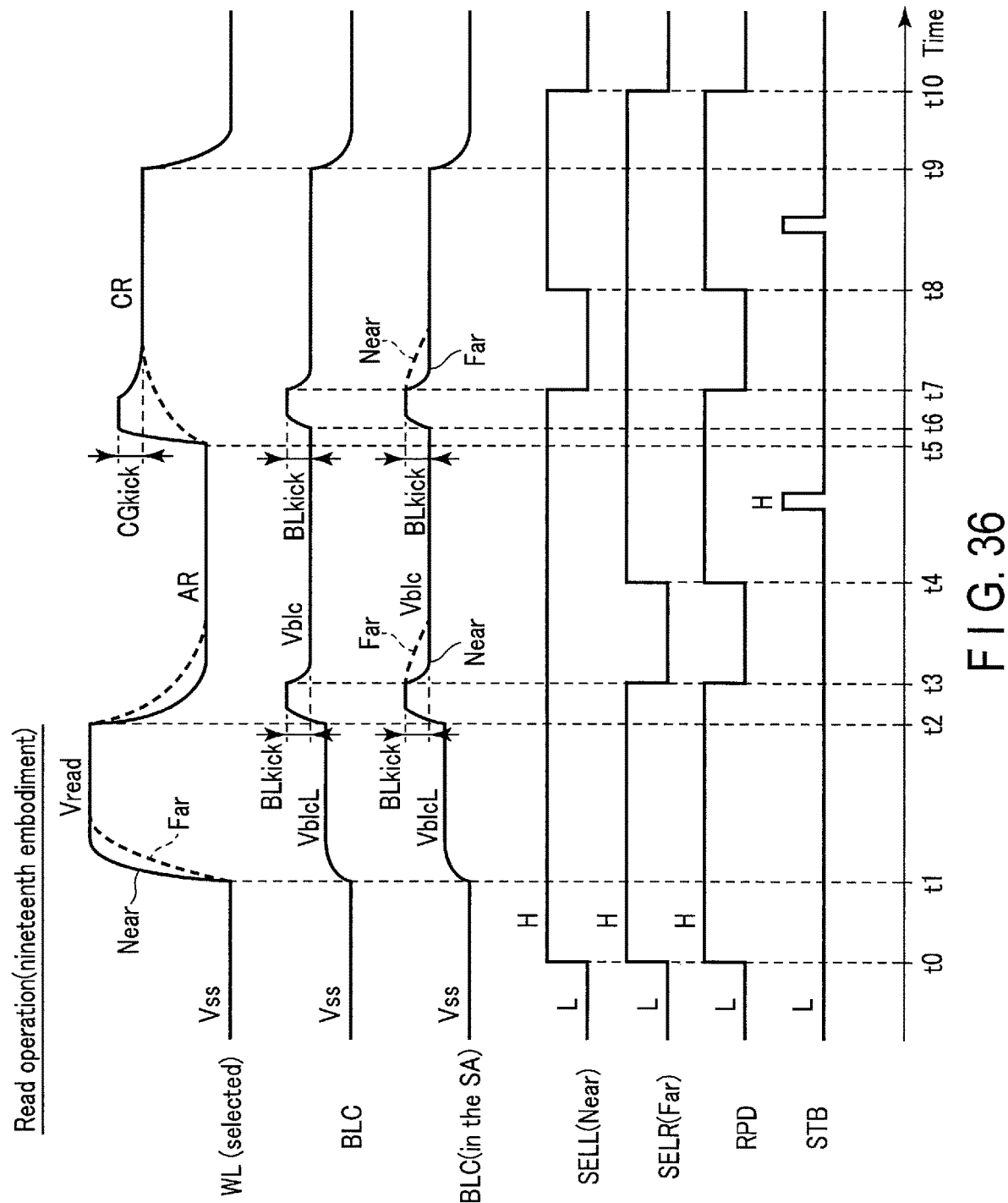
F I G. 36

SEMICONDUCTOR MEMORY DEVICE WITH FIRST AND SECOND SENSE AMPLIFIERS

CROSS-REFERENCE TO RELATED APPLICATIONS

This application is a continuation of and claims benefit under 35 U.S.C. § 120 to U.S. application Ser. No. 17/326,954, filed May 21, 2021, which is a continuation of and claims benefit under 35 U.S.C. § 120 to U.S. application Ser. No. 16/681,310, filed Nov. 12, 2019 (now U.S. Pat. No. 11,049,571), which is a continuation of and claims benefit under 35 U.S.C. § 120 to U.S. application Ser. No. 15/911,383, filed Mar. 5, 2018 (now U.S. Pat. No. 10,515,703), and is based upon and claims the benefit of priority under 35 U.S.C. § 119 from Japanese Patent Application No. 2017-176657, filed Sep. 14, 2017, the entire contents of each of which are incorporated herein by reference.

FIELD

Embodiments described herein relate generally to a semiconductor memory device.

BACKGROUND

There is known a NAND flash memory in which memory cells are stacked three-dimensionally.

BRIEF DESCRIPTION OF THE DRAWINGS

FIG. 3 illustrates an example of threshold distributions and data allocation of memory cell transistors included in the semiconductor memory device according to the first embodiment;

FIG. 4 is a block diagram illustrating a detailed configuration example of row decoder modules included in the semiconductor memory device according to the first embodiment;

FIG. 5 is a block diagram illustrating a detailed configuration example of a sense amplifier module and a voltage generator included in the semiconductor memory device according to the first embodiment;

FIG. 6 is a circuit diagram illustrating a configuration example of the sense amplifier module included in the semiconductor memory device according to the first embodiment;

FIG. 9 illustrates an example of a cross-section of the structure of the memory cell array and row decoder module included in the semiconductor memory device according to the first embodiment;

FIG. 10 illustrates a plan-view layout of the sense amplifier module included in the semiconductor memory device according to the first embodiment;

FIG. 14 illustrates an example of waveforms of signals in a read operation of a semiconductor memory device according to a third embodiment;

FIG. 16 illustrates an example of a plan-view layout of the sense amplifier module included in the semiconductor memory device according to the fourth embodiment;

FIG. 18 is a table illustrating an example of a read operation of the semiconductor memory device according to the fifth embodiment;

FIG. 20 is a table illustrating an example of a read operation of the semiconductor memory device according to the sixth embodiment;

FIG. 22 is a flowchart illustrating an example of the read operation of the semiconductor memory device according to the seventh embodiment;

FIG. 23 illustrates an example of waveforms of signals in a read operation of the semiconductor memory device according to the seventh embodiment;

FIG. 24 illustrates an example of waveforms of signals in a read operation of a semiconductor memory device according to an eighth embodiment;

FIG. 26 illustrates an example of waveforms of signals in a read operation of a semiconductor memory device according to a tenth embodiment;

FIG. 27 illustrates an example of waveforms of signals in a read operation of a semiconductor memory device according to an eleventh embodiment;

FIG. 32 is a flowchart illustrating an example of a read operation of a semiconductor memory device according to a fifteenth embodiment;

FIG. 36 illustrates an example of waveforms of signals in a read operation of a semiconductor memory device according to a nineteenth embodiment.

DETAILED DESCRIPTION

Figure 1:
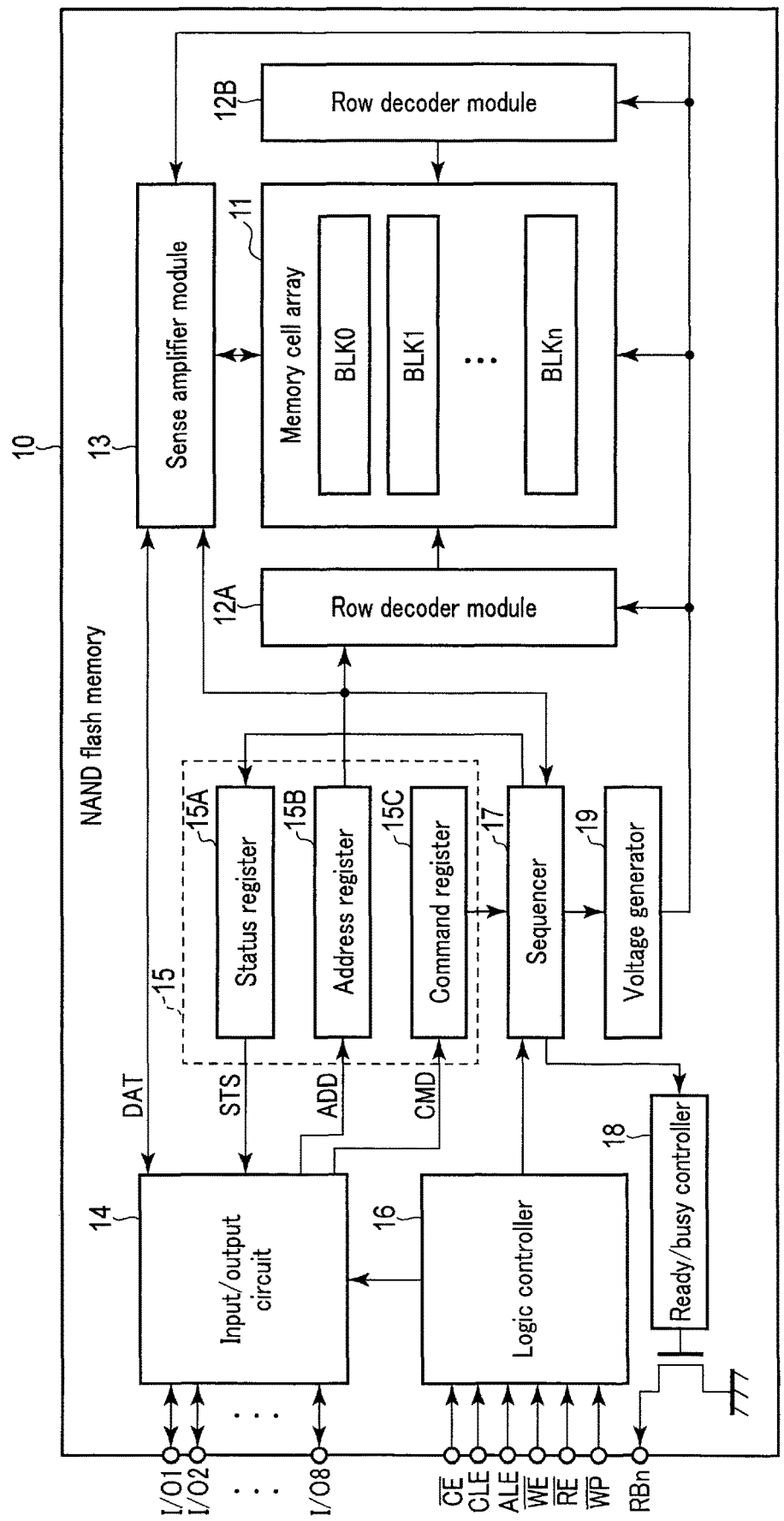
FIG. 1 is a block diagram illustrating an example of the entire configuration of a semiconductor memory device according to a first embodiment.

In general, according to one embodiment, a semiconductor memory device 10 according to one embodiment includes first to fifth conductors, a plurality of bit lines, a plurality of first sense amplifiers, first to third contacts. The first conductor is extending in a first direction. A plurality of first memory cells is connected to the first conductor. The bit lines are respectively connected to the first memory cells. The plurality of first sense amplifiers are respectively connected to a plurality of first bit lines included in the bit lines. Each of the first sense amplifiers include a first sense node, and a first transistor connected between the first sense node and a corresponding one of the first bit lines. The second conductor is provided in a first layer. The second conductor is extending in the first direction. The second conductor is functioning as gate electrodes of the first transistors included in the first sense amplifiers. First and second contacts each have a pillar shape and are provided on the second conductor. The first contact is in contact with one end portion of the second conductor in the first direction. The second contact is in contact with the other end portion of the second conductor in the first direction. The third contact have a pillar shape and provided on the second conductor. At least one of the first sense amplifiers are arranged in a region between the third contact and the first contact. At least one of the first sense amplifiers are arranged in a region between the third contact and the second contact. The third conductor is provided in a second layer which is different from the first layer. The third conductor is in contact with the first contact. The fourth conductor is provided in the second layer. The fourth conductor is in contact with the second contact. The fifth conductor is provided in a third layer which is different from either of the first layer and the second layer. The fifth conductor and the second conductor are electrically connected via the third contact.

Hereinafter, embodiments will be described with-reference to the drawings. The drawings are schematic. In the following description, the same reference signs denote constituent elements having substantially the same functions and configurations. Numeric characters after the letters constituting a reference sign, letters after the numeric characters constituting a reference sign, and "under bar+ letters" attached to the letters constituting a reference sign are referenced by reference signs containing the same letters, and are used to distinguish components having a similar configuration. When the components denoted by the reference signs containing the same letters do not need to be distinguished from each other, the components are referred to by the reference signs containing only the same letters or numeric characters.

[1] First Embodiment

A semiconductor memory device according to a first embodiment will be described hereinafter.

[1-1] Configuration

[1-1-1] Entire Configuration of Semiconductor Memory Device 10

FIG. 1 is a block diagram illustrating an example of the entire configuration of a semiconductor memory device 10 according to the first embodiment. As illustrated in FIG. 1, the semiconductor memory device 10 includes a memory cell array 11, row decoder modules 12A and 12B, a sense amplifier module 13, an input/output circuit 14, registers 15, a logic controller 16, a sequencer 17, a ready/busy controller 18, and a voltage generator 19.

The memory cell array 11 includes blocks BLK0 to BLKn (n is an integer of 1 or more). The block BLK is a set of a plurality of nonvolatile memory cells associated with bit lines and word lines. For example, the block BLK corresponds to a unit of data to be erased. In the semiconductor memory device 10, data of two bits or more can be stored in each memory cell, for example, by adopting an MLC (Multi-Level Cell) method.

Based on a block address stored in an address register 15B, the row decoder modules 12A and 12B can select a target block BLK for which various operations are executed. In addition, the row decoder modules 12A and 12B can forward a voltage supplied by the voltage generator 19, to the selected block BLK. The details of the row decoder modules 12A and 12B will be described later.

The sense amplifier module 13 can output data DAT read out of the memory cell array 11 to an external controller via the input/output circuit 14. In addition, the sense amplifier module 13 can forward write data DAT received from the external controller via the input/output circuit 14, to the memory cell array 11.

The input/output circuit 14 can send/receive an input/output signal I/O (I/O1 to I/O8) of, for example, an 8-bit width to/from the external controller. For example, the input/output circuit 14 forwards write data DAT included in the input/output signal I/O received from the external controller, to the sense amplifier module 13, and sends read data DAT forwarded from the sense amplifier module 13, to the external controller via the input/output signal I/O.

The registers 15 include a status register 15A, an address register 15B and a command register 15C. The status register 15A stores, for example, status information STS of the sequencer 17, and forwards this status information STS to the input/output circuit 14 in response to an instruction of the sequencer 17. The address register 15B stores address information ADD forwarded from the input/output circuit 14. A block address, a column address and a page address included in the address information ADD are used, for example, in the row decoder modules 12, the sense amplifier module 13 and the sequencer 17, respectively. The command register 15C stores a command CMD forwarded from the input/output circuit 14.

The logic controller 16 can control the input/output circuit 14 and sequencer 17 according to various control signals received from the external controller. A chip enable signal /CE, a command latch enable signal CLE, an address latch enable signal ALE, a write enable signal /WE, a read enable signal /RE, and a write protect signal /WP, for example, are used for the various control signals. The signal /CE is a signal for enabling the semiconductor memory device 10. The signal CLE is a signal which notifies the input/output circuit 14 that a signal input to the semiconductor memory device 10 represents a command CMD. The signal ALE is a signal which notifies the input/output circuit 14 that a signal input to the semiconductor memory device 10 represents address information ADD. The signals /WE and /RE are, for example, signals which instruct the input/output circuit 14 to input/output the input/output signals I/O, respectively. The signal /WP is, for example, a signal for setting the semiconductor memory device 10 in a protect state when power is turned on or off.

The sequencer 17 can control the operations of the entirety of the semiconductor memory device 10 according to the address information ADD stored in the address register 15B and the command CMD stored in the command register 15C. For example, the sequencer 17 executes various operations such as a write operation and a read operation by controlling, among others, the row decoder modules 12, the sense amplifier module 13 and the voltage generator 19.

The ready/busy controller 18 can generate a ready/busy signal RBn based on the operation state of the sequencer 17. The ready/busy signal RBn is a signal which notifies the external controller whether the semiconductor memory device 10 is in a ready state in which the semiconductor memory device 10 can accept an instruction from the external controller or in a busy state in which the semiconductor memory device 10 cannot accept an instruction.

The voltage generator 19 can generate desired voltages under the control of the sequencer 17, and can supply the generated voltages to the memory cell array 11, the row decoder modules 12, the sense amplifier module 13 and soon. For example, the voltage generator 19 applies desired voltages to a signal line corresponding to a selected word line and to signal lines corresponding to unselected word lines in accordance with a page address.

[1-1-2] Configuration of Memory Cell Array 11

Figure 2:
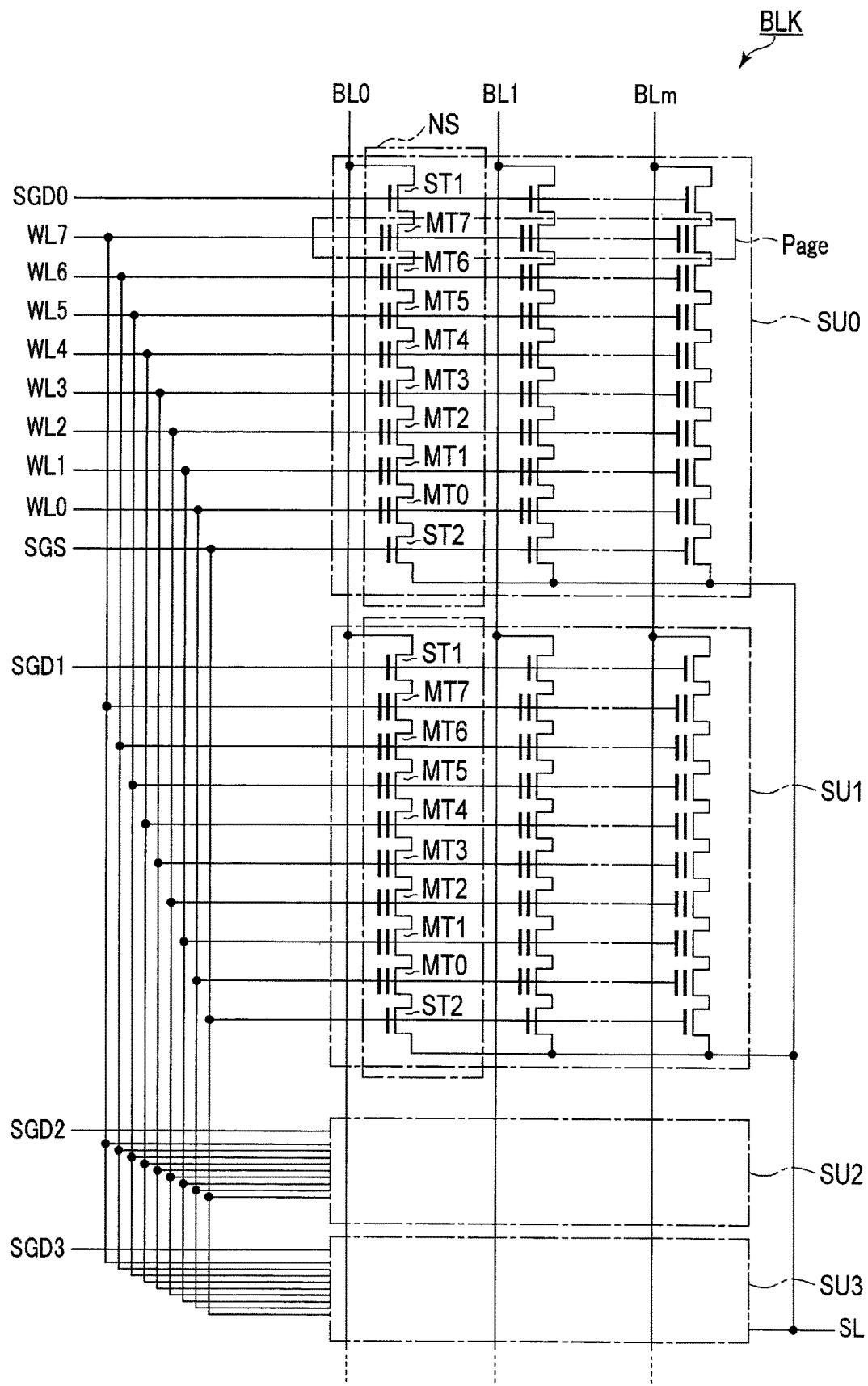
FIG. 2 is a circuit diagram illustrating a configuration example of a memory cell array included in the semiconductor memory device according to the first embodiment.

FIG. 2 is a circuit diagram illustrating a configuration example of the memory cell array 11 included in the semiconductor memory device 10 according to the first embodiment. FIG. 2 illustrates an example of a detailed circuit configuration in one block BLK in the memory cell array 11. As illustrated in FIG. 2, the block BLK includes, for example, four string units SU0 to SU3.

Each string unit SU includes a plurality of NAND strings NS which are associated with bit lines BL0 to BLm (m is an integer of 1 or more), respectively. Each NAND string NS includes, for example, memory cell transistors MT0 to MT7 and select transistors ST1 and ST2.

The memory cell transistor MT includes a control gate and a charge storage layer and can store data nonvolatilely. The memory cell transistors MT0 to MT7 included in each NAND string NS are connected in series between the source of the select transistor ST1 and the drain of the select transistor ST2. The control gates of the memory cell transistors MT0 to MT7 included in one block BLK are commonly connected to word lines WL0 to WL7, respectively. In the description below, a set of 1-bit data which are stored in plural memory cell transistors MT connected to a common word line WL in each string unit SU is referred to as a "page". Accordingly, when 2-bit data is stored in one memory cell transistor MT, a set of the plural memory cell transistors MT connected to the common word line WL in one string unit SU stores data of two pages.

The select transistors ST1 and ST2 are used to select a string unit SU in various operations. The drains of the select transistors ST1 included in the NAND strings NS corresponding to the same column address are commonly connected to a bit line BL corresponding thereto. The gates of the select transistors ST1 included in each of the string units SU0 to SU3 are commonly connected to one of select gate lines SGDO to SGD3. In one block BLK, the sources of the select transistors ST2 are commonly connected to a source line SL, and the gates of the select transistors ST2 are commonly connected to a select gate line SGS.

In the above-described circuit configuration of the memory cell array 11, the word lines WL0 to WL7 are provided for each block BLK. The bit lines BL0 to BLm are shared between plural blocks BLK. The source lines SL are shared between plural blocks BLK. It should be appreciated that the number of string units SU which each block BLK includes, and the number of memory cell transistors MT and select transistors ST1 and ST2 which each NAND string NS includes are set merely by way of example, and these numbers can discretionarily be chosen according to design. The number of word lines WL and select gate lines SGD and SGS are changed corresponding to the number of memory cell transistors MT and select transistors ST1 and ST2.

In addition, as regards the above-described circuit configuration of the memory cell array 11, FIG. 3 illustrates an example of threshold distributions formed with respect to threshold voltages for plural memory cell transistors MT connected to a common word line WL in one string unit SU. FIG. 3 illustrates an example of threshold distributions, read voltages and data allocation in a case where one memory cell transistor MT stores 2-bit data. The ordinate axis corresponds to the number of memory cell transistors MT, and the abscissa axis corresponds to threshold voltages Vth of memory cell transistors MT.

As illustrated in FIG. 3, the plural memory cell transistors MT form four threshold distributions corresponding to the 2-bit data which the memory cell transistors MT store. The four threshold distributions are referred to as "ER" level, "A" level, "B" level and "C" level in the order from the threshold distribution with the lowest threshold voltage. In the MLC method, for example, data of "10 (Lower bit, Upper bit)", "11", "01" and "00" are allocated to the "ER" level, "A" level, "B" level and "C" level, respectively.

In addition, in the above-described threshold distributions, read voltages are set between neighboring threshold distributions. For example, a read voltage AR is set between a highest threshold voltage in the "ER" level and a lowest threshold voltage in the "A" level, and is used in an operation of judging whether the threshold voltage of a memory cell transistor MT is included in the threshold distribution of the "ER" level or in the threshold distributions of the "A" and higher levels. The other read voltages BR and CR are set like the read voltage AR. The read voltage BR is set between the threshold distribution of the "A" level and the threshold distribution of the "B" level, and the read voltage CR is set between the threshold distribution of the "B" level and the threshold distribution of the "C" level. If the read voltage BR is applied to the memory cell transistors MT, memory cell transistors corresponding to the "ER" level and "A" level enter an ON state, and memory cell transistors corresponding to the "B" level and "C" level enter an OFF state. If the read voltage CR is applied to the memory cell transistors MT, memory cell transistors corresponding to the "ER" level, "A" level and "B" level enter the ON state, and memory cell transistors corresponding to the "C" level enter the OFF state. A read pass voltage Vread is set at a voltage which is higher than the highest threshold voltage in the highest threshold distribution. When the read pass voltage Vread is applied to the gate of a memory cell transistor MT, the memory cell transistor MT enters the ON state regardless of the data which the memory cell transistor MT stores.

It should be appreciated that the above-described bit number of data stored in one memory cell transistor MT and the data allocation to the threshold distributions of memory cell transistors MT are presented merely by way of example, and the bit number and the data allocation are not limited to these examples. For example, data of one bit or of three or more bits may be stored in one memory cell transistor MT, and other various data allocations may be applied to threshold distributions.

[1-1-3] Configuration of Row Decoder Modules 12

FIG. 4 is a block diagram illustrating a detailed configuration example of the row decoder modules 12A and 12B included in the semiconductor memory device 10 according to the first embodiment. FIG. 4 illustrates a relationship between each block BLK included in the memory cell array 11 and the row decoder modules 12A and 12B. As illustrated in FIG. 4, the row decoder module 12A includes a plurality of row decoders RDA, and the row decoder module 12B includes a plurality of row decoders ROB.

The row decoders RDA are provided in association with even-numbered blocks (e.g. BLK0, BLK2, . . . ), and the row decoders RDB are provided in association with odd-numbered blocks (e.g. BLK1, BLK3, . . . ). Specifically, for example, the respective blocks BLK0 and BLK2 are associated with different row decoders RDA, and the respective blocks BLK1 and BLK3 are associated with different row decoders RDB.

A voltage is supplied from the voltage generator 19 and applied to each block BLK via one of the row decoders RDA and RDB. The row decoders RDA apply the voltages to the word lines WL of the even-numbered blocks from one side in the direction of extension of the word lines WL, and the row decoders RDB apply the voltages to the word lines WL of the odd-numbered blocks from the other side in the direction of extension of the word lines WL. As illustrated in FIG. 4, areas AR1 and AR2 are defined in the above-described configuration.

The areas AR1 and AR2 are areas defined by dividing the memory cell array 11 in the direction of extension of the word lines WL (the direction of extension of the blocks BLK). The area AR1 corresponds to an area of one side of the direction of extension of the word lines WL, and the area AR2 corresponds to an area of the other side of the direction of extension of the word lines WL. The memory cell array 11 is connected to the row decoder module 12A in the area AR1, and is connected to the row decoder module 12B in the area AR2. In the description below, in each block BLK, an area near an area where the block BLK is connected to the associated row decoder RDA or RDB is referred to as "Near", and an area far from this area is referred to as "Far". Specifically, in the block BLK0, for instance, the area AR1 corresponds to the "Near" side, and the area AR2 corresponds to the "Far" side. Similarly, in the block BLK1, the area AR2 corresponds to the "Near" side, and the area AR1 corresponds to the "Far" side.

[1-1-4] Configuration of Sense Amplifier Module 13 and Voltage Generator 19

FIG. 5 is a block diagram illustrating a detailed configuration example of the sense amplifier module 13 and voltage generator 19 included in the semiconductor memory device 10 according to the first embodiment. As illustrated in FIG. 5, the sense amplifier module 13 includes a plurality of sense amplifier groups SAG and transistors TL, TR and TD. The voltage generator 19 includes a BLC driver DR.

A plurality of sense amplifier groups SAG are arranged, for example, in the direction of extension of word lines WL. Each sense amplifier group SAG includes, for example, eight sense amplifier units SAU0 to SAU7 which are arranged in the direction of extension of bit lines BL. One of the bit lines BL is connected to one of the sense amplifier units SAU0 to SAU7. The number of sense amplifier units SAU included in the entirety of the sense amplifier module 13 corresponds to, for example, the number of bit lines BL.

In addition, the plurality of sense amplifier groups SAG include those corresponding to the bit lines BL connected to the memory cells provided in the area AR1, and those corresponding to the bit lines BL connected to the memory cells provided in the area AR2. For example, in a read operation, if an even-numbered block is selected, the sense amplifier units SAU corresponding to the area AR1 are used for reading data of memory cells provided on the "Near" side of the selected block, and the sense amplifier units SAU corresponding to the area AR2 are used for reading data of memory cells provided on the "Far" side of the selected block. Similarly, if an odd-numbered block is selected, the sense amplifier units SAU corresponding to the area AR1 are used for reading data of memory cells provided on the "Far" side of the selected block, and the sense amplifier units SAU corresponding to the area AR2 are used for reading data of memory cells provided on the "Near" side of the selected block.

Control signals SELL, SELR and RPD are input to the gates of the transistors TL, TR and TD. The control signals SELL, SELR and RPD are control signals which are generated by, for example, the sequencer 17. One end of each of the transistors TL, TR and TD is commonly connected to anode for an output of the BLC driver DR. The BLC driver DR generates a control signal BLC, based on voltages which a charge pump (not shown) generates, and supplies the control signal BLC to each sense amplifier unit SAU via the transistors TL, TR and TD. The source electrodes of transistors to which the control signal BLC is input are arranged on the sense amplifier module 13 in parallel to the word lines WL. A concrete configuration of interconnects for supplying the control signal BLC to the sense amplifier module 13 will be described later.

In FIG. 5, interconnects for supplying the control signal BLC to the sense amplifier units SAU0 to SAU7 are shown as interconnects L0 to L7, respectively. The other end of the transistor TL is connected to one end of each of the interconnects L0 to L7. The other end of the transistor TR is connected to the other end of each of the interconnects L0 to L7. The other end of the transistor TD is connected between the one end and the other end of each of the interconnects L0 to L7. It should be appreciated that the other end of the transistor TD may be connected to a plurality of positions between the one end and the other end of each of the interconnects L0 to L7. Besides, the sense amplifier module 13 may include a plurality of transistors TD.

FIG. 6 illustrates an example of the circuit configuration of the sense amplifier unit SAU in the above-described first embodiment. As illustrated in FIG. 6, the sense amplifier unit SAU includes a sense amplifier section SA and latch circuits SDL, LDL, UDL and XDL, which are connected such that data can be transmitted and received therebetween.

The sense amplifier section SA for example, in a read operation, senses data which is read out to the corresponding bit line—BL, and determines whether the read data is "0" or "1". As illustrated in FIG. 6, the sense amplifier section SA includes a p-channel MOS transistor 20, n-channel MOS transistors 21 to 27 and a capacitor 28.

One end of the transistor 20 is connected to a power supply line, and the gate of the transistor 20 is connected to a node INV. One end of the transistor 21 is connected to the other end of the transistor 20, and the other end of the transistor 21 is connected to a node COM. A control signal BLX is input to the gate of the transistor 21. One end of the transistor 22 is connected to the node COM, and the other end of the transistor 22 is connected to the corresponding bit line BL. A control signal BLC is input to the gate of the transistor 22. One end of the transistor 23 is connected to the node COM, the other end of the transistor 23 is connected to a node SRC, and the gate of the transistor 23 is connected to a node INV. One end of the transistor 24 is connected to the other end of the transistor 20, and the other end of the transistor 24 is connected to a node SEN. A control signal HLL is input to the gate of the transistor 24. One end of the transistor 25 is connected to the node SEN, and the other end of the transistor 25 is connected to the node COM. A control signal XXL is input to the gate of the transistor 25. One end of the transistor 26 is grounded, and the gate of the transistor 26 is connected to the node SEN. One end of the transistor 27 is connected to the other end of the transistor 26, and the other end of the transistor 27 is connected to a bus LBUS. A control signal STB is input to the gate of the transistor 27. One end of the capacitor 28 is connected to the node SEN, and a clock CLK is input to the other end of the capacitor 28.

The above-described control signals BLX, HLL, XXL and STB are generated by, for example, the sequencer 17. In addition, a voltage Vdd, which may be, for example, a power supply voltage for the semiconductor memory device 10, is applied to the power supply line that is connected to the one end of the transistor 20. A voltage Vss, which may be, for example, a ground voltage for the semiconductor memory device 10, is applied to the node SRC.

The latch circuits SDL, LDL, UDL and XDL can temporarily hold read data. The latch circuit XDL is connected to the input/output circuit 14, and is used for input/output of data between the sense amplifier unit SAU and input/output circuit 14. As illustrated in FIG. 6, the latch circuit SDL includes inverters 30 and 31 and n-channel MOS transistors 32 and 33.

An input node of the inverter 30 is connected to a node LAT, and an output node of the inverter 30 is connected to a node INV. An input node of the inverter 31 is connected to the node INV, and an output node of the inverter 31 is connected to the node LAT. One end of the transistor 32 is connected to the node INV, and the other end of the transistor 32 is connected to the bus LBUS. A control signal ST1 is input to the gate of the transistor 32. One end of the transistor 33 is connected to the node LAT, and the other end of the transistor 33 is connected to the bus LBUS. A control signal STL is input to the gate of the transistor 33. The circuit configuration of each of the latch circuits LDL, UDL and XDL may be like, for example, the circuit configuration of the latch circuit SOL, so a detailed description thereof is omitted.

It should be appreciated that the configuration of the sense amplifier module 13 in the first embodiment is not limited to the above-described configuration. For example, the sense amplifier unit SAU may be designed to include any number of latch circuits. In this case, the number of latch circuits may be designed, for example, based on the number of bits of data which one memory cell transistor MT stores. In the above description, by way of example, the case is described in which the sense amplifier units SAU and bit lines BL are associated in a one-to-one correspondence. However, the configuration is not limited to this. For example, a plurality of bit lines BL may be connected to one sense amplifier unit SAU via a selector.

[1-1-5] Configuration of Semiconductor Memory Device 10

Hereinafter, a description is given of the configuration of the memory cell array 11, row decoder modules 12 and sense amplifier module 13 included in the semiconductor memory device 10 according to the first embodiment.

Figure 7:
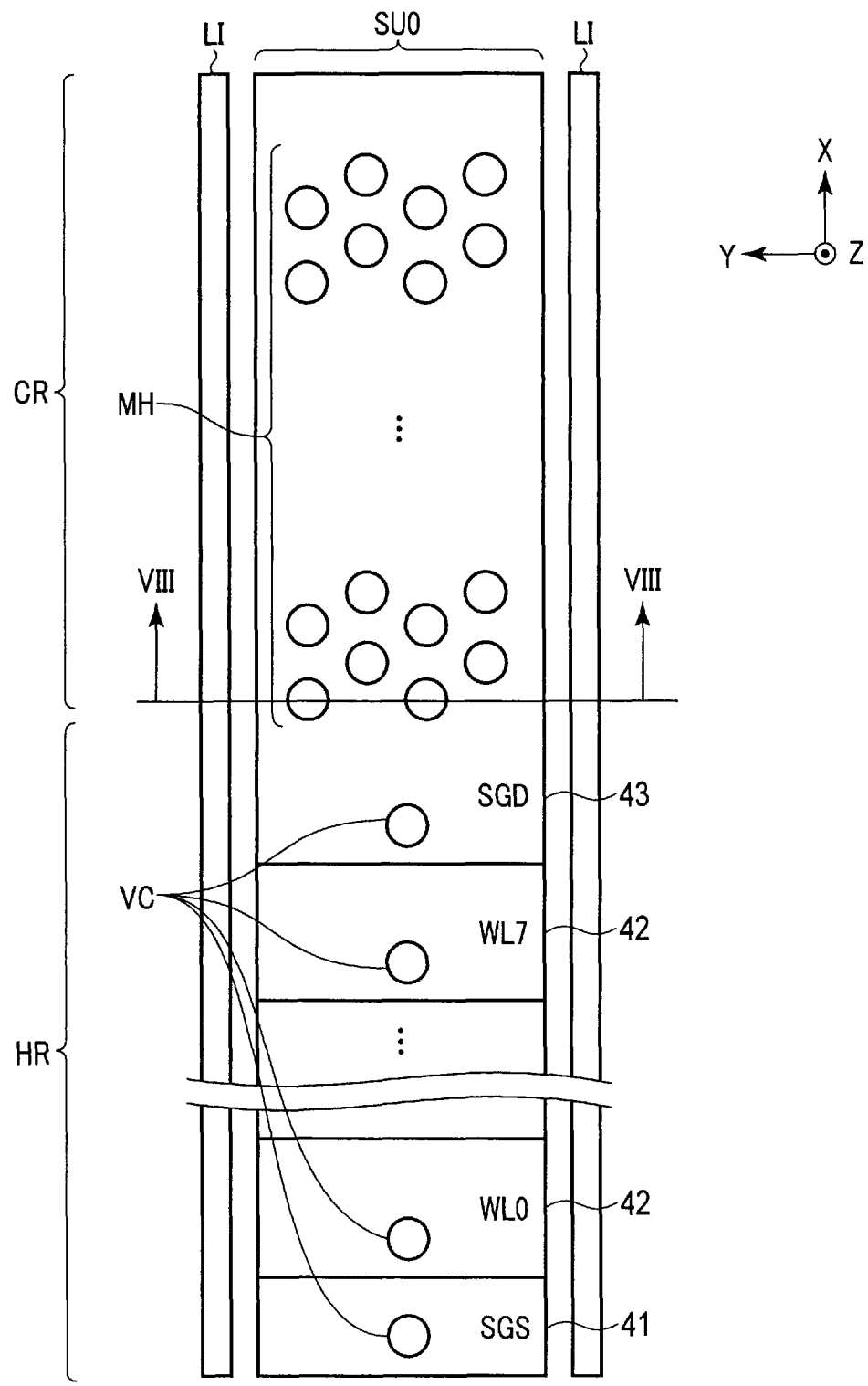
FIG. 7 illustrates an example of a plan-view layout of the memory cell array included in the semiconductor memory device according to the first embodiment.

FIG. 7 illustrates an example of a plan-view layout of the memory cell array 11 in the first embodiment, and illustrates an example of a plan-view layout of one string unit SU0 in the memory cell array 11. In the drawings to be described below, an X axis corresponds to the direction of extension of word lines WL, a Y axis corresponds to the direction of extension of bit lines BL, and a Z axis corresponds to a vertical direction to the substrate surface.

As illustrated in FIG. 7, the string unit SU0 is provided between contact plugs LI which extend in the X direction and neighbor with the string unit SU0 in the Y direction. The contact plugs LI are provided within slits which insulate the string unit SU0 and neighboring string units SU form each other. Specifically, in the memory cell array 11, a plurality of contact plugs LI are arranged in the Y direction in an area (not shown), and each string unit SU is provided between neighboring contact plugs LI.

In this configuration of the string unit SU0, areas CR and HR are defined in the X direction. The area CR is an area functioning substantially as a data storage area. A plurality of semiconductor pillars MH are provided in the area CR. One of the semiconductor pillars MH corresponds to, for example, one NAND string NS. The area HR is an area for connecting various interconnects provided in the string unit SU0 with the row decoder module 12A. Specifically, the string unit SU0 includes, for example, a conductor 41 functioning as the select gate line SGS, eight conductors functioning as the word lines WL0 to WL7, and a conductor 43 functioning as the select gate line SGD. Each of the conductors includes a portion which does not overlap conductors in upper-layers. In addition, end portions of the conductors 41 to 43 are connected through electrically conductive via contacts VC to the row decoder module 12A which is provided under the string unit SU.

Figure 8:
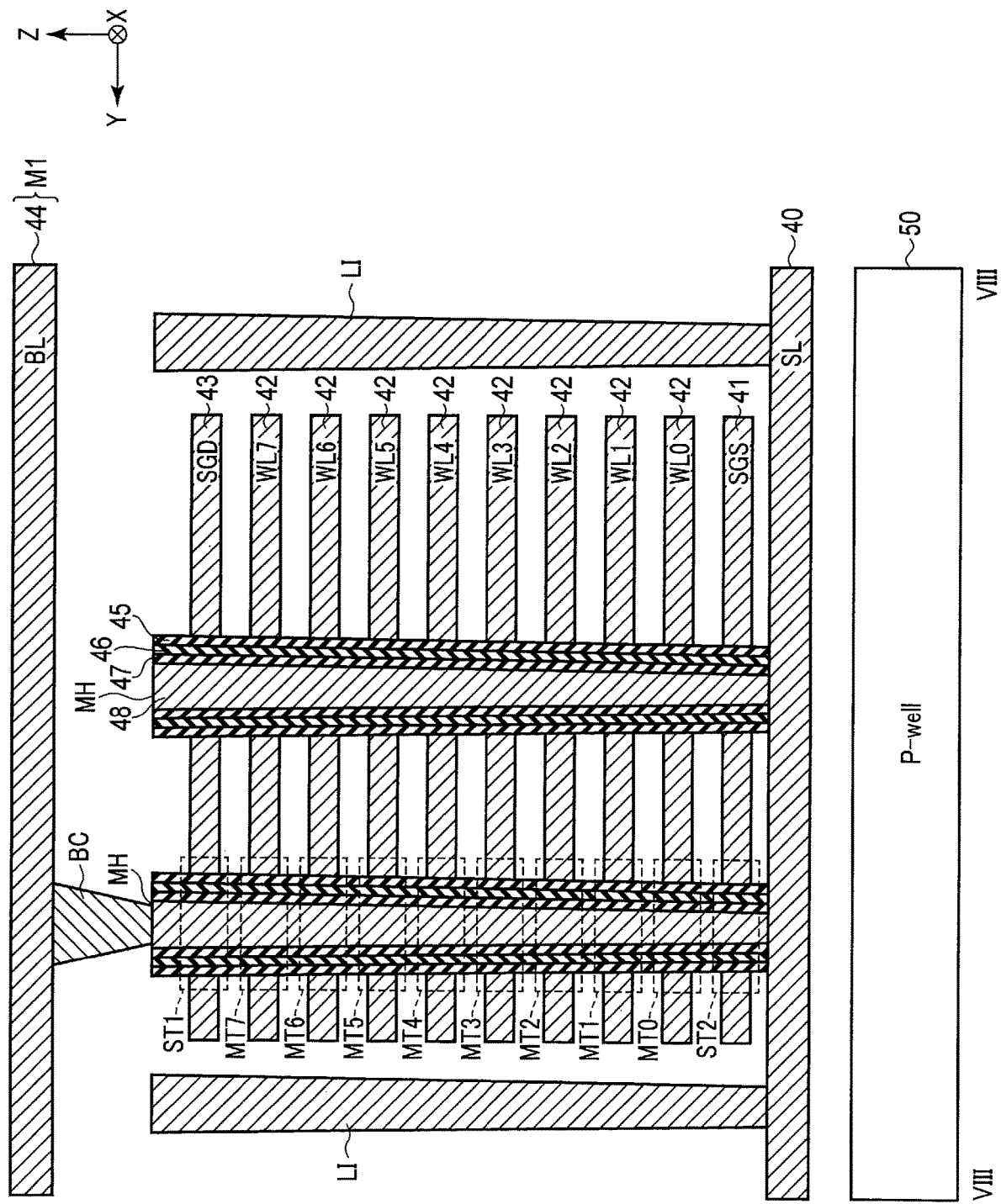
FIG. 8 is a cross-sectional view of the memory cell array, taken along line VIII-VIII in FIG. 7.

FIG. 8 and FIG. 9 illustrate a cross-sectional view of an example of a structure of the above-described memory cell array 11. FIG. 8 and FIG. 9 illustrate the cross-sectional view of an example of a structure for one string unit SU0 in the memory cell array 11. The cross-sectional view of FIG. 8 is taken along line VIII-VIII in FIG. 7. The cross-sectional view of FIG. 9 is taken along the X direction in FIG. 7, and illustrates an extracted structure associated with the word line WL0 (conductor 42) in the area HR. In the views, interlayer insulation films are omitted. In FIG. 9, the structure of the semiconductor pillars MH in the area CR is omitted.

As illustrated in FIG. 8, in the memory cell array 11, a conductor 40 functioning as the source line SL is provided above a P-well region 50 which is formed on a semiconductor substrate. A plurality of contact plugs LI are provided above the conductor 40. For example, the conductor 41, the eight conductors 42 and the conductor 43 are provided in turn in the Z direction above the conductor 40 and between the neighboring contact plugs LI.

The shape of each of the conductors 40 to 43 is a plate shape extending in the X direction and widening in the Y direction. The shape of the contact plug LI is a plate shape extending in the X direction and heightening in the Z direction. In addition, a plurality of semiconductor pillars MH are provided so as to pass through the conductors 41 to 43. Specifically, the semiconductor pillars MH are formed so as to extend from the upper surface of the conductor 43 and to reach the upper surface of the conductor 40.

The semiconductor pillar MH includes, for example, a block insulation film 45, an insulation film (charge storage layer) 46, a tunnel oxide film 47 and an electrically conductive semiconductor material 48. Specifically, the tunnel oxide film 47 is provided around the semiconductor material 48. The insulation film 46 is provided around the tunnel oxide film 47, and the block insulation film 45 is provided around the insulation film 46. It should be appreciated that different materials may be included in the semiconductor material 48.

In this configuration, an intersection portion where the conductor 41 intersects the semiconductor pillar MH functions as the select transistor ST2, an intersection portion where the conductor 42 intersects the semiconductor pillar MH functions as the memory cell transistor MT, and an intersection portion where the the conductor 43 intersects the semiconductor pillar MH functions as the select transistor ST1.

An electrically conductive via contact BC is provided on the semiconductor material 48 of the semiconductor pillar MH. A conductor 44 functioning as the bit line BL is provided on the via contact BC and extends in the Y direction. In each string unit SU, one semiconductor pillar MH is connected to one conductor 44. Specifically, in each string unit SU, for example, different semiconductor pillars MH are connected to plural conductors 44 disposed in the X direction.

As illustrated in FIG. 9, n+ impurity diffusion regions 51 and 52 are formed in a surface portion of the P-well region 50 in the area HR. A conductor 53 is provided via a gate insulation film (not shown) above the P-well region 50 between the diffusion regions 51 and 52. The diffusion regions 51 and 52 and the conductor 53 function as the source, drain and gate electrodes of a transistor Trd. The transistor Trd is included in the row decoder module 12A. A via contact VC is provided on the diffusion region 51. The via contact VC extends through the conductors 40 to 42 and is connected to a conductor 54. The via contact VC and the conductors 40 to 42 are insulated by an insulation film. The conductor 54 is provided, for example, in an interconnect layer between an interconnect layer in which the conductor 43 is provided and an interconnect layer in which the conductors 44 are provided. The conductor 54 is connected to the conductor 42 corresponding to the word line WL0 via an electrically conductive via contact HU. The distances between the via contact HU and the semiconductor pillars MH vary in accordance with regions in which the semiconductor pillars MH are provided. The "Near" side and "Far" side described with reference to FIG. 4 are defined in accordance with the distances between the via contact HU and the semiconductor pillars MH.

By this configuration, the row decoder module 12A can supply a voltage to the conductor 42 corresponding to the word line WL0 via the transistor TR. In the semiconductor memory device 10, a plurality of transistors TR and conductors 54 (not shown) are provided in association with the conductors 41 to 43. The row decoder module 12A supplies voltages to the conductors corresponding to the various conductive lines via the transistors TR. In the description below, an interconnect layer in which the conductor 53 corresponding to the gate electrode of the transistor TR is disposed is referred to as "interconnect layer GC", and an interconnect layer in which the conductors 44 corresponding to the bit lines BL are disposed is referred to as "interconnect layer M1".

A plan-view layout of the string unit SU corresponding to an odd-numbered block BLK becomes a layout which is obtained by inverting, for example, the plan-view layout of the string unit SU0 illustrated in FIG. 7 with respect to the Y axis as a symmetry axis. Specifically, the cell area CR is provided between the connection area HR corresponding to the even-numbered block BLK and the connection area HR corresponding to the odd-numbered block BLK. Since the structure of the other portions of the string unit SU corresponding to the odd-numbered block BLK is the same as the structure of the string unit SU corresponding to the even-numbered block BLK, a description thereof is omitted.

It should be appreciated that the configuration of the memory cell array 11 in the first embodiment is not limited to the above-described configuration. For example, in the above description, the select gate lines SGS and SGD are composed of single-layer conductors 41 and 43, respectively. However, the select gate lines SGS and SGD may be composed of multilayer conductors, respectively. In addition, the number of conductors 42 through which one semiconductor pillar MH extends is not limited to the above-described number. For example, by setting the number of conductors 42 through which one semiconductor pillar MH extends to nine or more, the number of memory cell transistors-MT included in one NANO string NS can be increased to nine or more.

Next, referring to FIG. 10, the interconnect layout of the sense amplifier module 13 will be described. FIG. 10 illustrates an example of the layout of interconnects and via contacts associated with the gate electrodes of the transistors 22 included in the sense amplifier module 13. As illustrated in FIG. 10, in the area of the sense amplifier module 13, there are provided a plurality of conductors 60, a plurality of via contacts 61A and 61B, conductors 62A and 62B, via contacts 63A and 63B, and conductors 64A and 64B.

The conductors 60 extend in the X direction, for example, in the interconnect layers GC, and function as the gate electrodes of the transistors 22 in the sense amplifier module 13. For example, eight conductors 60 arranged in the Y direction are provided in association with the sense amplifier units SAU0 to SAU7, respectively. Specifically, the eight conductors 60 illustrated in FIG. 10 correspond to the interconnects L0 to L7 illustrated in FIG. 5, respectively. The number of conductors 60 is not limited to the above-described number, and may be designed according to, for example, the number of sense amplifier units SAU.

The via contacts 61A and 61B are provided, for example, between the interconnect layer GC and the interconnect layer M1, and electrically connect the conductors provided in the interconnect layer GC and in the interconnect layer M1. The via contacts 61A are provided on the area AR1 side, and the via contacts 61B are provided on the area AR2 side. The conductors 62A and 62B are provided, for example, in a comb shape in the interconnect layer M1, and are connected to the other ends of the transistors TL and TR, respectively, in an area not illustrated. The conductor 62A is connected to one end portion of the conductor 60 in the X direction via the via contact 61A, and the conductor 62B is connected to the other end portion of the conductor 60 in the X direction via the via contact 61B.

The via contacts 63A and 63B are provided, for example, between the interconnect layer GC and an interconnect layer M2, and electrically connect the conductors provided in the interconnect layer GC and in the interconnect layer M2. The interconnect layer M2 corresponds to an interconnect layer above the interconnect layer M1. The conductors 64A and 64B are provided, for example, in a comb shape in the interconnect layer M2, and are connected to the other end of the transistor TD in an area not illustrated. For example, the conductor 64A is connected via the via contacts 63A to the conductors 60 in areas offset toward the one end side from a middle portion of the conductors 60, and the conductor 64B is connected via the via contacts 63B to the conductors 60 in areas offset toward the other end side from the middle portion of the conductor 60. In this case, the via contacts 63A are provided in the area AR1, and the via contacts 63B are provided in the area AR2.

In the above-described configuration, the control signal BLC generated by the BLC driver DR is supplied from the one end portions of the conductors 60 via the conductor 62A and via contacts 61A, is supplied from the other end portions of the conductors 60 via the conductor 62B and via contacts 61B, and is supplied from the middle portions of the conductors 60 via the conductors 64A and 64B and via contacts 63A and 63B. Specifically, the control signal BLC is supplied to the conductors 60 through at least one of the via contacts 61A, 61B, 63A and 63B.

In addition, in the above-described configuration, for example, the resistance value of the interconnect (conductor) provided in the interconnect layer GC is higher than the resistance value of the interconnect provided in the interconnect layer M1, and the resistance value of the interconnect provided in the interconnect layer M1 is higher than the resistance value of the interconnect provided in the interconnect layer M2. In the present specification, the term "resistance value" means sheet resistance of the interconnect. For example, tungsten silicide WSi is used for the material of the interconnect provided in the interconnect layer GC. For example, tungsten W is used for the material of the interconnect provided in an interconnect layer M0 between the interconnect layer GC and interconnect layer M1. For example, copper Cu is used for the material of the interconnect provided in the interconnect layer M1. For example, aluminum Al is used for the material of the interconnect provided in the interconnect layer M2.

Moreover, in the above-described configuration, for example, at least one of the sense amplifiers being arranged in a region between the via contact 61A and 63A. At least one of the sense amplifiers being arranged in a region between the via contact 61B and 63B. At least one of the sense amplifiers being arranged in a region between the via contact 63A and 63B.

In the above description, the examples of the via contacts connecting the conductors provided in the interconnect layers GC and M1 and of the via contacts connecting the conductors provided in the interconnect layers GC and M2 are described in which a single via contact is used for each connection. However, the configuration is not limited to this example. For example, each of those connections of the interconnect layers may be made by a plurality of via contacts, or via conductors provided in different interconnect layers.

In addition, in the above description, the case is described in which the conductor 60 and the conductor 64A are connected by use of the via contact 63A, and the conductor 60 and the conductor 64B are connected by use of the via contact 63B. However, the configuration is not limited to the case. For example, one of the conductors 64A and 64B may be used for the connections, and the number of conductors 64 provided for the connections is not limited to two.

In the present embodiment, for each sense amplifier unit SAU, it should suffice if the conductor 64 is connected to the conductor 60 via the via contact 63 disposed between the via contacts 61A and 61B. The meaning of the expression "disposed between the via contacts 61A and 61B" may include a disposition with an offset in the Y direction. It should suffice if the corresponding via contact 63 is provided on the same conductor 60 as the via contacts 61A and 61B are disposed.

[1-2] Operation

The semiconductor memory device 10 according to the first embodiment executes a kick operation in the read operation. The kick operation is a voltage application method in which the driving voltage of the driver is once set at a value higher than a target voltage value, and then the driving voltage is lowered to the target voltage value after the passage of a predetermined time. The kick operation is executed, for example, for the word line WL and the control signal BLC. For example, when the kick operation is executed for the control signal BLC, the amount of current supplied to the bit line BL increases, and the bit line BL is charged. In the description below, a voltage which is higher than a target voltage and is applied at the time of the kick operation before applying the target voltage is referred to as "kick voltage". A difference between the target voltage and the kick voltage is referred to as "kick amount".

In addition, in the first embodiment, when the kick operation is executed for the control signal BLC, the control method of the control signals SELL and SELR changes depending on whether an even-numbered block is selected or an odd-numbered block is selected. In other words, the sequencer 17 changes the control method of the control signals SELL and SELR depending on the correspondence of "Near" and "Far" with the areas AR1 and AR2. For example, when the areas AR1 and AR2 correspond to "Near" and "Far", respectively, the sequencer 17 applies the "Near" and "Far" controls to the control signals SELL and SELR, respectively. When the areas AR1 and AR2 correspond to "Far" and "Near", respectively, the sequencer 17 applies the "Far" and "Near" controls to the control signals SELL and SELR, respectively.

Figure 11:
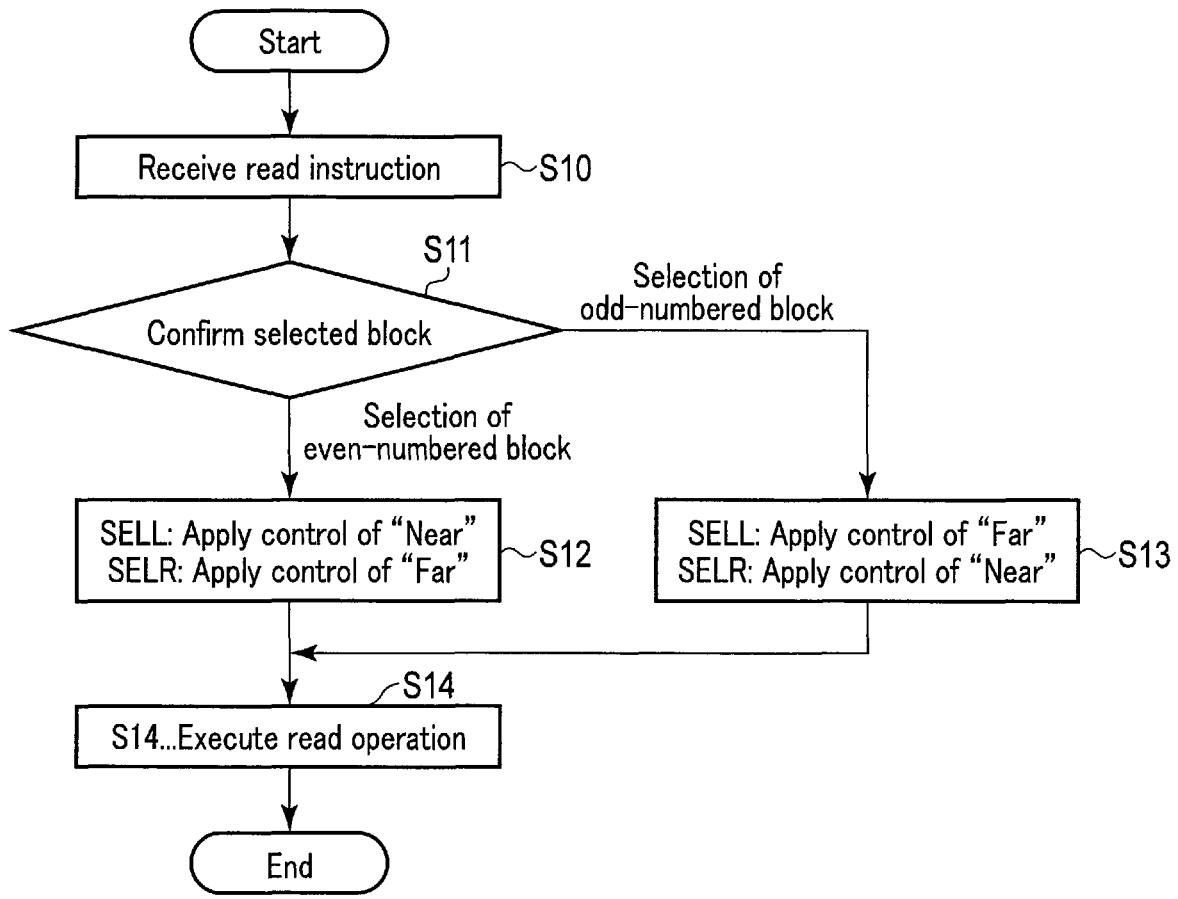
FIG. 11 is a flowchart illustrating an example of a read operation of the semiconductor memory device according to the first embodiment.

FIG. 11 is an example of a flowchart of the read operation of the semiconductor memory device 10 according to the first embodiment. As illustrated in FIG. 11, to start with, the semiconductor memory device 10 receives a read instruction from the external controller (step S10). Specifically, the semiconductor memory device 10 stores commands and address information received from the controller in the command register 15C and address register 15B, respectively. Next, based on the stored address information ADD, the sequencer 17 checks the address of a selected block BLK, and confirms whether the selected block BLK is an even-numbered block or an odd-numbered block (step S11). Then, when the even-numbered block is selected, the sequencer 17 applies the "Near" and "Far" controls to the control signals SELL and SELR, respectively (step S12), and executes the read operation (step S14). On the other hand, when the odd-numbered block is selected, the sequencer 17 applies the "Far" and "Near" controls to the control signals SELL and SELR, respectively (step S13), and executes the read operation (step S14).

Figure 12:
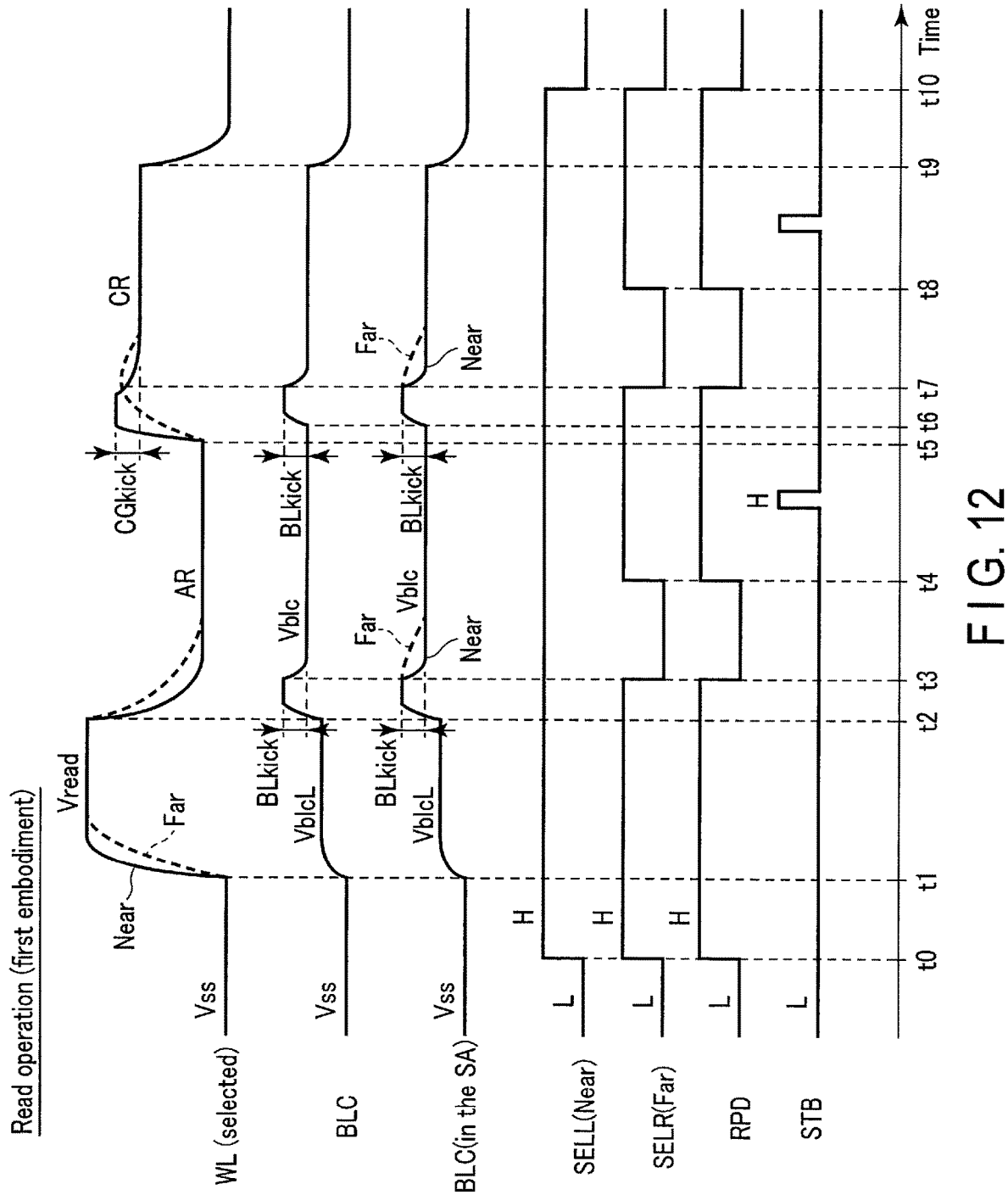
FIG. 12 illustrates an example of waveforms of signals in the read operation of the semiconductor memory device according to the first embodiment.

Hereinafter, the details of the read operation in a case in which the even-numbered block is selected will be described. FIG. 12 illustrates an example of waveforms in the read operation of the semiconductor memory device 10 according to the first embodiment. FIG. 12 illustrates an example of a waveform of the selected word line WL and waveforms of control signals BLC, SELL, SELR, RPO and STB in the even-numbered block BLK in the case in which the even-numbered block BLK is selected. In this case, the "Near" control is applied to the control signal SELL, and the "Far" control is applied to the control signal SELR.

In addition, FIG. 12 illustrates a waveform of the control signal BLC at the output node of the BLC driver DR, and a waveform of the control signal BLC in the inside of the sense amplifier section SA. FIG. 12 shows, by a solid line and a broken line, waveforms at positions corresponding to the "Near" side and the "Far" side, respectively, in the waveform of the word line WL and the waveform of the control signal BLC in the inside of the sense amplifier section SA. It is assumed that each of the n-channel MOS transistors to which various control signals are input is turned on if an "H" level voltage is applied to the gate of that n-channel MOS transistor, and is turned off if an "L" level voltage is applied to the gate. Hereinafter, the memory cell transistor MT which is a target of data read is referred to as "selected memory cell."

As illustrated in FIG. 12, in the initial state prior to time t0, for example, the row decoder module 12A applies a voltage Vss to the word lines WL, the BLC driver DR outputs the control signal BLC at a voltage Vss, and the sequencer 17 sets voltages of control signals SELL, SELR, RPO and STB at an "L" level.

When the read operation is started at time t0, the sequencer 17 sets the control signals SELL, SELR and RPO at an "H" level. Then, the transistors TR, TL and TD are turned on, and current paths between the BLC driver DR and the sense amplifier module 13 are established.

At time t1, the row decoder module 12A applies, for example, a read pass voltage Vread to the word line WL, and the BLC driver DR outputs the control signal BLC at a voltage VblcL. At this time, since the BLC driver DR supplies a voltage to the sense amplifier section SA via the transistors TR, TL and TD, the waveform of the control signal BLC in the inside of the sense amplifier section SA corresponds to, for example, the waveform at the output node of the BLC driver DR. In the description below, it is assumed that the waveform of the control signal BLC in the inside of the sense amplifier section SA in the case in which the transistors TR, TL and TD are in the ON state is the same as the waveform of the control signal BLC at the output node of the BLC driver DR. The memory cell transistor MT to which the voltage Vread is applied and the transistor 22 to which the voltage VblcL is applied enter the ON state, and the bit line BL is charged.

At time t2, the row decoder module 12A lowers the voltage of the selected word line WL to a read voltage AR.

As illustrated in FIG. 12, the voltage of the word line WL on the "Near" side rises and falls earlier than the voltage of the word line WL on the "Far" side. In addition, at time t2, the sequencer 17 executes the kick operation for the control signal BLC, and the BLC driver DR outputs a control signal BLC at, for example, a kick voltage Vblc+BLkick. The kick amount BLkick for the control signal BLC can be set at a discretionary value.

At time t3, the sequencer 17 sets the control signals SELR and RPD at the "L" level. Then, the transistors TR and TD enter the OFF state, and the current paths between the BLC driver DR and the sense amplifier module 13 decrease. Specifically, the control signal BLC is supplied via the transistor TL to the sense amplifier units SA on the one end side of each of the interconnects L0 to L7. Then, the BLC driver DR lowers the control signal BLC to a voltage Vblc. At this time, the voltage of the control signal BLC in the inside of the sense amplifier section SA becomes the same as the output voltage of the BLC driver DR on the "Near" side, and descends to the voltage Vblc on the "Far" side with a delay from the descent on the "Near" side.

For example, the sequencer 17 executes control to have the timing at which the voltage of the word line WL on the "Near" side falls to the voltage AR coincide with the timing at which the control signal BLC on the "Near" side in the sense amplifier section SA falls to the voltage Vblc. The sequencer 17 also executes control to have the timing at which the voltage of the word line WL on the "Far" side falls to the voltage AR coincide with the timing at which the control signal BLC on the "Far" side in the sense amplifier section SA falls to the voltage Vblc.

At time t4, the sequencer 17 sets the control signals SELR and RPD at the "H" level, and sets the transistors TR and TD in the ON state. Thereafter, if the sequencer 17 sets the control signal STB at the "H" level, the sense amplifier unit SAU determines whether the threshold voltage of the corresponding selected memory cell is the voltage AR or more, and stores the determination in the latch circuit in the sense amplifier unit SAU.

At time t5, the row decoder module 12A executes the kick operation for the word line WL, and temporarily applies a kick voltage CR+CGkick to the selected word line WL. The kick amount CGkick for the word line WL can be set at a discretionary value. As illustrated in FIG. 12, the voltage of the word line WL on the Far" side rises with a delay from the rise of the voltage of the word line WL on the "Near" side.

At time t6, the sequencer 17 executes the kick operation for the control signal BLC, and the BLC driver DR outputs the control signal BLC at, for example, a kick voltage Vblc+BLkick. Specifically, the sequencer 17 temporarily raises the voltage of the control signal BLC by the voltage BLkick while the kick voltage is being applied to the selected word line WL. Then, the row decoder module 12A lowers the voltage of the word line WL from the kick voltage to the read voltage CR.

At time t7, the sequencer 17 lowers the control signals SELR and RPD to the "L" level. Then, the transistors TR and TD enter the OFF state, and the current paths between the BLC driver DR and the sense amplifier module 13 decrease. Specifically, the control signal BLC is supplied via the transistor TL to the sense amplifier units SA on the one end side of each of the interconnects L0 to L7. Then, the BLC driver DR lowers the control signal BLC to the voltage Vblc. At this time, the voltage of the control signal BLC in the inside of the sense amplifier section SA coincides with the output voltage of the BLC driver DR on the "Near" side, and descends to the voltage Vblc on the "Far" side with a delay from the descent on the "Near" side. Incidentally, the operation at time t5 is executed, for example, relying on the timing when the voltage of the word line WL on the "Far" side reaches the peak with the kick voltage.

At time t8, the sequencer 17 raises the control signals SELR and RPO to the "H" level, and sets the transistors TR and TD in the ON state. Thereafter, if the sequencer 17 sets the control signal STB at the "H" level, the sense amplifier unit SAU determines whether the threshold voltage of the corresponding selected memory cell is the voltage CR or more, and stores the determination in the latch circuit in the sense amplifier unit SAU.

At time t9, the row decoder module 12A and the BLC driver DR reset the voltages of the word line WL and the control signal BLC to' the initial states.

At time t10, the sequencer 17 resets the control signals SELL, SELR and RPO to the initial states, and finishes the read operation of the present page.

In the above-described read operation, an operation in a case in which an odd-numbered block is selected corresponds to an operation in a case in which the row decoder module 12B executes the operation of the row decoder module 12A and in which the operation of the control signal SELR and the operation of the control signal SELL are interchanged. Thus, a description of the operation in the case in which the odd-numbered block is selected is omitted.

In the above description, by way of example, the case is described in which the control signals SELL, SELR and RPO are set at the "L" level at the time of the start and at the time of the end of the read operation. However, the embodiment is not limited to the example. For example, the control signals SELL, SELR and RPO may be kept at the "H" level in accordance with the operation state of the semiconductor memory device 10.

[1-3] Advantages Provided by the First Embodiment

In the semiconductor memory device 10 according to the above-described first embodiment, the read operation can be executed at high speed. Hereinafter, the advantages provided by the semiconductor memory device 10 according to the first embodiment will be described in detail.

In the semiconductor memory device in which memory cells are stacked three-dimensionally, plate-shaped conductors 42 are used as word lines WL, for example, as illustrated in FIG. 7 and FIG. 8. The word lines WL in this configuration have a tendency that an RC delay amount increases. When a voltage is applied to a word line from one end of the word line WL, there may be a case in which the speed of the rise of the voltage differs between an area (the "Near" side) near the driver and an area (the "Far" side) far from the driver. It should be noted that in the present specification, the term "RC delay amount" means a length of RC delay time representing a time from the application of a voltage to an interconnect to the rise of the voltage of the interconnect to a target value.

Thus, in order to assist the rise of voltage of the word line WL on the "Far" side where the speed of the rise of voltage is relatively slow, the semiconductor memory device executes, for example, the kick operation. However, when the kick operation is executed for the word line WL, there may be a case in which an over-discharge occurs in a bit line BL which is connected to a NAND string NS corresponding to the "Near" side of the word line WL. Since it is needed to set a long stabilization time for the potential of the bit line BL, the time of the read operation becomes longer.

To reduce the over-discharge of the bit line BL, the semiconductor memory device executes the kick operation for the control signal BLC. Since the kick amount of the word line WL decreases from the "Near" side toward the "Far" side, it is preferable that the kick amount of the control signal BLC is decreased likewise from the "Near" side toward the "Far" side. In other words, in order to effectively reduce the over-discharge of the bit line, it is effective to make closer the time variations of the voltages of the word line WL and the control signal BLC with respect to memory cells at any positions, and it is preferable that the word line WL and the control signal BLC are consistent with respect to the propagation delays between the "Near" side and the "Far" side.

Thus, in the semiconductor memory device 10 according to the first embodiment, in the configuration in which the row decoder modules 12A and 12B are provided on both sides of the memory cell array 11, the interconnect for supplying the control signal BLC to the plural transistors 22 in the sense amplifier module 13 is provided in the interconnect layer GC. Thereby, in the semiconductor memory device 10 according to the first embodiment, the RC delay amount of the conductor 60 which functions as the interconnect for supplying the control signal BLC can be made closer to the RC delay amount of the conductor 42 functioning as the word line WL.

Furthermore, in the semiconductor memory device 10 according to the first embodiment, in the read operation, a direction in which the control signal BLC is driven is switched in accordance with the block address. By this switching, the driving directions of the control signal BLC and the word line WL in the kick operation coincide. Thereby, the semiconductor memory device 10 according to the first embodiment can make the variation of the kick amount of word line WL which varies from the "Near" side to "Far" side closer to the variation of the kick amount of the control signal BLC which varies from the "Near" side to "Far" side. Specifically, on the side near the driver where the kick amount for the word line WL becomes large, the kick amount (voltage amplitude) for the control signal BLC can also become large. On the side far from the driver where the kick amount for the word line WL becomes small, the kick amount for the control signal BLC can also become small.

As described above, in the semiconductor memory device 10 according to the first embodiment, the time variation of the kick amount of the control signal BLC in the kick operation for the control signal BLC can be made closer to the time variation of the kick amount of the word line WL in the kick operation for the word line WL. Accordingly, in the semiconductor memory device 10 according to the first embodiment, since it is possible to shorten the stabilization time of the bit line BL in the case in which the kick operation is executed for the word line WL, the speed of the read operation can be increased.

[2] Second Embodiment

The configuration of a semiconductor memory device 10 according to a second embodiment is like the configuration of the semiconductor memory device 10 according to the first embodiment. In the second embodiment, the control method of various control signals in the read operation is different from the control method in the read operation described in the first embodiment.

[2-1] Operation

Figure 13:
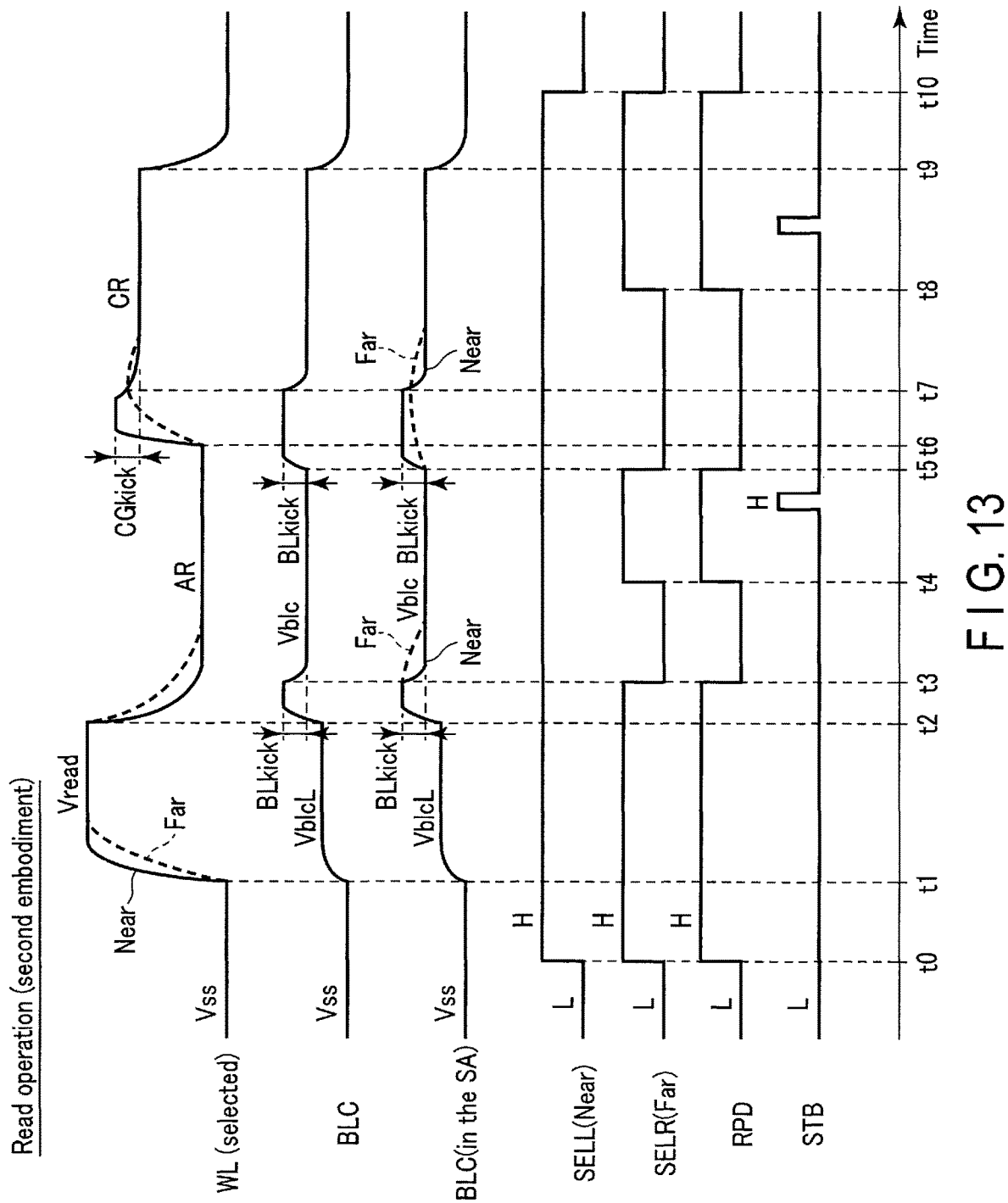
FIG. 13 illustrates an example of waveforms of signals in a read operation of a semiconductor memory device according to a second embodiment.

FIG. 13 illustrates an example of waveforms in the read operation in the semiconductor memory device 10 according to the second embodiment. In FIG. 13, the operation performed subsequently to time t5 is different from that in the read operation of the semiconductor memory device 10 according to the above-described first embodiment.

Specifically, as illustrated in FIG. 13, at time t5, the sequencer 17 lowers the control signals SELR and RPD to the "L" level. Then, the transistors TR and TD enter the OFF state, and the current paths between the BLC driver DR and the sense amplifier module 13 decrease. In addition, the sequencer 17 executes the kick operation for the control signal BLC, and the BLC driver DR outputs the control signal BLC at, for example, a kick voltage Vblc+BLkick. When the charge voltage on the "Far" side of the control signal BLC is to be made sufficiently closer to the charge voltage on the "Near" side of the control signal BLC, the sequencer 17 can raise the voltage of the control signal BLC after the kick voltage is applied to the selected word line WL. At this time, the voltage of the control signal BLC in the inside of the sense amplifier section SA on the "Near" side becomes the same as the output voltage of the BLC driver DR, and the voltage of the control signal BLC on the "Far" side rises with a delay from the rise on the "Near" side.

At time t6, the row decoder module 12A executes the kick operation for the word line WL, and temporarily applies a kick voltage CR+CGkick to the selected word line WL. As illustrated in FIG. 13, the voltage of the word line WL on the "Far" side rises with a delay from the rise of the voltage of the word line WL on the "Near" side. Then, the row decoder module 12A lowers the voltage of the word line WL from the kick voltage to the read voltage CR.

At time t7, the BLC driver DR lowers the control signal BLC to the voltage Vblc. At this time, the voltage of the control signal BLC in the sense amplifier section SA on the "Near" side becomes the same as the output voltage of the BLC driver DR, and the voltage Vblc on the "Far" side descends with a delay from the descent on the "Near" side. The operation at time t7 is executed, for example, relying on the timing when the voltage of the word line WL on the "Far" side reaches the peak by the kick voltage.

The operation performed subsequently to time t8 in the read operation of the semiconductor memory device 10 according to the second embodiment is like the operation performed subsequently to time t8 in the read operation of the semiconductor memory device 10 according to the first embodiment which is described with reference to FIG. 12, so a description thereof is omitted.

[2-2] Advantages Provided by the Second Embodiment

The read operation in the above-described second embodiment differs from the read operation in the first embodiment with respect to the peak value of the voltage of the word line WL on the "Far" side at the time of the kick operation. The voltage of the word line WL on the "Far" side at the time of the kick operation is lower in the read operation in the second embodiment than in the read operation in the first embodiment.

Specifically, in the read operation in the first embodiment, the voltage of the word line WL on the "Far" side at the time of the kick operation rises to a voltage close to the kick voltage CR+CGkick. In contrast, in the read operation in the second embodiment, the voltage of the word line WL on the "Far" side at the time of the kick operation rises to a voltage which is higher than the read voltage CR and is lower than the peak voltage in the read operation in the first embodiment. This indicates that the RC delay amount of the selected word line WL is greater in the second embodiment than in the first embodiment.

On the other hand, in the second embodiment, the control signal BLC is set such that the variation of the voltage on the "Far" side in the inside of the sense amplifier section SA is associated with the variation of the voltage of the word line WL on the "Far" side. Specifically, in the read operation in the second embodiment, the peak value of the control signal BLC on the "Far" side in the kick operation is set to be lower than the peak value in the read operation in the first embodiment.

Thereby, in the semiconductor memory device 10 according to the second embodiment, when the RC delay amount of the word line WL is greater than in the read operation described in the first embodiment, the time variation of the kick amount of the control signal BLC in the kick operation for the control signal BLC can be made closer to the time variation of the kick amount of the word line WL in the kick operation for the word line WL. Accordingly, like the first embodiment, in the semiconductor memory device 10 according to the second embodiment, since it is possible to shorten the stabilization time of the bit line BL in the case in which the kick operation is executed for the word line WL, the speed of the read operation can be increased.

[3] Third Embodiment

The configuration of a semiconductor memory device 10 according to a third embodiment is like the configuration of the semiconductor memory devices 10 according to the first and second embodiments. In the third embodiment, the control method of various control signals in the read operation is different from the read operations described in the first and second embodiments.

[3-1] Operation

FIG. 14 illustrates an example of waveforms in the read operation of the semiconductor memory device 10 according to the third embodiment. In FIG. 14, the operation performed subsequently to time t5 is different from the read operation according to the first embodiment described with reference to FIG. 12.

Specifically, as illustrated in FIG. 14, at time t5, the BLC driver DR lowers the voltage of the control signal BLC to a voltage value lower than the voltage Vblc. This voltage value is, for example, a voltage VblcL, and can be set to a discretionary value.

At time t6, the row decoder module 12A executes the kick operation for the word line WL, and temporarily applies a kick voltage CR+CGkick to the selected word line WL. As illustrated in FIG. 14, the voltage of the word line WL on the "Far" side rises with a delay from the rise of the voltage of the word line WL on the "Near" side. Then, the row decoder module 12A lowers the voltage of the word line WL from the kick voltage to the read voltage CR.

At time t7, the sequencer 17 sets the control signals SELR and RPO at the "L" level. Then, the transistors TR and TD enter the OFF state, and the current paths between the BLC driver DR and the sense amplifier module 13 decrease. In addition, the sequencer 17 executes the kick operation for the control signal BLC, and the BLC driver DR temporarily outputs the control signal BLC at, for example, a kick voltage Vblc+BLkick.

Specifically, after the kick voltage is applied to the selected word line WL, the sequencer 17 raises the voltage of the control signal BLC from the voltage which is lower than the voltage Vblc. At this time, the voltage of the control signal BLC on the "Near" side in the inside of the sense amplifier section SA becomes the same as the output voltage of the BLC driver DR, and the voltage of the control signal BLC on the "Far" side rises with a delay from the rise on the "Near" side. Then, the BLC driver DR lowers the control signal BLC to the voltage Vblc.

The operation performed subsequently to time t8 in the read operation of the semiconductor memory device 10 according to the third embodiment is like the operation performed subsequently to time t8 in the read operation of the semiconductor memory device 10 according to the first embodiment which is described with reference to FIG. 12, so a description thereof is omitted.

[3-2] Advantages Provided by the Third Embodiment

The read operation in the above-described third embodiment differs from the read operations in the first and second embodiments with respect to the peak value of the voltage of the word line WL on the "Far" side in the kick operation. The voltage of the word line WL on the "Far" side in the kick operation is lower in the read operation in the third embodiment than in the read operation in the second embodiment.

Specifically, in the read operation in the third embodiment, the voltage of the word line WL on the "Far" side in the kick operation does not exceed the read voltage CR. This indicates that the RC delay amount of the selected word line WL is greater in the third embodiment than in the second embodiment.

On the other hand, in the third embodiment, the control signal BLC is set such that the variation of the voltage on the "Far" side in the inside of the sense amplifier section SA is associated with the variation of the voltage of the word line WL on the "Far" side. Specifically, in the read operation in the third embodiment, the peak value of the control signal BLC on the "Far" side in the kick operation is set to be lower than in the read operation in the second embodiment.

Thereby, in the semiconductor memory device 10 according to the third embodiment, when the RC delay amount of the word line WL is greater than that in the read operation described in the second embodiment, the time variation of the kick amount of the control signal BLC in the kick operation for the control signal BLC can be made closer to the time variation of the kick amount of the word line WL in the kick operation for the word line WL. Accordingly, like the first and second embodiments, in the semiconductor memory device 10 according to the third embodiment, since it is possible to shorten the stabilization time of the bit line BL in the case in which the kick operation is executed for the word line WL, the speed of the read operation can be increased.

[4] Fourth Embodiment

In a semiconductor memory device 10 according to a fourth embodiment, by use of a resistor section provided in the sense amplifier module 13, the time variations of the respective voltages in the kick operations for the word line WL and the control signal BLC are associated. Hereinafter, different points from the first to third embodiments will be described with respect to the semiconductor memory device 10 according to the fourth embodiment.

[4-1] Configuration

Figure 15:
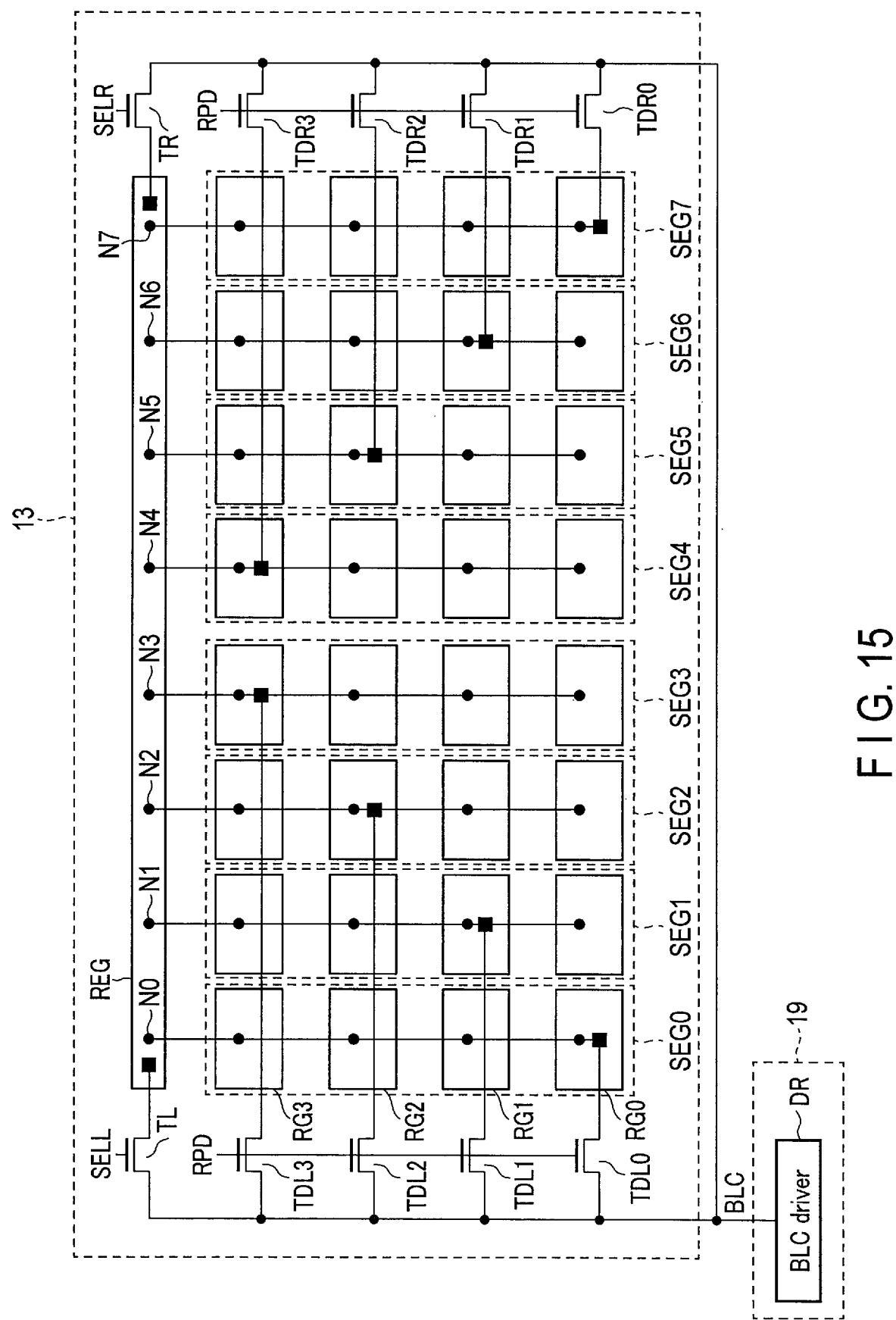
FIG. 15 is a block diagram illustrating a detailed configuration example of a sense amplifier module and a voltage generator included in a semiconductor memory device according to a fourth embodiment.

FIG. 15 is a block diagram illustrating a detailed configuration example of the sense amplifier module 13 and the voltage generator 19 included in the semiconductor memory device 10 according to the fourth embodiment. Hereinafter, for the purpose of simplifying a description, it is assumed that the number of sense amplifier units SAU which one sense amplifier group SAG includes is four. As illustrated in FIG. 15, the sense amplifier module 13 includes, for example, a resistor section REG, transistors TL and TR, sense amplifier segments SEG0 to SEG7, transistors TDL0 to TDL3, and transistors TDR0 to TDR3.

The resistor section REG is provided to extend in the direction of extension of the word lines WL. The resistor section REG includes contact points N0 to N7 which are arranged in the direction of extension of the word lines WL. One end portion of the resistor section REG is connected to one terminal of the transistor TL, and the other end portion of the resistor section REG is connected to one terminal of the transistor TR. The other terminals of the transistors TL and TR are connected to the BLC driver DR. Control signals SELL and SELR are input to the gates of the transistors TL and TR, respectively.

In addition, the resistor section REG is designed, for example, such that the RC delay amount between the one end and the other end of the resistor section REG is substantially equal to the RC delay amount of the conductor 42 corresponding to the word line WL. Specifically, the resistor section REG is designed, for example, such that the RC delay amount in a case in which the BLC driver DR charges and discharges the-resistor section REG via one of the transistors SELL and SELR is set to be substantially equal to the RC delay amount of the word line WL.

The sense amplifier segments SEG0 to SEG7 are placed in the direction of extension of the word lines WL. Each sense amplifier segment SEG includes, for example, a plurality of sense amplifier groups SAG (not shown) which are arranged in the direction of extension of word lines WL. In the segment SEG, an area including a set of sense amplifier units SAU arranged in the direction of extension of the word lines WL constitutes a sense amplifier region RG. For example, a region RG0 includes a plurality of sense amplifier units SAU0. A region RG1 includes a plurality of sense amplifier units SAU1. A region RG2 includes a plurality of sense amplifier units SAU2. A region RG3 includes a plurality of sense amplifier units SAU3. The regions RG0 to RG3 in the segment SEG0 are connected to a contact point N0 of the resistor section REG. Regions RG0 to RG3 in the segment SEG1 are connected to a contact point N1 of the resistor section REG. Similarly, regions RG0 to RG3 in the segments SEG2 to SEG7 are connected to contact points N2 to N7 of the resistor section REG, respectively.

One terminal of the transistor TDL0 is connected to the sense amplifier units SAU in the region RG0 in the segment SEG0. One terminal of the transistor TDL1 is connected to the sense amplifier units SAU in the region RG1 in the segment SEG1. One terminal of the transistor TDL2 is connected to the sense amplifier units SAU in the region RG2 in the segment SEG2. One terminal of the transistor TDL3 is connected to the sense amplifier units SAU in the region RG3 in the segment SEG3. In this manner, the transistors TDL0 to TDL3 are connected to the different sense amplifier regions RG in the different sense amplifier segments SEG, respectively. The other terminals of the transistors TDL0 to TDL3 are connected to the BLC driver DR, and the control signal RPD is input to the gates of the transistors TDL0 to TDL3.

One terminal of the transistor TDR0 is connected to the sense amplifier units SAU in the region RG0 in the segment SEG7. One terminal of the transistor TDR1 is connected to the sense amplifier units SAU in the region RG1 in the segment SEG6. One terminal of the transistor TDR2 is connected to the sense amplifier units SAU in the region RG2 in the segment SEG5. One terminal of the transistor TDR3 is connected to the sense amplifier units SAU in the region RG3 in the segment SEG4. In this manner, the transistors TDR0 to TDR3 are connected to the different sense amplifier regions RG in the different sense amplifier segments SEG, respectively. The other terminals of the transistors TDR0 to TDR3 are connected to the BLC driver DR, and the control signal RPD is input to the gates of the transistors TDR0 to TDR3.

In the above-described configuration, when both the transistor TDL and the resistor section REG are connected to each region RG, the interconnects therefor are commonly connected. Similarly, if both the transistor TDR and the resistor section REG are connected to one region RG, the interconnects therefor are commonly connected.

FIG. 16 is a view illustrating an example of a plan-view layout of the sense amplifier module 13 included in the semiconductor memory device 10 according to the fourth embodiment. FIG. 16 illustrates an extracted area corresponding to the sense amplifier segments SEG0 to SEG3 shown in the block diagram of FIG. 15.

As illustrated in FIG. 16, in the area of the sense amplifier module 13, there are provided a plurality of conductors 60, a plurality of via contacts 61, a plurality of conductors 62, a plurality of via contacts 63, a plurality of conductors 64, and a conductor 65.

The conductors 60 are provided to extend in the X direction, for example, in the interconnect layer GC. The conductor 60 is provided for each sense amplifier region RG, and functions as the gate electrodes of the transistors 22 arranged in the X direction. In addition, in each segment SEG, a set of transistors 22 arranged in the Y direction corresponds to the sense amplifier group SAG, and a shunt region SHT is provided between the sense amplifier groups SAG positioned in the X direction.

The via contacts 61 are provided, for example, between the interconnect layer GC and the interconnect layer M1. At least one via contact 61 is provided on each conductor 60, for example, in the shunt region SHT of each sense amplifier region RG. In addition, the number of via contacts 61 provided on the conductor 65 corresponds to at least the number of sense amplifier segments SEG.

The conductors 62 are provided to extend in the Y direction, for example, in the interconnect layer M1. For each segment SEG, the conductor 62 connects the conductor 65 to the conductors 60 in the segment SEG through the via contacts 61.

The via contacts 63 are provided, for example, between the interconnect layer GC and the interconnect layer M2. At least one via contact 63 is provided on the conductor 60 of the corresponding one sense amplifier region RG, for example, in the shunt region SHT of each sense amplifier segment SEG.

The conductor 64 is provided to extend in the X direction in each of the regions RG of the segments SEG0 to SEG3, for example, in the interconnect layer M2. Each of the plural conductors 64 is connected to one of the via contacts 63 which are provided on the conductors 60 in different sense amplifier regions RG of different sense amplifier segments SEG. Each of the conductors 64 is connected to the one terminal of the corresponding transistor TDL in a region not shown. Specifically, for example, the conductor 64 passing over the regions RG0 is connected to the conductor 60 in the segment SEG0 through the via contact 63, and the conductor 64 passing over the regions RG3 is connected to the conductor 60 in the segment SEG3 through the via contact 63.

The conductor 65 functions as the resistor section REG and is provided to extend in the X direction, for example, in the interconnect layer GC. The via contacts 61 are provided on the conductor 65 in association with the contact points N0 to N3, and the conductor 65 is electrically connected through these via contacts 61 to the conductors 62 corresponding to the respective segments SEG. In addition, in regions not shown, the one end portion of the conductor 65 in the X direction is connected to the one terminal of the transistor TL, and the other end portion of the conductor 65 in the X direction is connected to the one terminal of the transistor TR.

For example, as illustrated in FIG. 15, the plan-view layout of the segments SEG4 to SEG7 is like a configuration which is obtained by inverting the plan-view layout of the segments SEG0 to SEG3. It should be noted that the conductors 64 corresponding to the different sense amplifier regions RG are separately provided, for example, for the segments SEG0 to SEG3 and for the segments SEG4 to SEG7. In addition, the conductor 65 may be separately provided, for example, in the region corresponding to the segments SEG0 to SEG3 and in the region corresponding to the segments SEG4 to SEG7, and these regions may be connected by another interconnect.

In the configuration of the above-described semiconductor memory device 10, the resistance value of the interconnects provided in the interconnect layer GC is lower than the resistance value of the interconnects provided in the interconnect layer M2. In addition, the distance between the via contact 61 and the via contact 63 provided in the same region RG is narrower than, for example, the distance from the end portion of the conductor 65 to which the transistor TL is connected, to the via contact 61 corresponding to this region RG. Thus, the RC delay amount in the case in which an electric current flows from the conductor 64 to the conductor 62 through the via contact 63, the conductor 60 and the via contact 61 is less than the RC delay amount in the case in which an electric current flows from the conductor 65 to the conductor 62 via the via contact 61. Since the other configuration of the semiconductor memory device 10 according to the fourth embodiment is like the configuration of the semiconductor memory device 10 according to the first embodiment, a description thereof is omitted.

In the above-described example, the via contacts 63 are provided between the interconnect layer GC and interconnect layer M2. However, the configuration of the via contacts 63 is not limited to this example. For example, the via contacts 63 may be provided between the interconnect layer M1 and interconnect layer M2. In this case, each of the via contacts 63 is provided between the conductor 62 and conductor 64, and electrically connects the conductor 62 and conductor 64.

[4-2] Operation

The semiconductor memory device 10 according to the fourth embodiment can execute the read operations described in the first to third embodiments. Specifically, the waveforms of the read operation in the fourth embodiment are like the waveforms of the read operations described in the first to third embodiments.

In the sense amplifier module 13 in the fourth embodiment, one of the sense amplifier regions RG of each sense amplifier segment SEG is connected to one of the transistors TDL or TDR which are controlled by the control signal RPD. Thereby, in the read operation according to the fourth embodiment, the transistors TDL and TDR can function and operate like the transistors TD described in the first to third embodiments. Since the other operation of the semiconductor memory device 10 according to the fourth embodiment corresponds to the operation of the semiconductor memory devices 10 described in the first to third embodiments, a description thereof is omitted.

[4-3] Advantages Provided by the Fourth Embodiment

As described above, in the semiconductor memory device 10 according to the fourth embodiment, the sense amplifier module 13 includes the resistor section REG. In addition, the control signal BLC is supplied to each sense amplifier segment SEG in the sense amplifier module 13 via the resistor section REG. The respective sense amplifier segments SEG are connected to the resistor section REG at different connection positions. Specifically, with respect to the control signal BLC supplied to the sense amplifier segments SEG, the distance over which the control signal BLC passes through the resistor section REG varies in accordance with the connection positions where the sense amplifier segments SEG are connected to the resistor section REG.

Thereby, like the first embodiment, in the semiconductor memory device 10 according to the fourth embodiment, the time variation of the kick amount of the control signal BLC in the kick operation for the control signal BLC can be made closer to the time variation of the kick amount of the word line WL in the kick operation for the word line WL. Accordingly, like the first embodiment, in the semiconductor memory device 10 according to the fourth embodiment, since it is possible to shorten the stabilization time of the bit line BL in the case in which the kick operation is executed for the word line WL, the speed of the read operation can be increased.

Moreover, the resistor section REG in the fourth embodiment can be configured with a simple design. For example, it should be appreciated that the RC delay amount in the resistor section REG may be increased by decreasing the line width of the conductor 65, and that the RC delay amount in the resistor section REG may be decreased by increasing the line width of the conductor 65. Specifically, for the resistor section REG in the fourth embodiment, the magnitude of the RC delay amount can easily be adjusted in accordance with the design of the word line WL. Therefore, an increase in the design cost of the sense amplifier module 13 can be avoided.

[5] Fifth Embodiment

A semiconductor memory device 10 according to a fifth embodiment is configured to include a plurality of resistor sections REG additionally provided to the sense amplifier module 13 according to the fourth embodiment. Hereinafter, with respect to the semiconductor memory device 10 according to the fifth embodiment, different points from the first to fourth embodiments will be described.

[5-1] Configuration

Figure 17:
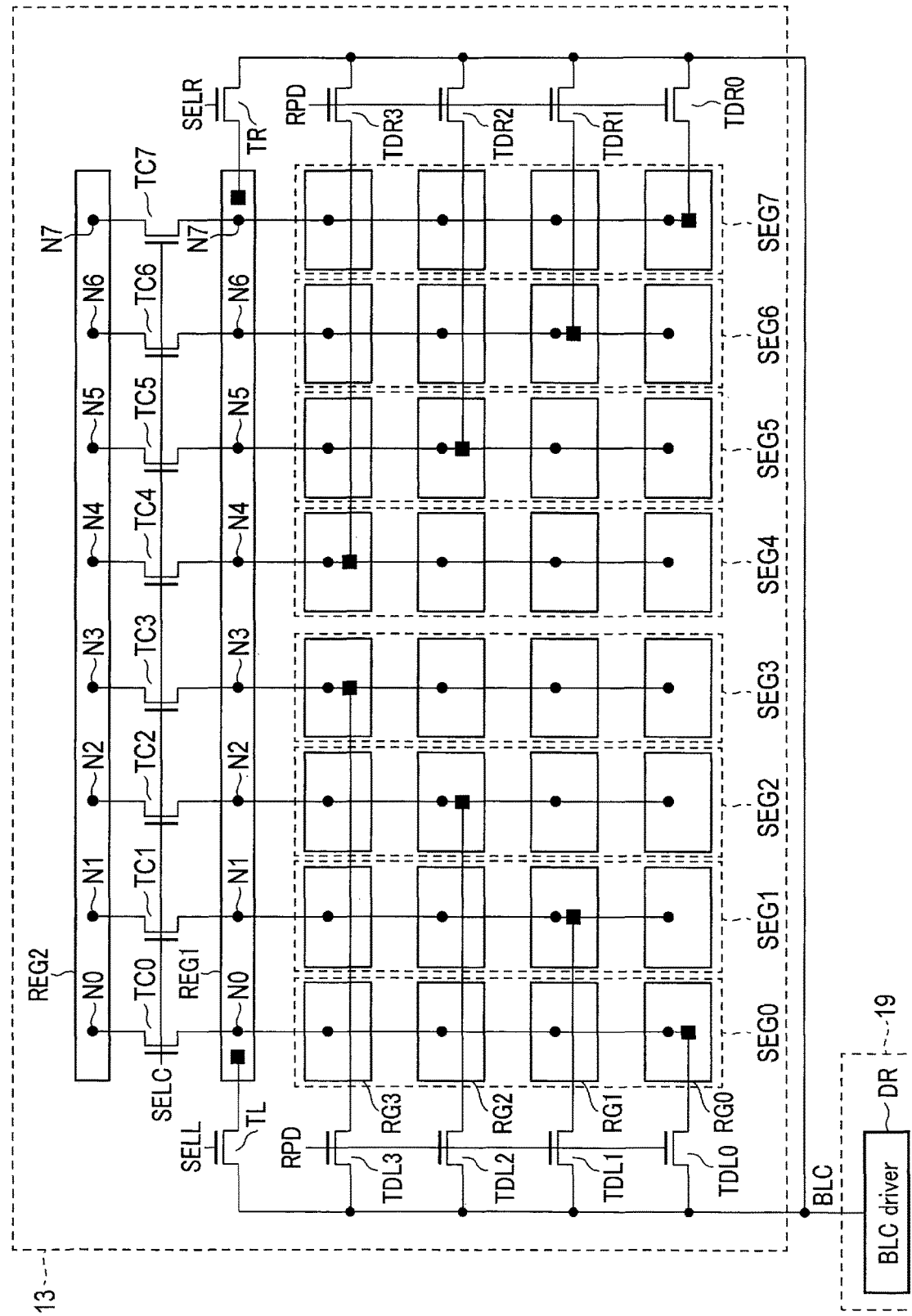
FIG. 17 is a block diagram illustrating a detailed configuration example of a sense amplifier module and a voltage generator included in a semiconductor memory device according to a fifth embodiment.

FIG. 17 is a block diagram illustrating a detailed configuration example of a sense amplifier module 13 and a voltage generator 19 included in the semiconductor memory device 10 according to the fifth embodiment. As illustrated in FIG. 17, in contrast with the sense amplifier module 13 according to the fourth embodiment described with reference to FIG. 15, a plurality of transistors TC and a plurality of resistor sections REG are provided in the sense amplifier module 13 in the fifth embodiment. Specifically, the sense amplifier module 13 in the fifth embodiment includes resistor sections REG1 and REG2 and transistors TC0 to TC7.

The resistor sections REG1 and REG2 are provided to extend in the direction of extension of the word lines WL, and include contact points N0 to N7 arranged in the direction of extension of the word lines WL. The contact points N0 to N7 of the resistor section REG1 are connected to the sense amplifier units SAU in the sense amplifier segments SEG0 to SEG7, respectively. Each of the contact points N0 to N7 of the resistor section REG2 is connected to one terminal of a corresponding one of the transistors TC0 to TC7. The other terminals of the transistors TC0 to TC7 are connected to the contact points N0 to N7 of the resistor section REG1, respectively. The contact points N0 to N7 of the resistor sections REG1 and REG2 are connected through the via contacts 61 to the conductors 62 provided for the segments SEG0 to SEG7. One end portion of the resistor section REG1 is connected to one terminal of a transistor TL, and the other end portion of the resistor section REG1 is connected to one terminal of a transistor TR. The other terminals of the transistors TL and TR are connected to the BLC driver DR. Control signals SELL and SELR are input to the gates of the transistors TL and TR. A control signal SELC is input to the gates of the transistors TC0 to TC7. The control signals SELL, SELR and SELC are generated by, for example, the sequencer 17.

In the above-described configuration, the resistor section REG1 is designed such that, for example, the RC delay amount between the one end and the other end of the resistor section REG1 is substantially equal to the RC delay amount of the conductor 42 corresponding to the word line WL having a large RC delay amount. The resistor section REG2 is designed such that, for example, in combination with the resistor section REG1, the RC delay amount between the one end portions and the other end portions of the resistor sections REG1 and REG2 is substantially equal to the RC delay amount of the conductor 42 corresponding to the word line WL having a small RC delay amount. Since the other configuration of the semiconductor memory device 10 according to the fifth embodiment is like the configuration of the semiconductor memory device 10 according to the fourth embodiment, a description thereof is omitted.

[5-2] Operation

In contrast with the read operation described in the fourth embodiment, the semiconductor memory device 10 according to the fifth embodiment adjusts the kick amount of the control signal BLC in accordance with the address of the selected word line WL by an additional control of the control signal SELC in the kick operation.

FIG. 18 illustrates an example of the control method of the kick operation in the fifth embodiment. The operation to be described below corresponds to, for example, the operation between time t7 and time t8 in the read operation in the first embodiment illustrated in FIG. 12, the operation between time t7 and time t8 in the read operation in the second embodiment illustrated in FIG. 13, or the operation between time t7 and time t8 in the read operation in the third embodiment illustrated in FIG. 14.

As illustrated in FIG. 18, when the selected block is an even-numbered block and the delay amount is large, the sequencer 17 sets the control signal SELL at the "H" level, and sets the control signals SELR and SELC at the "L" level. Then, the control signal BLC is supplied to each sense amplifier segment SEG via the transistor TL and resistor section REG1.

On the other hand, when the selected block is an even-numbered block and the delay amount is small, the sequencer 17 sets the control signals SELL and SELC at the "H" level, and sets the control signal SELR at the "L" level. As the control signal SELC is set at the "H" level, all of the transistors TC0 to TC7 which connect the resistor section REG1 and resistor section REG2 enter the ON state, and the signal supplied to the resistor section REG1 also passes along the resistor section REG2 via the transistors TC. Thereby, the control signal BLC is supplied to each sense amplifier segment SEG via the transistor TL and the resistor sections REG1 and REG2.

When the selected block is an odd-numbered block and the delay amount is large, the sequencer 17 sets the control signals SELL and SELC at the "L" level, and sets the control signal SELR at the "H" level. Then, the control signal BLC is supplied to each sense amplifier segment SEG via the transistor TR and the resistor section REG1.

On the other hand, when the selected block is an odd-numbered block and the delay amount is small, the sequencer 17 sets the control signal SELL at the "L" level, and sets the control signals SELR and SELC at the "H" level. Then, the control signal BLC is supplied to each sense amplifier segment SEG via the transistor TR and the resistor sections REG1 and REG2.

Since the other operation of the semiconductor memory device 10 according to the fifth embodiment is like the operation of the semiconductor memory devices 10 according to the fourth embodiment, a description thereof is omitted.

[5-3] Advantages Provided by the Fifth Embodiment

As described above, in the semiconductor memory device 10 according to the fifth embodiment, the sense amplifier module 13 includes a plurality of resistor sections REG. The sequencer 17 changes the number of resistor sections REG for supplying the control signal BLC, in accordance with the address of the selected word line WL.

Specifically, for example, the sequencer 17 controls the transistors TL and TR such that the control signal BLC is supplied to each sense amplifier section SA via one resistor section REG when a word line WL with a large RC delay amount is selected, and such that the control signal BLC is supplied to each sense amplifier section SA via two resistor sections REG when a word line WL with a small RC delay amount is selected.

Thereby, in the semiconductor memory device 10 according to the fifth embodiment, like the first to fourth embodiments, the time variation of the kick amount of the control signal BLC in the kick operation for the control signal BLC can be made closer to the time variation of the kick amount of the word line WL in the kick operation for the word line WL. Accordingly, like the first to fourth embodiments, in the semiconductor memory device 10 of the fifth embodiment, since it is possible to shorten the stabilization time of the bit line BL in the case in which the kick operation is executed for the word line WL, the speed of the read operation can be increased.

Moreover, the semiconductor memory device 10 according to the fifth embodiment changes the RC delay amount of the control signal BLC by using the plural resistor sections REG and the plural transistors TC. Specifically, by being combined with the read operations as described in the first to third embodiments, the operation of the semiconductor memory device 10 according to the fifth embodiment can more precisely associate the control signal BLC with the word line WL.

[6] Sixth Embodiment

A semiconductor memory device 10 according to a sixth embodiment which includes a plurality of resistor sections REG is configured such that the respective resistor sections REG are connected to different sense amplifier segments SEG. Hereinafter, with respect to the semiconductor memory device 10 according to the sixth embodiment, different points from the first to fifth embodiments will be described.

[6-1] Configuration

Figure 19:
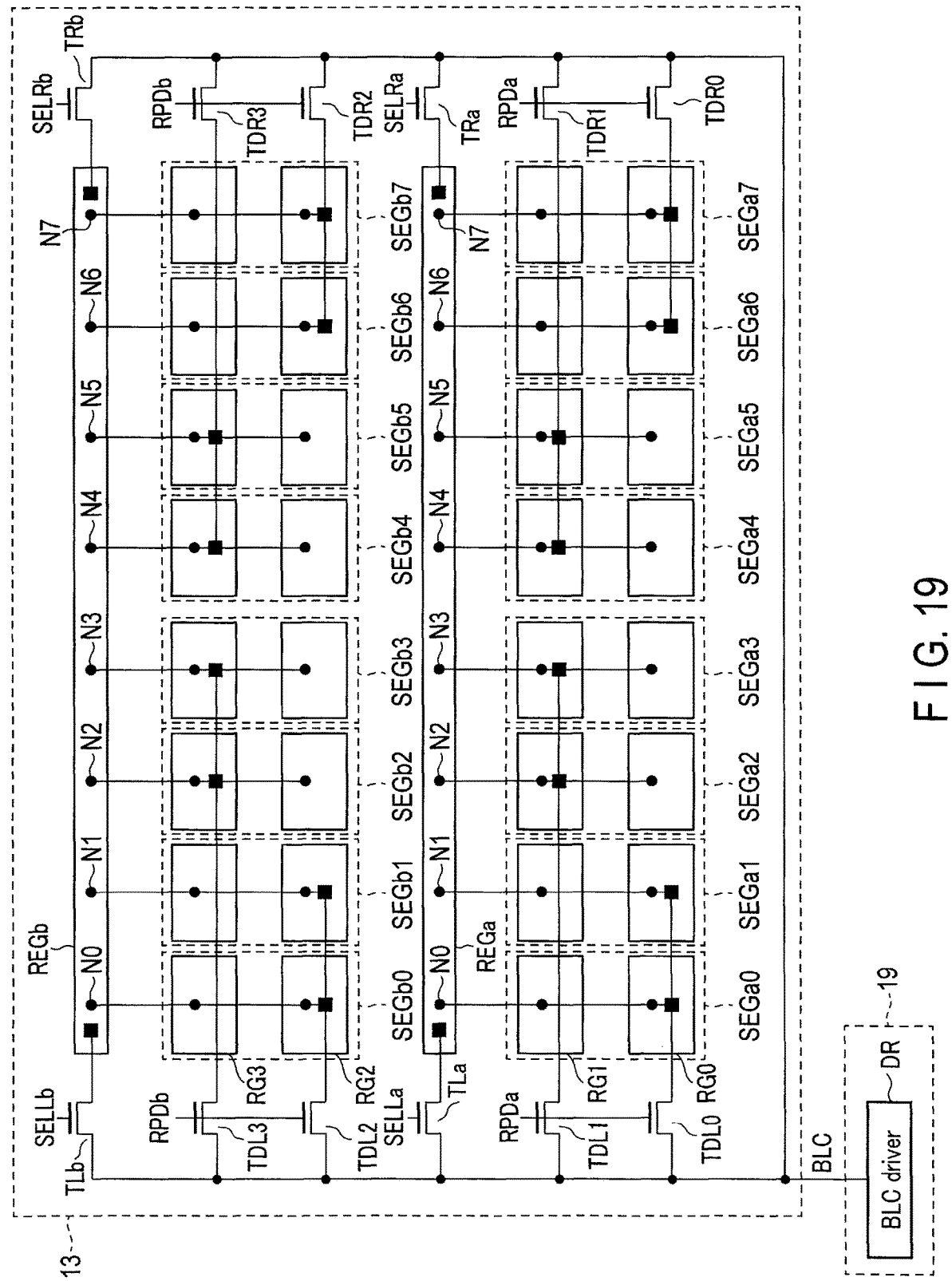
FIG. 19 is a block diagram illustrating a detailed configuration example of a sense amplifier module and a voltage generator included in a semiconductor memory device according to a sixth embodiment.

FIG. 19 is a block diagram illustrating a detailed configuration example of the sense amplifier module 13 and voltage generator 19 included in the semiconductor memory device 10 according to the sixth embodiment. As illustrated in FIG. 19, in contrast with the sense amplifier module 13 in the fourth embodiment described with reference to FIG. 15, a plurality of transistors TL and TR and a plurality of resistor sections REG are provided in the sense amplifier module 13 in the six embodiment. Furthermore, the connection relation between the transistors TDL and TDR and the segments SEG is different. Specifically, the sense amplifier module 13 in the sixth embodiment includes sense amplifier segments SEGa0 to SEGa7, sense amplifier segments SEGb0 to SEGb7, resistor sections REGa and REGb, transistors TLa and TLb, and transistors TRa and TRb.

The sense amplifier segments SEGa include, for example, sense amplifier regions RG0 and RG1. The sense amplifier units SAU in the regions RG0 in the segments SEGa0 and REGa1 are connected to one terminal of the transistor TDL0. The sense amplifier units SAU in the regions RG1 in the segments SEGa2 and REGa3 are connected to one terminal of the transistor TDL1. The sense amplifier units SAU in the regions RG1 in the segments SEGa4 and REGa5 are connected to one terminal of the transistor TDR1. The sense amplifier units SAU in the regions RG0 in the segments SEGa6 and REGa7 are connected to one terminal of the transistor TDR0. The other ends of the transistors TDL0, TDL1, TDR0 and TDR1 are connected to the BLC driver DR. A control signal RPDa is input to the gates of the transistors TDL0, TDL1, TDR0 and TDR1.

The sense amplifier segment SEGb includes, for example, sense amplifier regions RG2 and RG3. The sense amplifier units SAU in the regions RG2 in the segments SEGb0 and REGb1 are connected to one terminal of the transistor TDL2. The sense amplifier units SAU in the regions RG3 in the segments SEGb2 and REGb3 are connected to one terminal of the transistor TDL3. The series amplifier units SAU in the regions RG3 in the segments SEGb4 and REGb5 are connected to one terminal of the transistor TDR3. The sense amplifier units SAU in the regions RG2 in the segments SEGb6 and REGb7 are connected to one terminal of the transistor TDR2. The other terminals of the transistors TDL2, TDL3, TDR2 and TDR3 are connected to the BLC driver DR. A control signal RPDb is input to the gates of the transistors TDL2, TDL3, TDR2 and TDR3.

The resistor sections REGa and REGb are provided to extend in the direction of extension of the word lines WL, and include contact points N0 to N7 arranged in the direction of extension of the word lines WL. The contact points N0 to N7 of the resistor section REGa are connected to the sense amplifier units SAU in the sense amplifier segments SEGa0 to SEGa7, respectively. Specifically, the contact points N0 to N7 of the resistor section REGa are connected through the via contacts 61 to the conductors 62 provided for the segments SEGa0 to SEGa7, respectively. One end portion of the resistor section REGa is connected to one terminal of the transistor TLa. The other end portion of the resistor portion REGa is connected to one terminal of the transistor TRa. The contact points N0 to N7 of the resistor section REGb are connected to the sense amplifier units SAU in the sense amplifier segments SEGb0 to SEGb7, respectively. Specifically, the contact points N0 to N7 of the resistor section REGb are connected through the via contacts 61 to the conductors 62 provided for the segments SEGb0 to SEGb7, respectively. One end portion of the resistor section REGb is connected to one terminal of the transistor TLb. The other end portion of the resistor portion REGb is connected to one terminal of the transistor TRb. The other terminals of the transistors TLa, TLb, TRa and TRb are connected to the BLC driver DR. Control signals SELLa, SELLb, SELRa and SELRb are input to the gates of the transistors TLa, TLb, TRa and TRb, respectively.

In the above-described configuration, each of the resistor sections REGa and REGb is designed such that, for example, the RC delay amount between the one end portion and the other end portion of the resistor section REGa or REGb is substantially equal to the RC delay amount of the conductor 42 corresponding to the word line WL. In addition, the above-described control signals RPDa, RPDb, SELLa, SELLb, SELRa and SELRb are generated by, for example, the sequencer 17. Further, the above-described sense amplifier regions RG0 and RG1 are connected to, for example, odd-numbered bit lines, and the sense amplifier regions RG2 and RG3 are connected to, for example, even-numbered bit lines. Since the other configuration of the semiconductor memory device 10 according to the sixth embodiment is like the configuration of the semiconductor memory device 10 according to the fourth embodiment, a description thereof is omitted.

[6-2] Operation

The semiconductor memory device 10 according to the sixth embodiment changes the control method of the control signals SELL and SELR in the kick operation, for example, depending on whether the selected bit line is an odd-numbered bit line or an even numbered bit line. FIG. 20 illustrates an example of the control method of the kick operation in the sixth embodiment. The operation to be described below corresponds to, for example, the operation between time t5 and time t6 in the read operation in the first embodiment illustrated in FIG. 12, the operation between time t5 and time t6 in the read operation in the second embodiment illustrated in FIG. 13, or the operation between time t5 and time t6 in the read operation in the third embodiment illustrated in FIG. 14.

As illustrated in FIG. 20, when the selected block is an even-numbered block and an odd-numbered bit line is selected, the sequencer 17 sets the control signal SELLa at the "H" level, and sets the control signals SELLb, SELRa and SELRb at the "L" level. Then, the control signal BLC is supplied to each sense amplifier segment SEGa via the transistor TLa and resistor section REGa. On the other hand, when the selected block is an even-numbered block and an even-numbered bit line is selected, the sequencer 17 sets the control signal SELLb at the "H" level, and sets the control signals SELLa, SELRa and SELRb at the "L" level. Then, the control signal BLC is supplied to each sense amplifier segment SEGb via the transistor TLb and resistor section REGb.

When the selected block is an odd-numbered block and an odd-numbered bit line is selected, the sequencer 17 sets the control signal SELRa at the "H" level, and sets the control signals SELLa, SELLb and SELRb at the "L" level. Then, the control signal BLC is supplied to each sense amplifier segment SEGa via the transistor TRa and resistor section REGa. On the other hand, when the selected block is an odd-numbered block and an even-numbered bit line is selected, the sequencer 17 sets the control signal SELRb at the "H" level, and sets the control signals SELLa, SELLb and SELRa at the "L" level. Then, the control signal BLC is supplied to each sense amplifier segment SEGb via the transistor TRb and resistor section REGb. Since the other operation of the semiconductor memory device 10 according to the sixth embodiment is like the operation of the semiconductor memory devices 10 according to the fourth embodiment, a description thereof is omitted.

[6-3] Advantages Provided by the Sixth Embodiment

As described above, in the semiconductor memory device 10 according to the sixth embodiment, the sense amplifier module 13 includes a plurality of resistor sections REG, and includes sense amplifier segments SEG which are allocated to the respective resistor sections REG. In addition, these sets of the resistor section REG and the sense amplifier segments SEG are associated with, for example, odd-numbered bit lines or even-numbered bitlines.

Thereby, in the semiconductor memory device 10 according to the sixth embodiment, when the interconnect resistance or the like is different between the odd-numbered bit lines and even-numbered bit lines, it is possible to optimize the kick amounts of the control signals BLC for the respective odd-numbered and even-numbered bit lines. Accordingly, since the semiconductor memory device 10 according to the sixth embodiment can reduce the variation in the kick amounts for the bit lines BL, the reliability of the read operation can be enhanced.

In the above description, by way of example, the case is described in which the sense amplifier segments SEGa are associated with odd-numbered bit lines, and the sense amplifier segments SEGb are associated with even-numbered bit lines. However, the configuration is not limited to this. Other different configurations may be applied to the respective sense amplifier segments SEG. In addition, in the above description, by way of example, the case is described in which the transistor TDL0, for instance, is connected to the sense amplifier regions RG0 included in the plural segments SEG. However, the configuration is not limited to this. For example, like the semiconductor memory device 10 according to the fourth embodiment, the semiconductor memory device 10 according to the sixth embodiment may be configured such that one region RG included in one segment SEG is connected to one transistor TD.

[7] Seventh Embodiment

A semiconductor memory device 10 according to a seventh embodiment includes drivers which supply the control signal BLC to interconnects. One driver drives an interconnect from one end side of the interconnect, and another driver drives an interconnect from the other end side of the interconnect. Then, the semiconductor memory device 10 executes a read operation in which the time variation of the kick amount of the control signal BLC is made closer to the time variation of the kick amount of the word line WL. Hereinafter, with respect to the semiconductor memory device 10 according to the seventh embodiment, different points from the first to sixth embodiments will be described.

[7-1] Configuration

Figure 21:
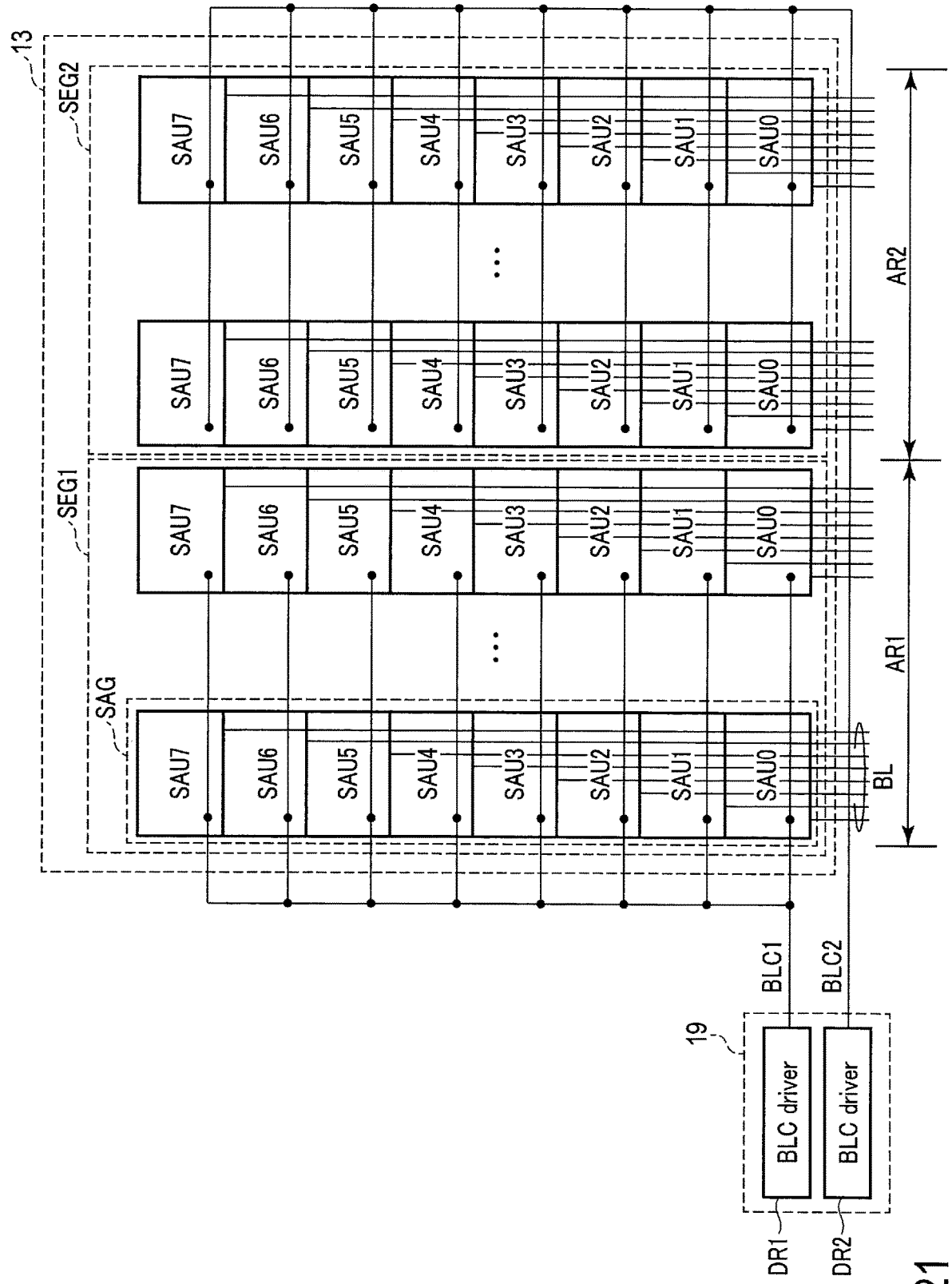
FIG. 21 is a block diagram illustrating a detailed configuration example of a sense amplifier module and a voltage generator included in a semiconductor memory device according to a seventh embodiment.

FIG. 21 is a block diagram illustrating an example of a detailed configuration of the sense amplifier module 13 and the voltage generator 19 included in the semiconductor memory device 10 according to the seventh embodiment. As illustrated in FIG. 21, the sense amplifier module 13 includes a plurality of sense amplifier segments SEG1 and SEG2, and the voltage generator 19 includes BLC drivers DR1 and DR2.

Each of the sense amplifier segments SEG1 and SEG2 includes a plurality of sense amplifier groups SAG. The sense amplifier units SAU in the segment SEG1 are connected to bit lines BL corresponding to NAND strings NS provided in the area AR1, and the sense amplifier units SAU in the segment SEG2 are connected to bit lines BL corresponding to NAND strings NS provided in the area AR2.

The BLC drivers DR1 and DR2 generate control signals BLC1 and BLC2, respectively, based on a voltage which a charge pump (not shown) generates. The BLC driver DR1 supplies the generated control signal BLC1 to the sense amplifier units SAU included in the segment SEG1. The BLC driver DR2 supplies the generated control signal BLC2 to the sense amplifier units SAU included in the segment SEG2.

In the sense amplifier module 13 in the above-described seventh embodiment, when an even-numbered block is selected, the sense amplifier segment SEG1 corresponding to the area AR1 corresponds to the "Near" side, and the sense amplifier segment SEG2 corresponding to the area AR2 corresponds to the "Far" side. Similarly, when an odd-numbered block is selected, the sense amplifier segment SEG2 corresponding to the area AR2 corresponds to the "Near" side, and the sense amplifier segment SEG1 corresponding to the area AR1 corresponds to the "Far" side.

[7-2] Operation

When the kick operation is executed for the control signal BLC in the read operation, the semiconductor memory device 10 according to the seventh embodiment changes the control method of the BLC drivers DR1 and DR2, depending on whether an even-numbered block is selected or an odd-numbered block is selected. In other words, the sequencer 17 changes the control method of the control signals BLC1 and BLC2 according to the correspondence of "Near" and "Far" with the areas AR1 and AR2.

For example, when the areas AR1 and AR2 correspond to "Near" and "Far", respectively, the sequencer 17 applies the controls of "Near" and "Far" to the control signals BLC1 and BLC2, respectively. When the areas AR1 and AR2 correspond to "Far" and "Near", respectively, the sequencer 17 applies the controls "Far" and "Near" to the control signals BLC1 and BLC2, respectively.

FIG. 22 shows an example of the flowchart of the read operation of the semiconductor memory device 10 according to the seventh embodiment. As illustrated in FIG. 22, to start with, the semiconductor memory device 10 receives a read instruction from the external controller (step S10). Next, based on the stored address information ADD, the sequencer 17 checks the address of a selected block BLK, and determines whether the selected block BLK is an even-numbered block or an odd-numbered block (step S11). Then, when the even-numbered block is selected, the sequencer 17 applies the controls of "Near" and "Far" to the control signals BLC1 and BLC2, respectively (step S12), and executes the read operation (step S17). On the other hand, when the odd-numbered block is selected, the sequencer 17 applies the controls of "Far" and "Near" to the control signals BLC1 and BLC2, respectively (step S16), and executes the read operation (step S17).

Hereinafter, the details of the read operation in a case in which the even-numbered block is selected will be described. FIG. 23 illustrates an example of waveforms in the read operation of the semiconductor memory device 10 according to the seventh embodiment. FIG. 23 illustrates an example of a waveform of the selected word line WL in the even-numbered block BLK in the case in which the even-numbered block BLK is selected, and an example of waveforms of control signals BLC and STB. In addition, in FIG. 23 a solid line and a broken line show waveforms corresponding to the "Near" side and "Far" side, respectively, for the waveform of the word line WL and for the waveform of the control signal BLC.

As illustrated in FIG. 23, the operation between time t0 and time t3 in the read operation in the seventh embodiment corresponds to the operation between time t1 and time t9 in the read operation in the first embodiment described with reference to FIG. 12. Specifically, the waveforms of the word line WL and control signal STB shown in FIG. 23 are like the waveforms of the word line WL and the control signal STB shown in FIG. 12. However, the waveform of the control signal BLC shown in FIG. 23 differs from the waveform of the control signal BLC shown in FIG. 12.

As illustrated in FIG. 23, at time t1, the row decoder module 12A lowers the voltage of the word line WL to a voltage AR. In addition, at time t1, the BLC drivers DR1 and DR2 raise the control signals BLC to, for example, a kick voltage Vblc+BLkick.

In addition, the BLC driver DR1 controls the control signal BLC1 according to the time variation of the voltage of the word line WL on the "Near" side. The BLC driver DR2 controls the control signal BLC2 according to the time variation of the voltage of the word line WL on the "Far" side. Specifically, the BLC driver DR1 lowers the voltage of the control signal BLC1 in a stepwise manner to associate the voltage of the control signal BLC1 with the waveform of the word line WL on the "Near" side. The BLC driver DB2 lowers the voltage of the control signal BLC2 in a stepwise manner to associate the voltage of the control signal BLC2 with the waveform of the word line WL on the "Far" side.

After the kick voltage is applied to the word line WL at time t2, the sequencer 17 executes the kick operation for the control signals BLC. For example, the BLC drivers DR1 and DR2 output control signals BLC of the kick voltage Vblc+ BLkick. Then, the BLC driver DR1 lowers the voltage of the control signal BLC1 in a stepwise manner to associate the voltage of the control signal BLC1 with the waveform of the word line WL on the "Near" side, and the BLC driver DR2 lowers the voltage of the control signal BLC2 in a stepwise manner to associate the voltage of the control signal BLC2 with the waveform of the word line WL on the "Far" side. Since the other operation of the read operation in the seventh embodiment is like the read operation of the first embodiment, a description thereof is omitted.

It should be noted that the number of steps of voltages which are applied when each of the above-described control signals BLC1 and BLC2 is raised or lowered is not limited to the number as illustrated, and can be set to discretionary numbers.

[7-3] Advantages Provided by the Seventh Embodiment

As described above, in the semiconductor memory device 10 according to the seventh embodiment, the sense amplifier module 13 is divided into two areas in the word line direction. The semiconductor memory device 10 includes the BLC driver DR1 corresponding to one of the two areas, and the BLC driver DR2 corresponding to the other area.

In addition, the semiconductor memory device 10 according to the seventh embodiment controls, in accordance with the block BLK selected in the kick operation, the BLC driver DR corresponding to the "Near" side and the BLC driver DR corresponding to the "Far" side to output different control signals BLC. Specifically, in the kick operation, the BLC driver DR corresponding to the "Near" side is controlled to output the control signal BLC associated with the time variation of the voltage of the word line WL on the "Near" side, and the BLC driver DR corresponding to the "Far" side is controlled to output the control signal BLC associated with the time variation of the voltage of the word line WL on the "Far" side.

Moreover, in the seventh embodiment, the BLC drivers DR apply a plurality of kinds of voltages in a stepwise manner in the time direction, in order to associate the variations in voltages of the control signal BLC with the time variation of the voltage of the word line WL in the kick operation. By applying the plural kinds of voltages in the time direction, the BLC drivers DR can form waveforms which are similar to, for example, waveforms on the "Near" side and "Far" side in the kick operation of the read operation described in the first embodiment. In other words, for example, the BLC driver DR1 can output the control signal BLC1 which is associated with the kick operation for the word line WL on the "Near" side, and the BLC driver DR2 can output the control signal BLC2 which is associated with the kick operation for the word line WL on the "Far" side.

Thereby, like the first embodiment, in the semiconductor memory device 10 according to the seventh embodiment, the time variation of the kick amount of the control signal BLC in the kick operation for the control signal BLC can be made closer to the time variation of the kick amount of the word line WL in the kick operation for the word line WL. Accordingly, like the first embodiment, in the semiconductor memory device 10 of the seventh embodiment, since it is possible to shorten the stabilization time of the bit line BL in the case in which the kick operation is executed for the word line WL, the speed of the read operation can be increased.

[8] Eighth Embodiment

A semiconductor memory device 10 according to an eighth embodiment has a configuration similar to that of the semiconductor memory device 10 according to the seventh embodiment. In the eighth embodiment, the control method of various control signals in the read operation is different from the read operation described in the seventh embodiment.

[8-1] Operation

FIG. 24 illustrates an example of waveforms in a read operation of the semiconductor memory device 10 according to the eighth embodiment. As illustrated in FIG. 24, the operation between time t0 and time t3 in the read operation in the eighth embodiment is different from the read operation according to the seventh embodiment described with reference to FIG. 23 with respect to the operation performed subsequently to time t2.

Specifically, as illustrated in FIG. 24, after the kick voltage is applied to the word line WL at time t2, the sequencer 17 executes the kick operation for control signals BLC, and the BLC driver DR1 outputs the control signal BLC at, for example, a kick voltage Vblc+BLkick. On the other hand, relying on the timing when the voltage of the word line WL on the "Far" side reaches the peak, the BLC driver DR2 raises the voltage of the control signal BLC in a stepwise manner to a voltage which is lower than the kick voltage Vblc+BLkick.

Then, the BLC driver DR1 lowers the voltage of the control signal BLC1 in a stepwise manner in accordance with the waveform of the word line WL on the "Near" side, and the BLC driver DR2 lowers the voltage of the control signal BLC2 in a stepwise manner in accordance with the waveform of the word line WL on the "Far" side. Since the other operation of the read operation in the eighth embodiment is like the read operation of the seventh embodiment, a description thereof is omitted.

[8-2] Advantages Provided by the Eighth Embodiment

The read operation in the above-described eighth embodiment differs from the read operation in the seventh embodiment with respect to the peak value of the voltage of the word line WL on the "Far" side in the kick operation. The voltage of the word line WL on the "Far" side in the kick operation is lower in the read operation in the eighth embodiment than in the read operation in the seventh embodiment.

Specifically, in the read operation in the seventh embodiment, the voltage of the word line WL on the "Far" side in the kick operation rises to a voltage close to the kick voltage CR+CGkick. In the read operation in the eighth embodiment, the voltage of the word line WL on the "Far" side in the kick operation rises to a voltage which is higher than the read voltage CR and is lower than the voltage of the word line WL on the "Far" side in the read operation in the seventh embodiment. This indicates that the RC delay amount of the selected word line WL is greater in the eighth embodiment than in the seventh embodiment.

On the other hand, in the eighth embodiment, the control signal BLC is set such that the variation of the voltage on the "Far" side in the inside of the sense amplifier section SA is associated with the variation of the voltage of the word line WL on the "Far" side. Specifically, in the read operation in the eighth embodiment, the peak value of the control signal BLC on the "Far" side in the kick operation is set to be lower than in the read operation in the seventh embodiment.

Thereby, in the semiconductor memory device 10 according to the eighth embodiment, when the RC delay amount of the word line WL is greater in the read operation in the eighth embodiment than in the read operation described in the seventh embodiment, the time variation of the kick amount of the control signal BLC in the kick operation for the control signal BLC can be made closer to the time variation of the kick amount of the word line WL in the kick operation for the word line WL. Accordingly, like the seventh embodiment, in the semiconductor memory device 10 according to the eighth embodiment, since it is possible to shorten the stabilization time of the bit line BL in the case in which the kick operation is executed for the word line WL, the speed of the read operation can be increased.

[9] Ninth Embodiment

A semiconductor memory device 10 according to a ninth embodiment has a configuration similar to the semiconductor memory device 10 according to the seventh embodiment. In the ninth embodiment, the control method of various control signals in the read operation is different from the read operations described in the seventh and eighth embodiments.

[9-1] Operation

Figure 25:
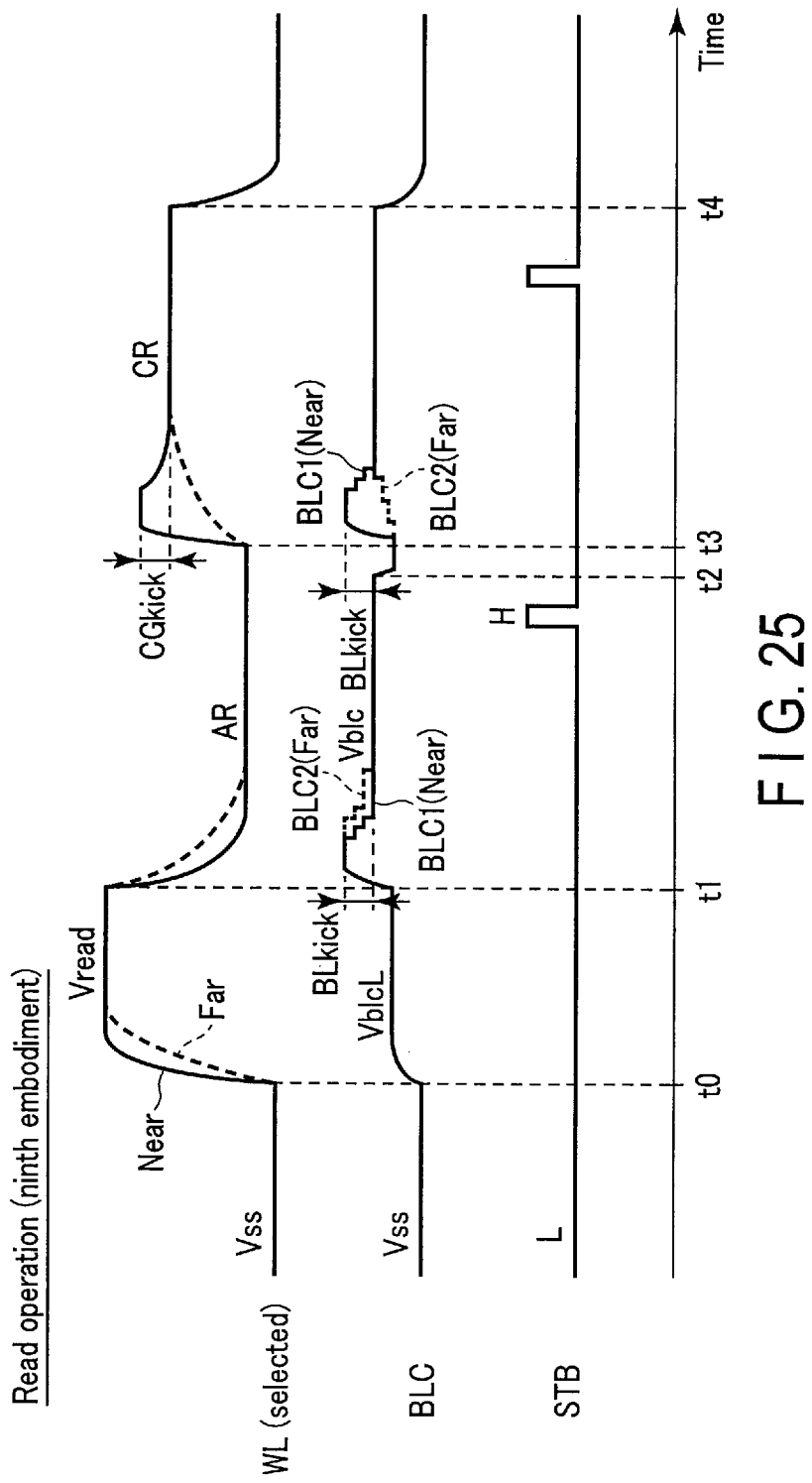
FIG. 25 illustrates an example of waveforms of signals in a read operation of a semiconductor memory device according to a ninth embodiment.

FIG. 25 illustrates an example of waveforms in a read operation of the semiconductor memory device 10 according to the ninth embodiment. As illustrated in FIG. 25, the operation between time t0 and time t3 in the read operation in the ninth embodiment is different from the read operation in the seventh embodiment described with reference to FIG. 23 with respect to the operation performed subsequently to time t2.

Specifically, as illustrated in FIG. 25, after the kick voltage is applied to the word line WL at time t3, the sequencer 17 executes the kick operation for control signals BLC, and the BLC driver DR1 outputs the control signal BLC1 at, for example, a kick voltage Vblc+BLkick, and lowers the voltage of the control signal BLC1 in a stepwise manner in accordance with the waveform of the word line WL on the "Near" side.

On the other hand, the BLC driver DR2 raises the voltage of the control signal BLC2 in a stepwise manner to the voltage Vblc in accordance with the waveform of the word line WL on the "Far" side. Since the other operation of the read operation in the ninth embodiment is like the read operation in the seventh embodiment, a description thereof is omitted.

[9-2] Advantages Provided by the Ninth Embodiment

The read operation in the above-described ninth embodiment differs from the read operations in the seventh and eighth embodiments with respect to the peak value of the voltage of the word line WL on the "Far" side in the kick operation. The voltage of the word line WL on the "Far" side in the kick operation is lower in the read operation in the ninth embodiment than in the read operation in the eighth embodiment.

Specifically, in the read operation in the ninth embodiment, the voltage of the word line WL on the "Far" side in the kick operation does not exceed the read voltage CR. This indicates that the RC delay amount of the selected word line WL is greater in the ninth embodiment than in the eighth embodiment.

On the other hand, in the ninth embodiment, the control signal BLC is set such that the variation of the voltage on the "Far" side in the inside of the sense amplifier section SA is associated with the variation of the voltage of the word line WL on the "Far" side. Specifically, in the read operation in the ninth embodiment, the peak value of the control signal BLC on the "Far" side in the kick operation is set to be lower than in the read operation in the eighth embodiment.

Thereby, in the semiconductor memory device 10 according to the ninth embodiment, when the RC delay amount of the word line WL is greater than in the read operation described in the eighth embodiment, the time variation of the kick amount of the control signal BLC in the kick operation for the control signal BLC can be made closer to the time variation of the kick amount of the word line WL in the kick operation for the word line WL. Accordingly, like the seventh and eighth embodiments, in the semiconductor memory device 10 of the ninth embodiment, since it is possible to shorten the stabilization time of the bit line BL in the case in which the kick operation is executed for the word line WL, the speed of the read operation can be increased.

[10] Tenth Embodiment

A semiconductor memory device 10 according to a tenth embodiment has a configuration similar to the semiconductor memory device 10 according to the first embodiment. The read operation of the tenth embodiment differs from the read operation described in the first embodiment with respect to the order of read voltages which are applied.

[10-1] Operation

FIG. 26 illustrates an example of waveforms in a read operation in the semiconductor memory device 10 according to the tenth embodiment. As illustrated in FIG. 26, the waveforms in the read operation in the tenth embodiment differ from those of the read operation in the first embodiment described with reference to FIG. 12 with respect to the waveform on the word line WL.

Specifically, as illustrated in FIG. 26, at time t1, the row decoder module 12A applies, for example, a read pass voltage Vread to the word line WL. Then, the row decoder module 12A starts lowering the voltage of the word line WL before time t2, and lowers the voltage of the word line WL to a voltage CR. Like the first embodiment, the rise and fall of the voltage of the word line WL on the "Near" side are earlier than the rise and fall of the voltage of the word line WL on the "Far" side.

At this time, for example, the sequencer 17 executes such control that the timing at which the voltage of the word line WL on the "Near" side falls to the voltage CR after time t3 coincides with the timing at which the control signal BLC on the "Near" side in the inside of the sense amplifier section SA falls to the voltage Vblc. The sequencer 17 also executes such control that the timing at which the voltage of the word line WL on the "Far" side falls to the voltage CR coincides with the timing at which the control signal BLC on the "Far" side in the inside of the sense amplifier section SA falls to the voltage Vblc.

Thereafter, when the sequencer 17 sets the control signal STB at the "H" level, the sense amplifier unit SAU determines whether the threshold voltage of the corresponding selected memory cell is the voltage CR or more, and stores the determination in the latch circuit in the sense amplifier unit SAU.

At time t5, the row decoder module 12A lowers the voltage of the word line WL from the read voltage CR to the read voltage AR. For example, the sequencer 17 executes such control that the timing at which the voltage of the word line WL on the "Near" side falls to the voltage AR after time t7 coincides with the timing at which the control signal BLC on the "Near" side in the inside of the sense amplifier section SA falls to the voltage Vblc. The sequencer 17 also executes such control that the timing at which the voltage on the "Far" side of the word line WL falls to the voltage AR coincides with the timing at which the control signal BLC on the "Far" side in the inside of the sense amplifier section SA falls to the voltage Vblc.

Thereafter, when the sequencer 17 sets the control signal STB at the "H" level, the sense amplifier unit SAU determines whether the threshold voltage of the corresponding selected memory cell is the voltage AR or more, and stores the determination in the latch circuit in the sense amplifier unit SAU.

Since the other operation of the semiconductor memory device 10 according to the tenth embodiment is like the operation of the semiconductor memory devices 10 according to the first embodiment described with reference to FIG. 12, a description thereof is omitted.

[10-2] Advantages Provided by the Tenth Embodiment

As described above, in contrast with the read operation in the first embodiment, in the read operation in the tenth embodiment, read is executed in the order from the higher read voltage. Even in this case, the semiconductor memory device 10 according to the tenth embodiment can provide the same advantages as the semiconductor memory devices 10 according to the first embodiment.

In addition, in the case of first executing the control to raise the voltage of the word line WL to the read pass voltage Vread in the read operation, only the control to lower, for example, the voltage of the word line WL in stages is needed in the read operation in the tenth embodiment.

Thereby, since the voltage of the word line WL can transition quickly, the speed of the read operation can be increased in the semiconductor memory device 10 according to the tenth embodiment. In addition, in the semiconductor memory device 10 according to the tenth embodiment, since the number of charge/discharge in the read operation is decreased, the consumption of current due to charge/discharge can be reduced.

[11] Eleventh Embodiment

A semiconductor memory device 10 according to an eleventh embodiment has a configuration similar to the semiconductor memory device 10 according to the first embodiment. The read operation in the eleventh embodiment differs from the read operation described in the tenth embodiment with respect to the control method of the voltage applied to the word line WL.

[11-1] Operation

FIG. 27 illustrates an example of waveforms in a read operation in the semiconductor memory device 10 according to the eleventh embodiment. As illustrated in FIG. 27, the waveforms in the read operation in the eleventh embodiment differ from those in the read operation in the tenth embodiment described with reference to FIG. 26 with respect to the waveform of the word line WL.

Specifically, as illustrated in FIG. 27, at time t1, the row decoder module 12A applies, for example, a read pass voltage Vread to the word line WL. Then, the sequencer 17 executes a kick operation at a time of lowering the voltage of the word line WL from the read pass voltage Vread to the voltage CR.

The kick operation for the word line WL in the eleventh embodiment is controlled in a direction to decrease the voltage. Specifically, for example, at time t3, the row decoder module 12A temporarily applies a kick voltage CR-CGkick to the selected word line WL. The kick amount CGkick for the word line WL can be set at a discretionary value, and the timing of applying the kick voltage may be before or after the time t3. Thereafter, the row decoder module 12A applies the read voltage CR to the word line WL.

At this time, the sequencer 17 executes, for example, such control that the timing at which the voltage of the word line WL on the "Near" side rises to the voltage CR coincides with the timing at which the voltage of the word line WL on the "Far" side falls to the voltage CR.

Similarly, at time t5, the row decoder module 12A applies the kick operation at a time of lowering the voltage of the word line WL from the read voltage CR to the read voltage AR. Specifically, for example, at time t7, the row decoder module 12A temporarily applies a kick voltage AR-CGkick to the selected word line WL. The timing of applying the kick voltage may be before or after the time t7. Thereafter, the row decoder module 12A applies the read voltage AR to the word line WL.

Since the other operation in the read operation of the semiconductor memory device 10 according to the eleventh embodiment is like the read operation of the semiconductor memory devices 10 according to the tenth embodiment described with reference to FIG. 26, a description thereof is omitted.

[11-2] Advantages Provided by the Eleventh Embodiment

As described above, in the read operation in the eleventh embodiment, the kick operation for the word line WL is added to the read operation in the tenth embodiment. Even in this case, the semiconductor memory device 10 according to the eleventh embodiment can provide the same advantages as the semiconductor memory devices 10 according to the tenth embodiment.

Furthermore, in the read operation in the eleventh embodiment, the kick operation for the word line WL is executed. Thus, the time that is needed for the voltage of the word line WL on the "Far" side to reach a desired read voltage becomes shorter than in the read operation in the tenth embodiment. Therefore, in the semiconductor memory device 10 according to the eleventh embodiment, the speed of the read operation can be made higher than in the semiconductor memory device 10 according to the tenth embodiment.

[12] Twelfth Embodiment

A semiconductor memory device 10 according to a twelfth embodiment has a configuration similar to the semiconductor memory device 10 according to the first embodiment. The read operation of the twelfth embodiment differs from the read operation described in the eleventh embodiment with respect to the control method of the control signal BLC.

[12-1] Operation

Figure 28:
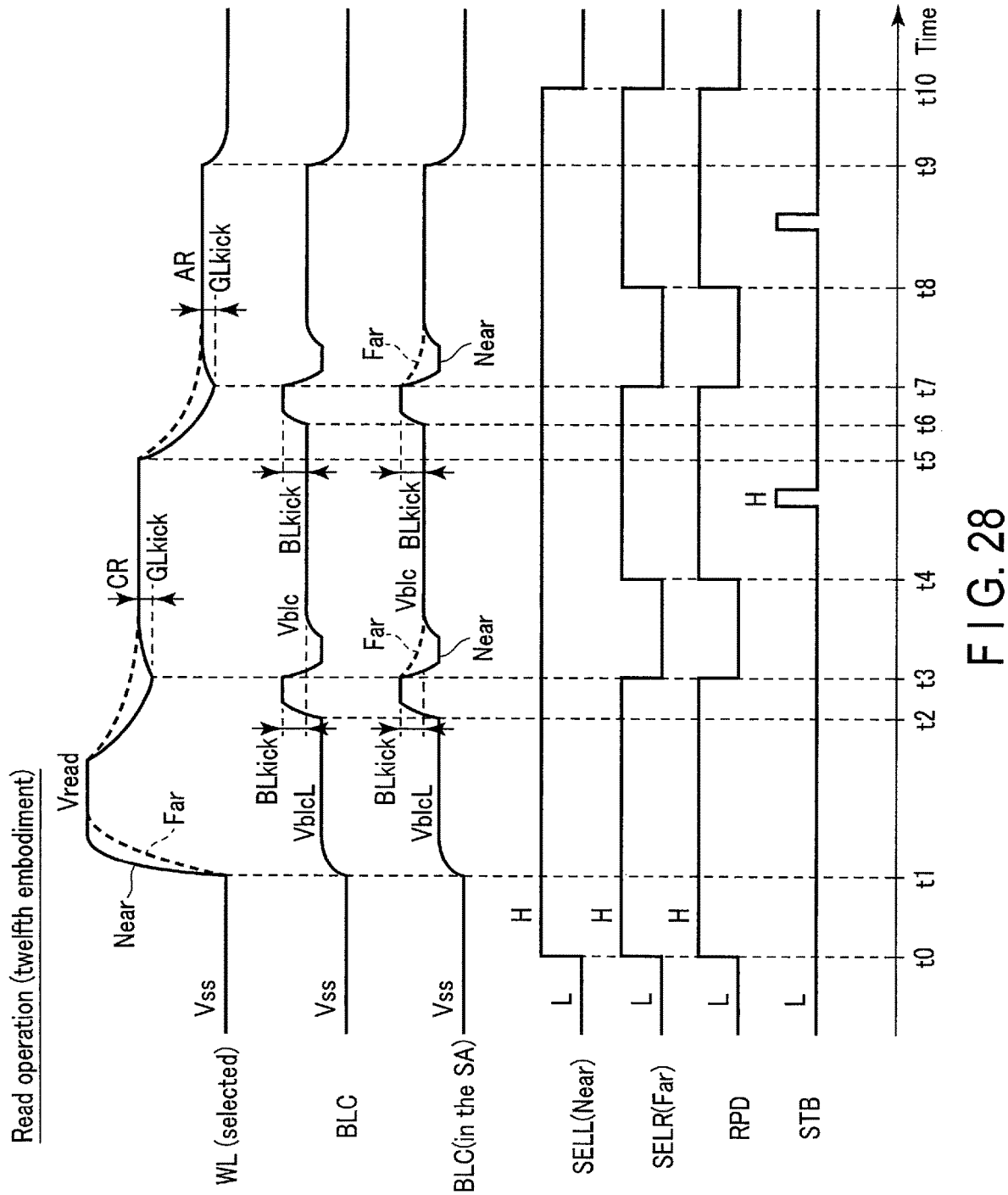
FIG. 28 illustrates an example of waveforms of signals in a read operation of a semiconductor memory device according to a twelfth embodiment.

FIG. 28 illustrates an example of waveforms in a read operation in the semiconductor memory device 10 according to the twelfth embodiment. As illustrated in FIG. 28, the waveforms in the read operation in the twelfth embodiment differ from those in the read operation in the eleventh embodiment described with reference to FIG. 27 with respect to the waveform of the control signal BLC.

In the read operation in the twelfth embodiment, the sequencer 17 executes a kick operation for the control signal BLC, for example, at time t2, and further executes a kick operation in a direction to decrease the voltage at time t3. In other words, the sequencer 17 once executes the kick operation in the positive direction for the entirety of the control signal BLC, and then executes the kick operation for the control signal BLC in a direction to lower the voltage on the Near side below a target voltage (negative direction), and thereafter applies the target voltage.

Specifically, as illustrated in FIG. 28, at time t2, the BLC driver DR outputs the control signal BLC at, for example, a kick voltage Vblc+BLkick. Subsequently, at time t3, the BLC driver DR temporarily lowers the control signal BLC to a voltage which is lower than the voltage Vblc, and then raises the control signal BLC to the voltage Vblc.

At this time, the sequencer 17 executes, for example, such control that the timing at which the voltage of the word line WL on the "Near" side rises to the voltage CR coincides with the timing at which the control signal BLC for which the kick operation is executed after time t3 rises to the voltage Vblc.

Similarly, at time t6, the BLC driver DR outputs the control signal BLC at, for example, a kick voltage Vblc+BLkick. Subsequently, at time t7, the BLC driver DR temporarily lowers the control signal BLC to a voltage which is lower than the voltage Vblc, and then raises the control signal BLC to the voltage Vblc.

Since the other operation in the read operation of the semiconductor memory device 10 according to the twelfth embodiment is like the read operation of the semiconductor memory devices 10 according to the eleventh embodiment described with reference to FIG. 27, a description thereof is omitted.

[12-2] Advantages Provided by the Twelfth Embodiment

As described above, in contrast with the read operation in the eleventh embodiment, in the read operation in the twelfth embodiment, for the control signal BLC, the kick operation in the negative direction is added after the kick operation in the positive direction. Even in this case, the semiconductor memory device 10 according to the twelfth embodiment can provide the same advantages as the semiconductor memory devices 10 according to the eleventh embodiment.

In addition, in read operation in the twelfth embodiment, the kick operation in the negative direction is executed for the control signal BLC on the "Near" side. Thus, with respect to both the word line WL and the control signal BLC, the voltage transition direction immediately before reaching the target voltage is the direction of rising of voltage on the "Near" side, and the direction of falling of voltage on the "Far" side.

Thereby, in the semiconductor memory device 10 according to the twelfth embodiment, the variation in the voltage of the word line WL and the variation in the voltage of the control signal BLC can be made close more precisely than in the eleventh embodiment. Therefore, the reliability of the read operation can be more enhanced than in the eleventh embodiment.

[13] Thirteenth Embodiment

In a semiconductor memory device 10 according to a thirteenth embodiment, all the blocks BLK in the semiconductor memory device 10 of the first embodiment are driven from both sides. Hereinafter, different points from the semiconductor memory device 10 according to the first embodiment will be described with respect to the semiconductor memory device 10 according to the thirteenth embodiment.

[13-1] Configuration

Figure 29:
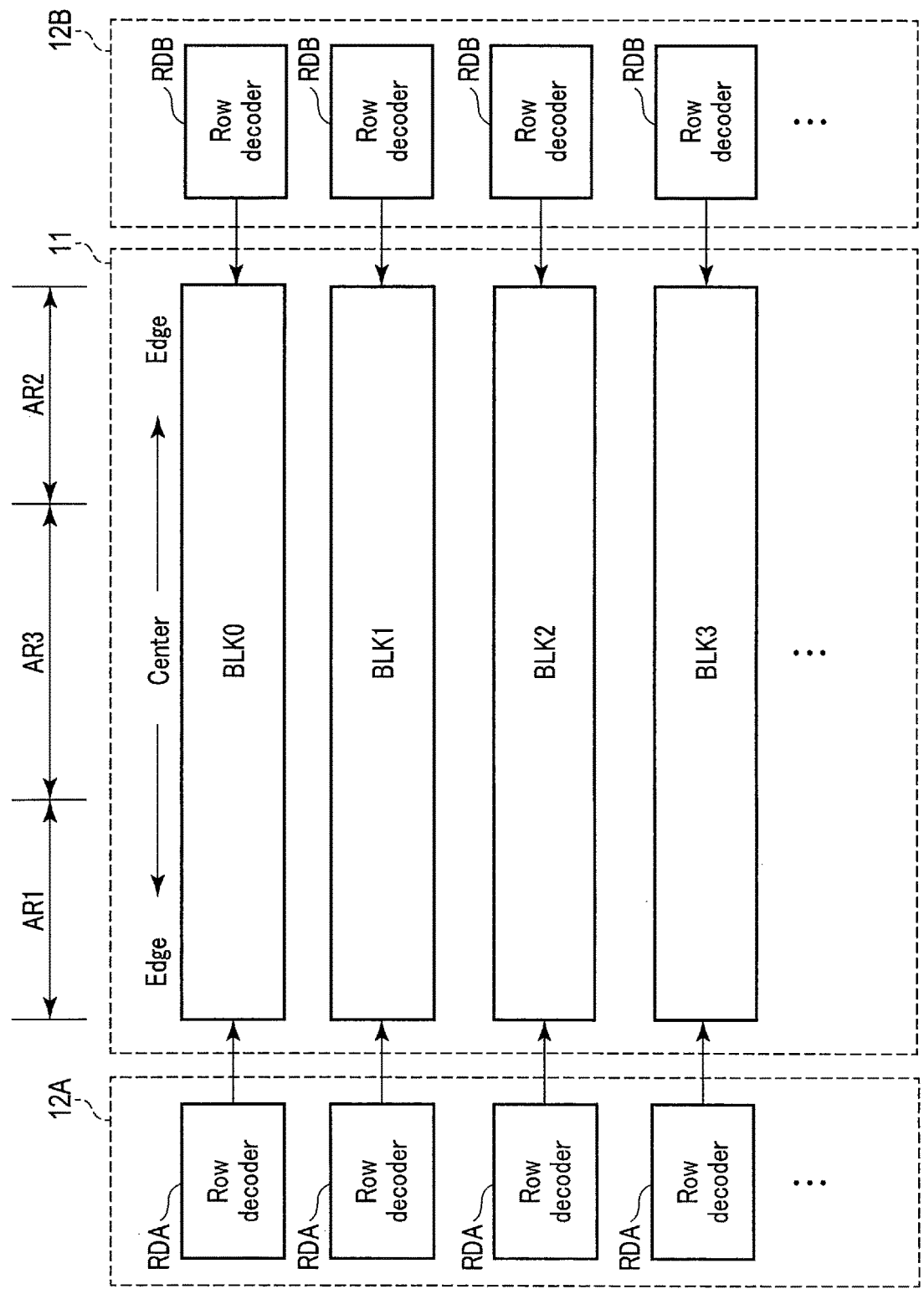
FIG. 29 is a block diagram illustrating a detailed configuration example of a row decoder module included in a semiconductor memory device according to a thirteenth embodiment.

FIG. 29 is a block diagram illustrating an example of a configuration of a memory cell array 11 and row decoder modules 12 included in the semiconductor memory device 10 according to the thirteenth embodiment. The configuration of the row decoder modules 12A and 12B are different from the configuration described in the first embodiment with reference to FIG. 4.

Specifically, as illustrated in FIG. 29, the row decoder module 12A in the thirteenth embodiment includes row decoders RDA corresponding to blocks BLK0 to BLKn, and the row decoder module 12B includes row decoders RDB corresponding to the blocks BLK0 to BLKn. Specifically, in the thirteenth embodiment, each block BLK is driven by the row decoder modules 12A and 12B from both sides of the block BLK. For example, the row decoder RDA supplies a voltage from one end portion of the conductor 42 corresponding to the word line WL, and the row decoder RDB supplies a voltage from the other end portion of the conductor 42.

In addition, as illustrated in FIG. 29, an area AR3 is defined between the areas AR1 and AR2 in the memory cell array 11 according to the thirteenth embodiment. The area AR3 is provided, for example, in which the distance from the row decoder RDA in an even-numbered block BLK is equivalent to the distance from the row decoder RDB in an odd-numbered block BLK. Specifically, the position of the area AR3 in each block BLK is defined, for example, such that the middle position between the "Near" and the "Far" is included with respect to the distance from the corresponding row decoder RD.

In the description below, areas near the row decoders RDA and RDB in each block BLK are referred to as "Edge", and an area including a central portion of the block BLK is referred to as "Center". Specifically, the areas AR1 and AR2 may correspond to "Edge" portions, and the area AR3 may correspond to a "Center" portion.

It should be noted that the plural sense amplifier groups SAG included in the sense amplifier module 13 include sense amplifier groups SAG corresponding to bit lines BL connected to memory cells provided in the area AR1; sense amplifier groups SAG corresponding to bit lines BL connected to memory cells provided in the area AR2; and sense amplifier groups SAG corresponding to bit lines BL connected to memory cells provided in the area AR3.

For example, in the read operation, the sense amplifier units SAU corresponding to the areas AR1 and AR2 read the data stored in the memory cells provided in the "Edge" portions of a selected block, and the sense amplifier units SAU corresponding to the areas AR3 read the data stored in the memory cells provided in the "Center" portion of the selected block.

Since the other configuration of the semiconductor memory device 10 according to the thirteenth embodiment is similar to the configuration of the semiconductor memory device 10 according to the first embodiment, a description thereof is omitted.

[13-2] Operation

Figure 30:
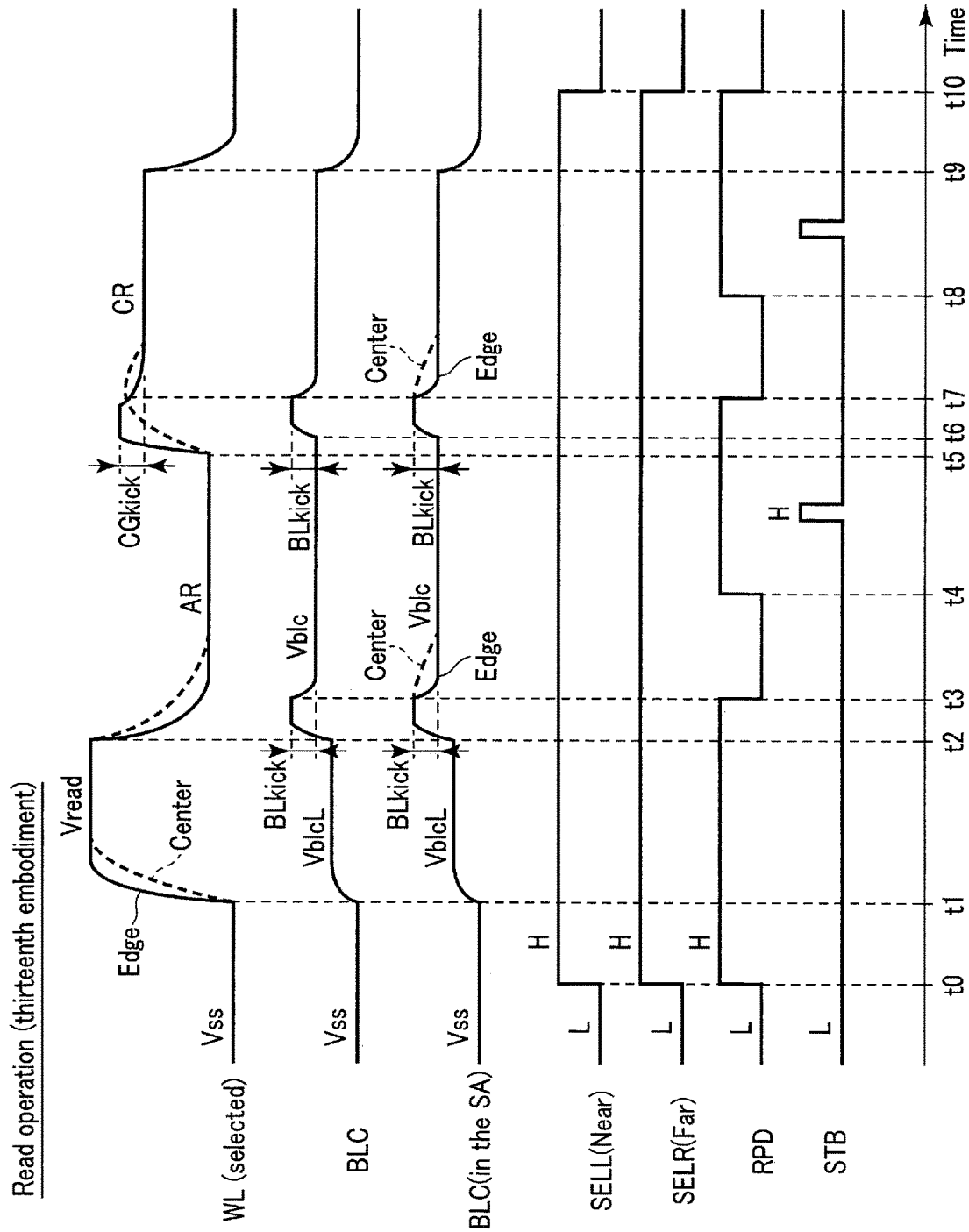
FIG. 30 illustrates an example of waveforms of signals in a read operation of the semiconductor memory device according to the thirteenth embodiment.

FIG. 30 illustrates an example of waveforms in a read operation in the semiconductor memory device 10 according to the thirteenth embodiment. The waveforms on the word line WL on the "Edge" and the "Center" in FIG. 30 correspond to the waveforms on the word line WL on the "Near" and the "Far" in FIG. 12. The waveforms of the control signal BLC on the "Edge" and the "Center" in FIG. 30 correspond to the waveforms of the control signal BLC on the "Near" and the "Far" in FIG. 12.

In addition, in the read operation in the thirteenth embodiment, the sequencer 17 fixes the control signals SELL and SELR at the "H" level from time t0 to time t10. Specifically, in the thirteenth embodiment, the sequencer 17 executes the kick operations for the word line WL and the control signal BLC, regardless of the address of the selected block BLK.

Since the other operation in the read operation of the semiconductor memory device 10 according to the thirteenth embodiment is like the read operation of the semiconductor memory devices 10 according to the first embodiment described with reference to FIG. 12, a description thereof is omitted.

[13-3] Advantages Provided by the Thirteenth Embodiment

As described above, the semiconductor memory device 10 according to the thirteenth embodiment has the configuration in which the word line WL is driven from both sides of the block BLK. In the case of this configuration in which the word line WL is driven from both sides, the time variation of the voltage of the word line WL becomes quicker than in the case of driving the word line WL from one side as in the first embodiment. In addition, in the case of the configuration in which the word line WL is driven from both sides, the time variation of the voltage in the "Center" portion which is distant from the row decoder RD is delayed from the time variation of the voltage in the "Edge" portion which is near the row decoder RD.

Thus, in the semiconductor memory device 10 according to the thirteenth embodiment, the kick operations as described in the first embodiment are also executed for the word line WL and the control signal BLC, and the corresponding control is executed for the control signals SELL and SELR. Specifically, in the read operation, both the control signals SELL and SELR are set at the "H" level and thus, both the transistors TL and TR are set in the ON state. Thereby, the control signal BLC is driven from both sides.

Thereby, in the semiconductor memory device 10 according to the thirteenth embodiment, the time variation of the voltage of the word line WL in the "Edge" portion can be made closer to the time variation of the voltage of the control signal BLC corresponding to the "Edge" portion. In addition, the time variation of the voltage of the word line WL in the "Center" portion can be made closer to the time variation of the voltage of the control signal BLC corresponding to the "Center" portion. Accordingly, like the first embodiment, in the semiconductor memory device 10 of the thirteenth embodiment, since it is possible to shorten the stabilization time of the bit line BL in the case in which the kick operation is executed for the word line WL, the speed of the read operation can be increased.

[14] Fourteenth Embodiment

A semiconductor memory device 10 according to a fourteenth embodiment has a configuration similar to the semiconductor memory devices 10 according to the first embodiment. In the read operation in the fourteenth Embodiment, for example, the read operations described in the first to third embodiments are selectively used.

[14-1] Operation

There is a case in which the RC delay amounts of the word lines WL are different depending on the layers in which the conductors 42 corresponding to the word lines WL are provided, for example, as illustrated in FIG. 8. In this case, for example, the RC delay mounts may be different between a group of word lines WL provided in upper layers, a group of word lines WL provided in middle layers, and a group of word lines WL provided in lower layers.

In the semiconductor memory device 10 according to the fourteenth embodiment, for example, the plural word lines WL are classified into groups, such as first to third groups, in the order from a small RC delay amount to larger RC delay amounts. The classification of the word lines WL into groups is not limited to this. For example, the width of the contact area between a word line WL and a semiconductor pillar MH may be taken into account.

According to the group corresponding to the selected word line WL, the semiconductor memory device 10 according to the fourteenth embodiment changes the read operation to be executed. In the description below, the read operations described in the first to third embodiments are referred to "first read operation", "second read operation" and "third read operation", respectively.

Figure 31:
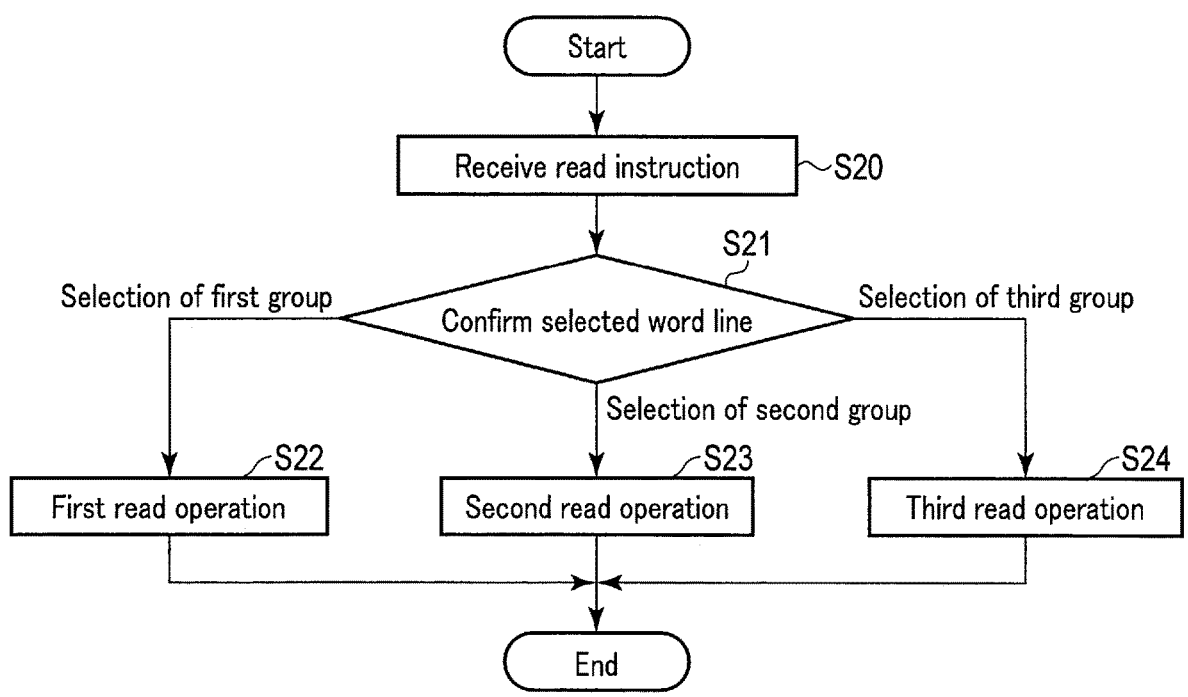
FIG. 31 is a flowchart illustrating an example of a read operation of a semiconductor memory device according to a fourteenth embodiment.

FIG. 31 illustrates an example of a flowchart of a read operation of the semiconductor memory device 10 according to the fourteenth embodiment. As illustrated in FIG. 31, to start with, the semiconductor memory device 10 receives a read instruction from the external controller (step S20). Specifically, the semiconductor memory device 10 stores command and address information received from the controller in the command register 15C and the address register 15B, respectively.

Next, based on the stored address information ADD, the sequencer 17 checks the address of a selected word line WL, and determines which of the groups the selected word line WL is included in (step S21). Then, the sequencer 17 executes the first read operation if the word line WL of the first group is selected (step S22), executes the second read operation if the word line WL of the second group is selected (step S23), and executes the third read operation if the word line WL of the third group is selected (step S24).

Since the other operation in the read operation of the semiconductor memory device 10 according to the fourteenth embodiment is like the read operations described in the first to third embodiments, a description thereof is omitted. In the above description, the plural word lines WL are classified into three groups, but the grouping is not limited to this. For example, the word lines WL may be more finely grouped.

[14-2] Advantages Provided by the Fourteenth Embodiment

In the semiconductor memory device 10, there is a case in which the RC delay amounts of the word lines WL vary, for example, in accordance with the positions of the layers in which the word lines WL are formed. Thus, in the semiconductor memory device 10 according to the fourteenth embodiment, the word lines WL are classified into groups depending on the RC delay amounts of the word lines WL, and the read operations are changed for each of the groups.

In addition, in accordance with the group of the selected word line WL, the semiconductor memory device 10 according to the fourteenth embodiment selectively uses the read operations in the first to third embodiments described with reference to, for example, FIG. 12, FIG. 13 and FIG. 14. In this case, the read operation in the first embodiment is optimized for the first group such that the waveform of the control signal BLC on the "Far" side is associated with the waveform of the word line WL on the "Far" side. The read operation in the second embodiment is optimized for the second group such that the waveform of the control signal BLC on the "Far" side is associated with the waveform of the word line WL on the "Far" side. The read operation in the third embodiment is optimized for the third group such that the waveform of the control signal BLC on the "Far" side is associated with the waveform of the word line WL on the "Far" side.

Thereby, even when there are differences in characteristics of the word lines WL, the semiconductor memory device 10 according to the fourteenth embodiment, in the kick operation, can precisely associate the waveform of the control signal BLC with the waveform on the word line WL. Accordingly, in the semiconductor memory device 10 of the fourteenth embodiment, no matter which of the word lines WL in the block BLK is selected, it is possible to shorten the stabilization time of the bit line BL in the case in which the kick operation is executed for the word line WL, and therefore the speed of the read operation can be increased in the entirety of the block BLK.

In the above description, by way of example, the case is described in which the semiconductor memory device 10 selectively uses the read operations in the first to third embodiments. However, the operation of the semiconductor memory device 10 is not limited to this. For example, the semiconductor memory device 10 may use any one of the read operations in the first to third embodiments, or may use two or more of the read operations.

Further, the semiconductor memory device 10 of the fourteenth embodiment may use the read operations described in the other embodiments. For example, for the read operations in the fourteenth embodiment, the read operations described in the tenth to twelfth embodiments may be used. Moreover, the semiconductor memory device 10 according to the fourteenth embodiment may use the read operations in the respective embodiments to which different kick amounts are applied.

Additionally, the semiconductor memory device 10 may include both the configuration of driving the word line WL from one side as in the first embodiment and the configuration of driving the word line WL from both sides as in the thirteenth embodiment. For example, there is a case where in the semiconductor memory device 10, the lower-layer word lines WL are driven from both sides as illustrated in FIG. 29, and the upper-layer word lines WL are driven from one side as illustrated in FIG. 4. In this case, the semiconductor memory device 10 according to the fourteenth embodiment may further use, in the selective use of the read operations, the read operation of the thirteenth embodiment described with reference to FIG. 30.

[15] Fifteenth Embodiment

A semiconductor memory device 10 according to a fifteenth embodiment has a configuration similar to the semiconductor memory devices 10 according to the seventh embodiment. In the read operation in the fifteenth Embodiment, for example, the read operations described in the seventh to ninth embodiments are selectively used.

[15-1] Operation

In the semiconductor memory device 10 according to the fifteenth embodiment, like the fourteenth embodiment, for example, the plural word lines WL are classified into first to third groups in the order from a small RC delay amount to larger RC delay amounts. In addition, depending on the group corresponding to the selected word line WL, the semiconductor memory device 10 according to the fifteenth embodiment changes the read operation to be executed. In the description below, the read operations described in the seventh to ninth embodiments are referred to as "fourth read operation", "fifth read operation" and "sixth read operation", respectively.

FIG. 32 illustrates an example of a flowchart of a read operation of the semiconductor memory device 10 according to the fifteenth embodiment. As illustrated in FIG. 32, to start with, the semiconductor memory device 10 receives a read instruction from the external controller (step S20).

Next, based on the stored address information ADD, the sequencer 17 checks the address of a selected word line WL, and determines which of the groups the selected word line WL is included in (step S21). Then, the sequencer 17 executes the fourth read operation if the word line WL of the first group is selected (step S25), executes the fifth read operation if the word line WL of the second group is selected (step S26), and executes the sixth read operation if the word line WL of the third group is selected (step S27).

Since the other operation in the read operation of the semiconductor memory device 10 according to the fifteenth embodiment is like the read operations described in the seventh to ninth embodiments, a description thereof is omitted. It should be noted that, in the above description, the plural word lines WL are divided into three groups, but the grouping is not limited to this. For example, the word lines WL may be more finely grouped.

[15-2] Advantages Provided by the Fifteenth Embodiment

In the semiconductor memory device 10 according to the fifteenth embodiment, like the fourteenth embodiment, the word lines WL are classified into groups, depending on the RC delay amounts of the word lines WL, and the read operations are changed for each of the groups.

In addition, depending on the group of the selected word line WL, the semiconductor memory device 10 according to the fifteenth embodiment selectively uses the read operations in the seventh to ninth embodiments described with reference to, for example, FIG. 23, FIG. 24 and FIG. 25. In this case, the read operation in the seventh embodiment is optimized for the first group such that the waveform of the control signal BLC on the "Far" side is associated with the waveform of the word line WL on the "Far" side. The read operation in the eighth embodiment is optimized for the second group such that the waveform of the control signal BLC on the "Far" side is associated with the waveform of the word line WL on the "Far" side. The read operation in the ninth embodiment is optimized for the third group such that the waveform of the control signal BLC on the "Far" side is associated with the waveform of the word line WL on the "Far" side.

Thereby, even when there are differences in characteristics of the word lines WL, the semiconductor memory device 10 according to the fifteenth embodiment, in the kick operation, can precisely associate the waveform of the control signal BLC with the waveform of the word line WL. Accordingly, in the semiconductor memory device 10 of the fifteenth embodiment, no matter which of the word lines WL in the block BLK is selected, it is possible to shorten the stabilization time of the bit line BL in the case in which the kick operation is executed for the word line WL, and therefore the speed of the read operation can be increased in the entirety of the block BLK.

In the above description, by way of example, the case is described in which the semiconductor memory device 10 selectively uses the read operations in the seventh to ninth embodiments. However, the operation of the semiconductor memory device 10 is not limited to this. For example, the semiconductor memory device 10 may use any one of the read operations in the seventh to ninth embodiments, or may use two or more of the read operations. It should be noted that the semiconductor memory device 10 according to the fifteenth embodiment may use the read operations in the respective embodiments to which different kick amounts are applied.

[16] Sixteenth Embodiment

A semiconductor memory device 10 according to a sixteenth embodiment has a configuration similar to the semiconductor memory device 10 according to the seventh embodiment. In the sixteenth embodiment, the control signal BLC in the read operation described in the tenth embodiment is controlled in a stepwise manner as described in the seventh embodiment.

[16-1] Operation

Figure 33:
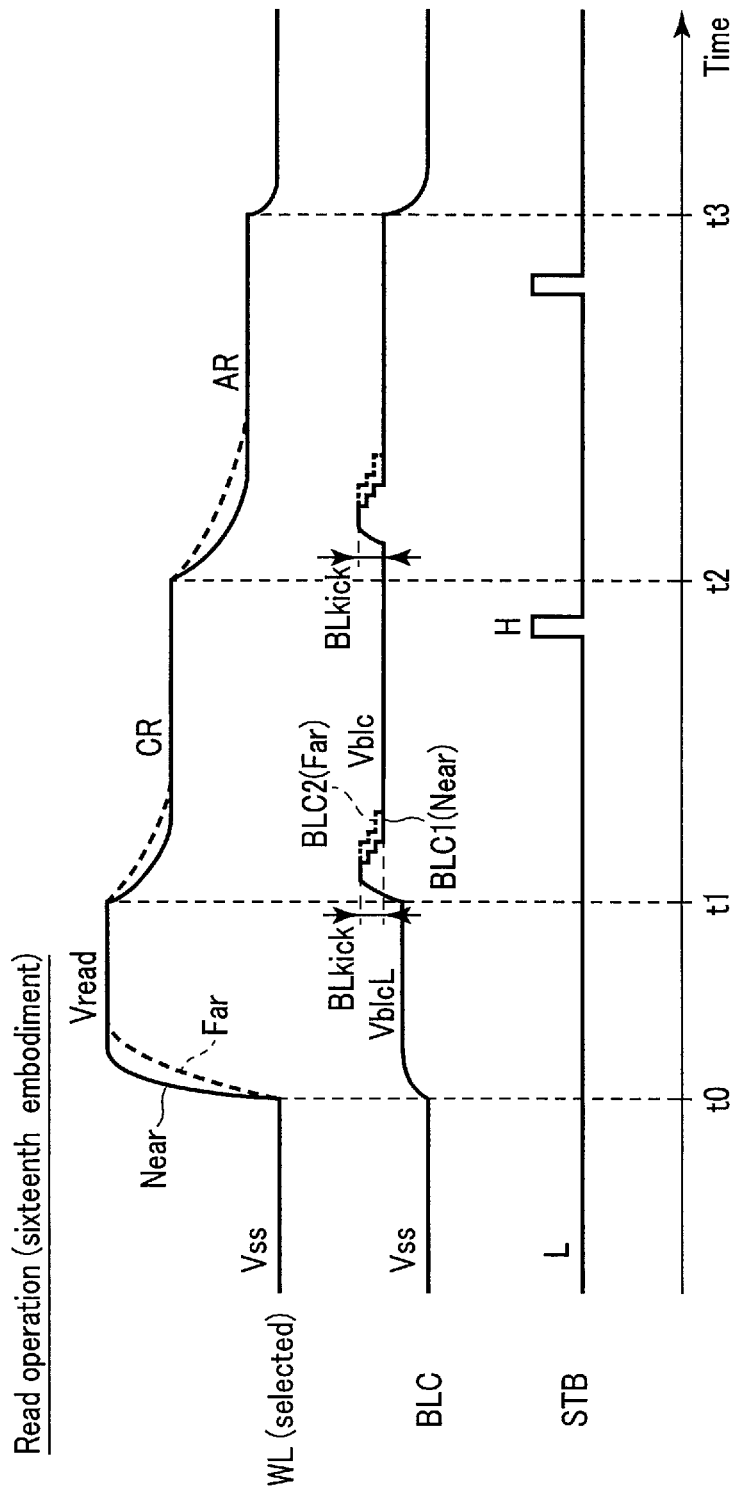
FIG. 33 illustrates an example of waveforms of signals in a read operation of a semiconductor memory device according to a sixteenth embodiment.

FIG. 33 illustrates an example of waveforms in the read operation of the semiconductor memory device 10 according to the sixteenth embodiment. FIG. 33 illustrates an example of a waveform of the selected word line WL in the even-numbered block BLK in the case in which the even-numbered block BLK is selected, and an example of waveforms of the control signals BLC and STB. In addition, FIG. 33 shows, by a solid line and a broken line, waveforms corresponding to the "Near" side and "Far" side, respectively, for the waveform of the word line WL and for the waveform of the control signal BLC.

As illustrated in FIG. 33, the operation between time t0 and time t3 in the read operation in the sixteenth embodiment corresponds to the operation between time t1 and time t9 in the read operation in the tenth embodiment described with reference to FIG. 26. Specifically, the waveforms of the word line WL and the control signal STB shown in FIG. 33 are like the waveforms of the word line WL and the control signal STB shown in FIG. 26. The waveform of the control signal BLC shown in FIG. 33 differs from the waveform of the control signal BLC shown in FIG. 26.

To be more specific, at time t1, the row decoder module 12A lowers the voltage of the word line WL to a voltage CR. In addition, at time t1, the BLC drivers DR1 and DR2 raise the control signals BLC to, for example, a kick voltage Vblc+BLkick.

In addition, the BLC driver DR1 lowers the voltage of the control signal BLC1 in a stepwise manner in association with the waveform of the word line WL on the "Near" side. The BLC driver DR2 lowers the voltage of the control signal BLC2 in a stepwise manner in association with the waveform of the word line WL on the "Far" side.

At time t2, the row decoder module 12A lowers the voltage of the word line WL to a voltage AR. Then, the sequencer 17 executes the kick operation for the control signals BLC, and the BLC drivers DR1 and DR2 output control signals BLC at, for example, the kick voltage Vblc+BLkick. Thereafter, the BLC driver DR1 lowers the voltage of the control signal BLC1 in a stepwise manner in association with the waveform of the word line WL on the "Near" side, and the BLC driver DR2 lowers the voltage of the control signal BLC2 in a stepwise manner in association with the waveform of the word line WL on the "Far" side. Since the other operation of the read operation in the sixteenth embodiment is like the read operation in the tenth embodiment, a description thereof is omitted.

It should be noted that the number of voltages which are applied stepwise when each of the above-described control signals BLC1 and BLC2 is raised or lowered is not limited to the number as illustrated, and can be set to discretionary numbers.

[16-2] Advantages Provided by the Sixteenth Embodiment

As described above, in the semiconductor memory device 10 according to the sixteenth embodiment, like the seventh embodiment, the sense amplifier module 13 is divided into two areas in the word line direction. The semiconductor memory device 10 includes the BLC driver DR1 corresponding to one of the two areas, and the BLC driver DR2 corresponding to the other of the two areas.

In addition, like the seventh embodiment, the semiconductor memory device 10 according to the sixteenth embodiment applies a plurality of kinds of voltages in a stepwise manner for the control signal BLC in the kick operation. At this time, the BLC driver is controlled to generate the control signal BLC corresponding to the "Near" side the voltage variation of which is associated with the voltage variation of the control signal BLC corresponding to the "Near" side as described in the seventh embodiment. In addition, the BLC driver is also controlled to generate the control signal BLC corresponding to the "Far" side the voltage variation of which is associated with the voltage variation of the control signal BLC corresponding to the "Far" side as described in the seventh embodiment.

Thereby, like the seventh embodiment, in the semiconductor memory device 10 according to the sixteenth embodiment, the time variation of the kick amount of the control signal BLC in the kick operation for the control signal BLC can be made closer to the time variation of the kick amount of the word line WL in the kick operation for the word line WL. Accordingly, like the seventh embodiment, in the semiconductor memory device 10 according to the sixteenth embodiment, since it is possible to shorten the stabilization time of the bit line BL in the case in which the kick operation is executed for the word line WL, the speed of the read operation can be increased.

[17] Seventeenth Embodiment

A semiconductor memory device 10 according to a seventeenth embodiment has a configuration similar to the semiconductor memory device 10 according to the seventh embodiment. In the seventeenth embodiment, the control method of the voltage applied to the word line WL is different from the read operation described in the sixteenth embodiment.

[17-1] Operation

Figure 34:
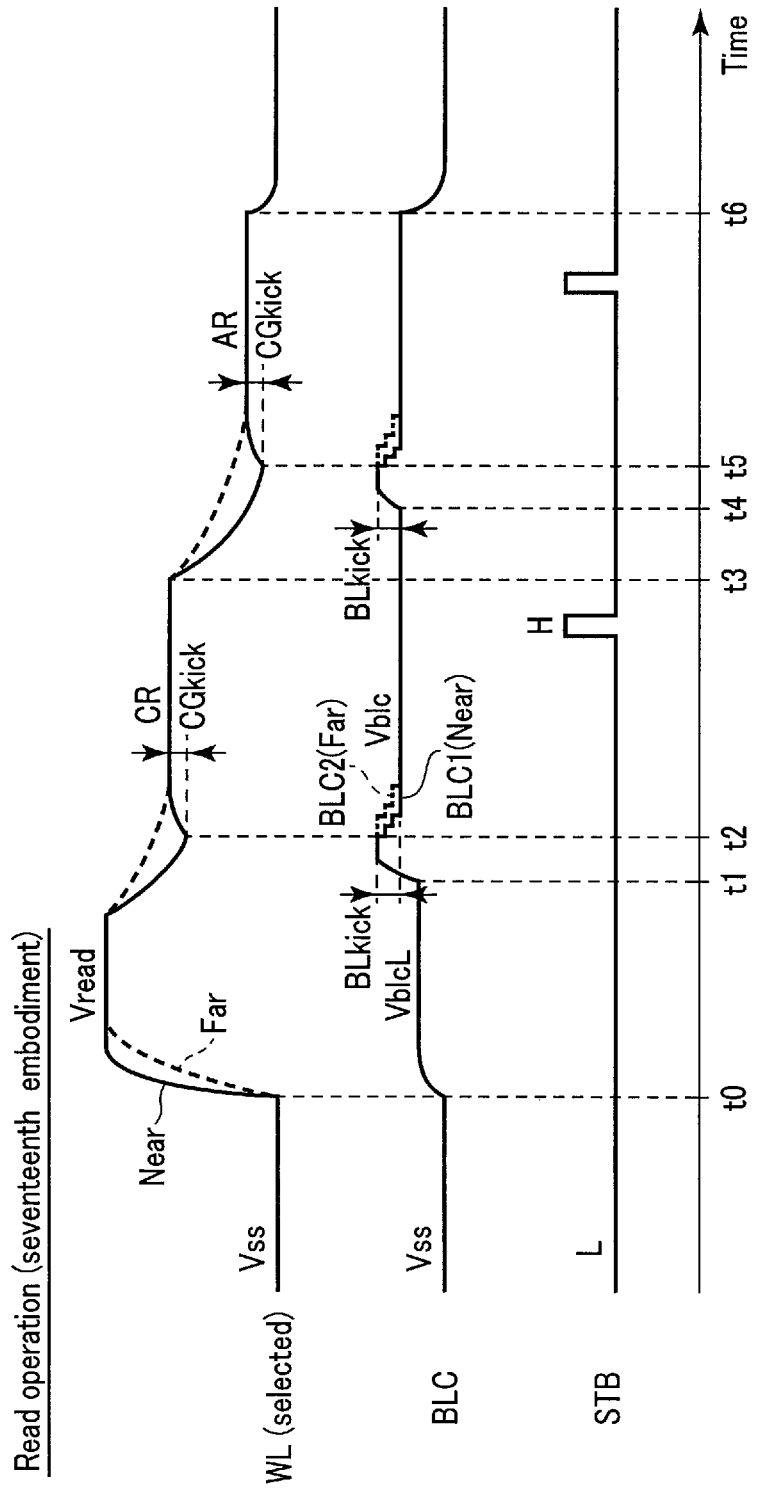
FIG. 34 illustrates an example of waveforms of signals in a read operation of a semiconductor memory device according to a seventeenth embodiment.

FIG. 34 illustrates an example of waveforms in the read operation in the semiconductor memory device 10 according to the seventeenth embodiment. FIG. 34 illustrates an example of a waveform of the selected word line WL in the even-numbered block BLK and an example of waveforms of control signals BLC and STB in a case in which the even-numbered block BLK is selected.

As illustrated in FIG. 34, the read operation in the seventeenth embodiment differs from the read operation in the sixteenth embodiment described with reference to FIG. 33, with respect to the waveform on the word line WL and the control timing of the control signal BL.

Specifically, at time t0, the row decoder module 12A applies, for example, a read pass voltage Vread to the word line WL. Then, at a time of lowering the voltage of the word line WL from the read pass voltage Vread to the voltage CR, the sequencer 17 executes a kick operation for the control signal BLC and a kick operation for the word line WL.

For example, at time t1, the sequencer 17 executes the kick operation for the control signals BLC, and the BLC drivers DR1 and DR2 output control signals BLC1 and BLC2 at, for example, the kick voltage Vblc+BLkick, respectively.

At time t2, the row decoder module 12A temporarily applies a kick voltage CR-CGkick to the selected word line WL, and then applies a read voltage CR. In addition, at time t2, the sequencer 17 lowers the voltages of the control signals BLC1 and BLC2 in a stepwise manner, respectively, associated with the waveforms of the word line WL on the "Near" side and the "Far" side.

Similarly, at time t3, when lowering the voltage of the word line WL from the read voltage CR to the voltage AR, the sequencer 17 executes a kick operation for the control signal BLC and a kick operation for the word line WL.

Specifically, at time t4, the sequencer 17 executes the kick operation for the control signals BLC, and the BLC drivers DR1 and DR2 output the control signals BLC1 and BLC2 at, for example, the kick voltage Vblc+BLkick, respectively.

At time t5, the row decoder module 12A temporarily applies a kick voltage AR-CGkick to the selected word line WL, and then applies a read voltage AR. In addition, at time t5, the sequencer 17 lowers the voltages of the control signals BLC1 and BLC2 in a stepwise manner, respectively, associated with the waveforms of the word line WL on the "Near" side and on the "Far" side.

It should be noted that, in the above-described read operation, the timing when the row decoder module 12A applies the kick voltage to the selected word line WL may not coincide with the timing when the sequencer 17 starts lowering the voltage of the control signal BLC from the kick voltage.

Since the other operation in the read operation of the semiconductor memory device 10 according to the seventeenth embodiment is like the read operation of the semiconductor memory devices 10 according to the tenth embodiment, a description thereof is omitted.

[17-2] Advantages Provided by the Seventeenth Embodiment

As described above, in the read operation in the seventeenth embodiment, the kick operation for the word line WL is added to the read operation in the sixteenth embodiment. Even in this case, the semiconductor memory device 10 according to the seventeenth embodiment can provide the same advantages as the semiconductor memory devices 10 according to the sixteenth embodiment.

Furthermore, in the read operation in the seventeenth embodiment, the kick operation for the word line WL is executed. Thus, the time that is needed for the voltage of the word line WL on the "Far" side to reach a desired read voltage becomes shorter than in the read operation in the sixteenth embodiment. Therefore, in the semiconductor memory device 10 according to the seventeenth embodiment, the speed of the read operation can be made higher than in the semiconductor memory device 10 according to the sixteenth embodiment.

[18] Eighteenth Embodiment

A semiconductor memory device 10 according to an eighteenth embodiment has a configuration similar to the semiconductor memory device 10 according to the seventh embodiment. The read operation of the eighteenth embodiment differs from the read operation described in the seventeenth embodiment with respect to the control method of the control signal BLC.

[18-1] Operation

Figure 35:
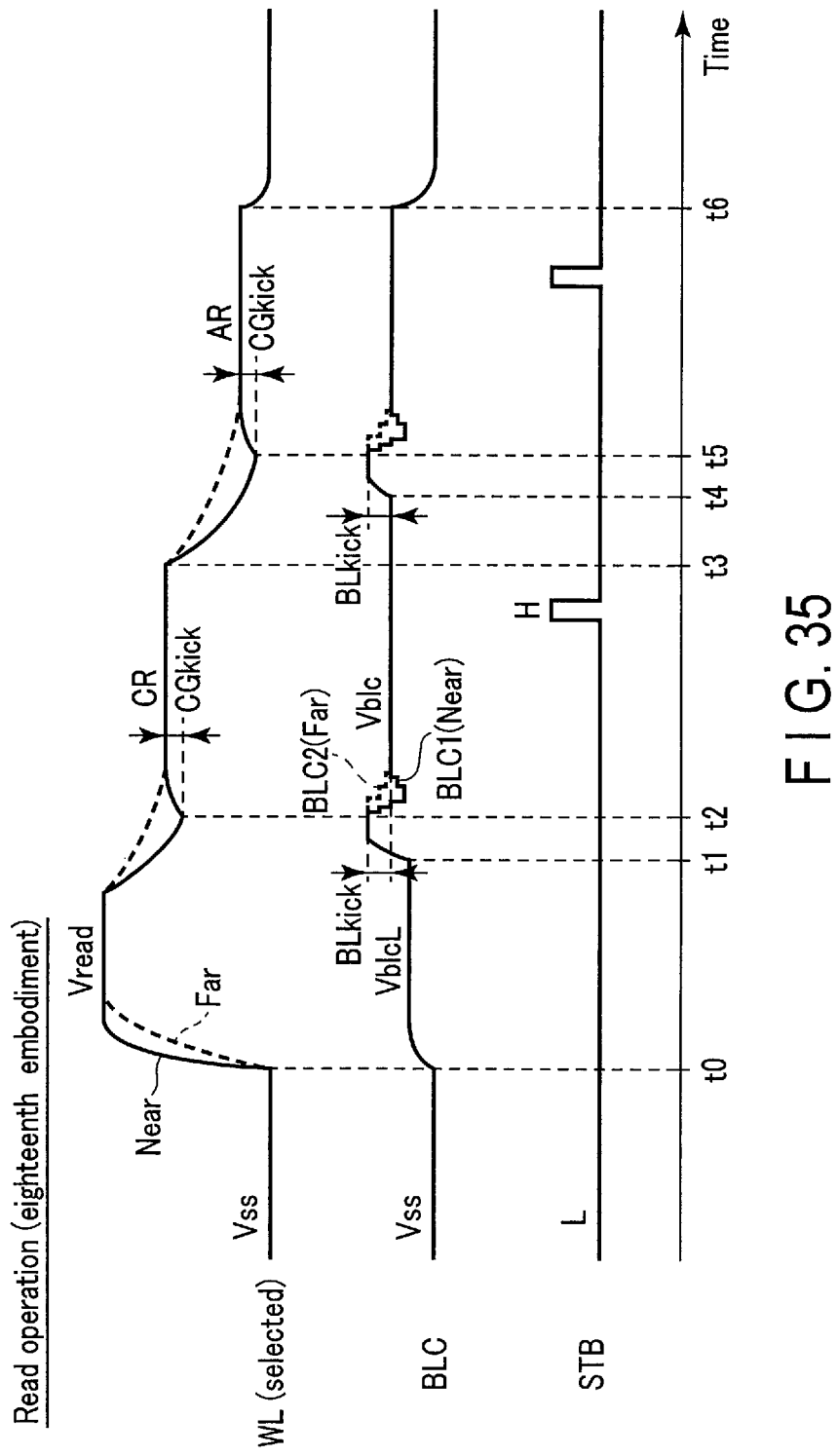
FIG. 35 illustrates an example of waveforms of signals in a read operation of a semiconductor memory device according to an eighteenth embodiment.

FIG. 35 illustrates an example of waveforms in a read operation in the semiconductor memory device 10 according to the eighteenth embodiment. FIG. 35 illustrates an example of a waveform on the selected word line WL in an even-numbered block BLK and an example of waveforms of control signals BLC and STB in a case in which the even-numbered block BLK is selected.

As illustrated in FIG. 35, the read operation in the eighteenth embodiment differs from the read operation in the seventeenth embodiment described with reference to FIG. 34, with respect to the waveform of the control signal BLC.

Specifically, at time t1, the BLC drivers DR1 and DR2 output the control signals BLC at, for example, the kick voltage Vblc+BLkick. Then, at time t2, the BLC driver DR1 corresponding to the "Near" side temporarily lowers the voltage of the control signal BLC1 to a voltage that is lower than the voltage Vblc, and then raises the voltage of the control signal BLC1 to the voltage Vblc. On the other hand, the BLC driver DR2 corresponding to the "Far" side lowers the voltage of the control signal BLC2 to the voltage Vblc. At this time, the BLC drivers DR1 and DR2 vary the output control signals BLC1 and BLC2 in a stepwise manner.

Similarly, at time t4, the BLC drivers DR output control signals BLC at, for example, the kick voltage Vblc+BLkick. Then, at time t5, the BLC driver DR1 temporarily lowers the voltage of the control signal BLC1 to a voltage that is lower than the voltage Vblc, and then raises the voltage of the control signal BLC1 to the voltage Vblc. On the other hand, the BLC driver DR2 lowers the voltage of the control signal BLC2 to the voltage Vblc. At this time, the BLC drivers DR1 and DR2 vary the output control signals BLC1 and BLC2 in a stepwise manner.

As described above, the sequencer 17 once causes the BLC drivers to execute the kick operation in the positive direction for the entirety of the control signal BLC, and then causes the BLC driver corresponding to the "Near" side to execute the kick operation in the direction to lower the voltage of the control signal BLC below a target voltage (negative direction). Since the other operation in the read operation of the semiconductor memory device 10 according to the eighteenth embodiment is like the read operation of the semiconductor memory device 10 according to the seventeenth embodiment described with reference to FIG. 34, a description thereof is omitted.

[18-2] Advantages Provided by the Eighteenth Embodiment

As described above, in the read operation in the eighteenth embodiment, the kick operation in the negative direction is added after the kick operation in the positive direction for the control signal BLC, as compared to the read operation in the seventeenth embodiment. Even in this case, the semiconductor memory device 10 according to the eighteenth embodiment can provide the same advantages as the semiconductor memory devices 10 according to the seventeenth embodiment.

In addition, in the read operation in the eighteenth embodiment, the kick operation in the negative direction is executed for the control signal BLC. Thus, with respect to both the word line WL and the control signal BLC, the voltage transition direction immediately before reaching the target voltage is the direction of rising of voltage on the "Near" side, and the direction of falling of voltage on the "Far" side.

Thereby, in the semiconductor memory device 10 according to the eighteenth embodiment, the variation in the word line WL and the variation in the control signal BLC can be made close more precisely than in the seventeenth embodiment. Therefore, the reliability of the read operation on can be more enhanced than in the seventeenth embodiment.

[19] Nineteenth Embodiment

A semiconductor memory device 10 according to a nineteenth embodiment has a configuration similar to the semiconductor memory device 10 according to the first embodiment. The read operation in the nineteenth embodiment is one example of a modification of the read operation in a case in which the RC delay amount of the word line WL on the "Far" side is large.

[19-1] Operation

FIG. 36 illustrates an example of waveforms of a read operation in the semiconductor memory device 10 according to the nineteenth embodiment. As illustrated in FIG. 36, the read operation in the nineteenth embodiment differs from the read operation in the third embodiment described with reference to FIG. 14, with respect to the operation performed subsequently to time t5.

Specifically, at time t5, the row decoder module 12A executes the kick operation for the word line WL and temporarily applies a kick voltage CR+CGkick to the selected word line WL, and then lowers the voltage of the word line WL to the read voltage CR. At this time, since the RC delay amount of the word line WL on the "Far" side is large, while the voltage of the word line WL on the "Near" side transitions to the voltage CR after the application of the kick voltage CR+CGkick, the voltage of the word line WL on the "Far" side transitions to the read voltage CR without exceeding the read voltage CR.

At time t6 during the transition of the voltage of the word line WL from the voltage AR to the read voltage CR, the sequencer 17 executes the kick operation for the control signal BLC, and the BLC driver DR outputs a control signal BLC at, for example, a kick voltage Vblc+BLkick.

Thereafter, at time t7, the sequencer 17 sets the control signals SELL and RPO at the "L" level. Then, the transistors TL and TD enter the OFF state, and the current paths between the BLC driver DR and the sense amplifier module 13 decrease.

In addition, at time t7, the sequencer 17 lowers the voltage of the control signal BLC to the voltage Vblc. At this time, while the voltage of the control signal BLC on the "Far" side in the inside of the sense amplifier section SA descends following the output voltage of the BLC driver DR, the voltage of the control signal BLC on the "Near" side descends with a delay from the descent on the "Far" side.

The operation performed subsequently to time tB in the read operation of the semiconductor memory device 10 according to the nineteenth embodiment is like the operation performed subsequently to time tB in the read operation of the semiconductor memory device 10 according to the third embodiment described with reference to FIG. 14. Thus, a description thereof is omitted.

[19-2] Advantages Provided by the Nineteenth Embodiment

As described above, when the RC delay amount of the word line WL on the "Far" side is large, there is a tendency that, immediately after the kick operation of the word line WL, an over-discharge occurs in the bit line BL corresponding to the "Near" side, and an under-discharge occurs in the bit line BL corresponding to the "Far" side. In this case, it is preferable to execute such control that the kick amount on the "Far" side in the kick operation for the control signal BLC is less than the kick amount on the "Near" side.

Thus, in the read operation in the nineteenth embodiment, the direction of driving of the control signal BLC in the kick operation is reversed, as compared to the read operation in the first embodiment. In other words, in the read operation in the first embodiment, the direction of driving of the word line WL and the direction of driving of the control signal BLC are the same. By contrast, in the read operation in the nineteenth embodiment, such control is executed that these directions of driving are opposed.

In this case, since the kick voltage of the control signal BLC descends earlier on the "Far" side than on the "Near" side, the effect by the kick operation for the control signal BLC on the "Far" side becomes weaker. On the other hand, since the kick voltage of the control signal BLC descends later on the "Near" side than on the "Far" side, the effect by the kick operation for the control signal BLC on the "Near" becomes stronger.

Specifically, the semiconductor memory device 10 according to the nineteenth embodiment can increase the kick amount of the control signal BLC for the bit line BL on the "Near" side which has a tendency of over-discharge, and can decrease the kick amount of the control signal BLC for the bit line BL on the "Far" side which has a tendency of under-discharge.

Thereby, the semiconductor memory device 10 according to the nineteenth embodiment, like the first embodiment, it is possible to shorten the stabilization time of the bit line BL in the case in which the kick operation is executed for the word line WL.

[20] Modifications

The semiconductor memory device 10 according to one embodiment includes first to fifth conductors, a plurality of bit lines, a plurality of first sense amplifiers, first to third contacts. The first conductor <WL in FIG. 7> is extending in a first direction. A plurality of first memory cells <WL in FIG. 8> is connected to the first conductor. The bit lines are respectively connected to the first memory cells. The plurality of first sense amplifiers <SAU in FIG. 5> are respectively connected to a plurality of first bit lines included in the bit lines. Each of the first sense amplifiers include a first sense node <SEN in FIG. 6>, and a first transistor <22 in FIG. 6> connected between the first sense node and a corresponding one of the first bit lines. The second conductor <60 in FIG. 10> is provided in a first layer <GC in FIG. 10>. The second conductor is extending in the first direction. The second conductor is functioning as gate electrodes of the first transistors included in the first sense amplifiers. First and second contacts each have a pillar shape and are provided on the second conductor. The first contact <61A in FIG. 10> is in contact with one end portion of the second conductor in the first_direction. The second contact <61B in FIG. 10> is in contact with the other end portion of the second conductor in the first direction. The third contact <63A in FIG. 10> have a pillar shape and provided on the second conductor. At least one of the first sense amplifiers are arranged in a region between the third contact and the first contact. At least one of the first sense amplifiers are arranged in a region between the third contact and the second contact. The third conductor <62A in FIG. 10> is provided in a second layer which is different from the first layer. The third conductor is in contact with the first contact. The fourth conductor <62B in FIG. 10> is provided in the second layer. The fourth conductor is in contact with the second contact. The fifth conductor <64A in FIG. 10> is provided in a third layer which is different from either of the first layer and the second layer. The fifth conductor and the second conductor are electrically connected via the third contact.

In the read operation described in the first embodiment, as illustrated in FIG. 12, the case is described in which various control signals are controlled such that the discharge of the word line WL and the discharge of the control signal BLC start substantially at the same time at time t7. However, the read operation is not limited to this. For example, when the RC delay amount of the word line WL does not exactly coincide with the RC delay amount of the control signal BLC, the sequencer 17 may control the timing of the start of discharge of the control signal BLC to be shifted from the timing of the start of discharge of the word line WL.

Specifically, for example, when the RC delay amount of the word line WL is relatively smaller than the RC delay amount of the control signal BLC, the sequencer 17 may control the timing of the start of discharge of the control signal BLC (the operation at time t7) to be shifted earlier than the timing of the start of discharge of the word line WL. On the other hand, when the RC delay amount of the word line WL is relatively greater than the RC delay amount of the control signal BLC, the sequencer 17 may control the timing of the start of discharge of the control signal BLC (the operation at time instant t7) to be shifted later than the timing of the start of discharge of the word line WL.

In this case, the variations in voltages of the word line WL and the control signal BLC on the "Far" side can be made close to each other, and the stabilization time of the voltage in the bit line BL corresponding to the "Far" side can be shortened. On the other hand, a difference occurs between the variations in voltages of the word line WL and the control signal BLC on the "Near" side. However, inherently there is a tendency that the stabilization time of the bit line BL on the "Near" side is shorter than that on the "Far" side. Specifically, by setting the stabilization time of the bit line BL corresponding to the "Far" side shorter in preference to the "Near" side, the stabilization time of the bit lines BL as viewed as a whole can be shortened.

This operation can be applied to the embodiments other than the first embodiment. Moreover, when the RC delay amounts of the word lines WL differ between block addresses, the sequencer 17 may set the timing of the start of discharge of the control signal BLC depending on each of the block addresses. When the RC delay amounts of the word lines WL differ between addresses of word lines WL, the sequencer 17 may set the timing of the start of discharge of the control signal BLC depending on each of the addresses of the word lines WL.

In the above-described embodiments, by way of example, the case is described in which in the read operation the kick amount CGkick of the word line WL and the kick amount BLkick of the control signal BLC are fixed values, respectively. However, the read operation is not limited to this.

For example, the position where the semiconductor pillar MH is connected to the bit line BL varies depending on block addresses. Thus, there is a case in which the amount of variation of the voltage of a bit line BL by the kick operation of the word line WL varies in bit lines due to different resistance values of the bit lines BL corresponding to the respective semiconductor pillars MH. In addition, there is a case in which since the semiconductor pillar MH also has a high resistance, the amount of variation of the voltage of the bit line BL by the kick operation of the word line WL varies depending on the address of the selected word line WL.

Thus, in the semiconductor memory device 10 according to the above embodiments, the sequencer 17 may change the kick amount CGkick of the word line WL or may change the kick amount BLkick of the control signal BLC in accordance with the block address or the address of the word line WL. Thereby, the semiconductor memory device 10 according to the above embodiments can apply optimal kick amounts in accordance with the selected block BLK and word line WL. Therefore, the stabilization time of the bit line BL can be shortened, and the speed of the read operation can be increased.

In the above embodiments, the read operation of upper page data is described by way of example. However, the embodiments are not limited to this example. For example, the operations described in the above embodiments are also applicable to the read operation of lower page data. In addition, the operations described in the first to nineteenth embodiments are similarly applicable to the read operation in a case in which data of one bit or three or more bits is stored in one memory cell.

Additionally, in the above embodiments, by way of example, the case is described in which the row decoder modules 12 are provided under the memory cell array 11. However, the embodiments are not limited to this example. For example, the memory cell array 11 may be formed on the semiconductor substrate, and the row decoder modules 12A and 12B may be disposed such that the memory cell array 11 is interposed between the row decoder modules 12A and 12B. Even in this case, the operations described in the above embodiments can be executed.

Additionally, in the above embodiments, by way of example, the case is described in which the semiconductor memory device 10 reads data on a page-by-page basis. However, the embodiments are not limited to this example. For example, the semiconductor memory device 10 may be configured to read batchwise the data of plural bits stored in the memory cells. Even in this case, there may be a case in which the kick operation is applied at a time of voltage application in the read operation. Thus, the operations described in the above embodiments can be applied in the semiconductor memory device 10.

Additionally, in the above embodiments, the read operations are described with reference to the flowcharts illustrating the waveform on the word line WL. The waveform on the word line WL is associated with, for example, the waveform on the signal line supplying a voltage to the row decoder module 12. Specifically, in the above embodiments, the voltage which is applied to the word line WL and the period during which the voltage is applied to the word line WL can generally be found by checking the voltage of the corresponding signal line. The voltage of the word line WL may be lower than the voltage of the corresponding signal line due to a voltage drop by a transfer transistor included in the row decoder module 12.

Additionally, in the above embodiments, the case in which a MONOS film is used for the memory cell is described by way of example. However, the embodiments are not limited to this example. For example, even when a memory cell utilizing a floating gate is used, the same advantages can be obtained by executing the read operations described in the embodiments.

Additionally, in the above embodiments, by way of example, the case is described in which the via contacts VC electrically connected to the respective conductors 42 pass through the conductors 42. However, the embodiments are not limited to this example. For example, the via contacts VC corresponding to the respective conductors 42 may be connected to the corresponding diffusion regions 52 by passing from the respective conductors 42 in different interconnect layers through the conductor 40. Furthermore, in the above description, by way of example, the case is described in which the via contacts BC, VC, HU and TRC are formed of one-stage pillars. However, the embodiments are not limited to this example. For example, these via contacts may be formed by coupled pillars of two or more stages. When these multiple-stage pillars of two or more stages are coupled, the coupling may be formed via different conductors.

Additionally, the memory cell array 11 may have other configurations. Another configuration of the memory cell array 11 is disclosed, for example, in U.S. patent application Ser. No. 12/407,403 filed Mar. 19, 2009 and entitled "THREE DIMENSIONAL STACKED NONVOLATILE SEMICONDUCTOR MEMORY." In addition, other configurations of the memory cell array 11 are disclosed in U.S. patent application Ser. No. 12/406,524 filed Mar. 18, 2009 and entitled "THREE DIMENSIONAL STACKED NON-VOLATILE SEMICONDUCTOR MEMORY", U.S. patent application Ser. No. 12/679,991 filed Mar. 25, 2010 and entitled "NONVOLATILE SEMICONDUCTOR STORAGE DEVICE AND MANUFACTURING METHOD THEREOF", and U.S. patent application Ser. No. 12/532,030 filed Mar. 23, 2009 and entitled "SEMICONDUCTOR MEMORY AND METHOD FOR MANUFACTURING SAME." The entirety of these patent applications is incorporated in the present specification by reference.

The block BLK is, for example, an erase unit of data in the three-dimensional semiconductor memory device, but is not limited thereto. Other erase operations are described in U.S. patent application Ser. No. 13/235,389 entitled "Nonvolatile semiconductor memory device" filed on Sep. 18, 2011, and in U.S. patent application Ser. No. 12/694,690 entitled "Non-volatile semiconductor memory device" filed on Jan. 27, 2010. These patent applications are incorporated by reference herein in their entirety.

In the present specification, the term "connect", "connecting", "connected" or "connection" means that an electrical connection is established, and does not exclude, for example, an electric connection with another element intervening. In addition, in this specification, the term "shut", "shutting off", "shut off" or "shut-off" means that an associated switch is in an OFF state, and does not exclude a state in which a small current such as a leak current of a transistor flows.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as Tao or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first word line extending in a first direction;
   a second word line provided on one side of the first word line in a second direction and extending in the first direction, the first and second direction crossing each other;
   a first memory cell, a gate of the first memory cell being connected to the first word line;
   a second memory cell, a gate of the second memory cell being connected to the first word line, the second memory cell being positioned at one side in the first direction with respect to the first memory cell;
   a third memory cell, a gate of the third memory cell being connected to the second word line, the third memory cell being positioned at the one side in the second direction with respect to the first memory cell;
   a fourth memory cell, a gate of the fourth memory cell being connected to the second word line, the fourth memory cell being positioned at the one side in the first direction with respect to the third memory cell;
   a first bit line connected to one end of the first memory cell and one end of the third memory cell, the first bit line extending in the second direction;
   a second bit line connected to one end of the second memory cell and one end of the fourth memory cell, the second bit line extending in the second direction;
   a first sense amplifier including a first transistor, the first transistor being connected to the first bit line; and
   a second sense amplifier including a second transistor, the second transistor being connected to the second bit line,
   a first row decoder connected to the first word line, the first row decoder being provided closer to the first memory cell as compared with the second memory cell when viewed in a third direction, the first to third directions crossing one another;
   a second row decoder connected to the second word line, the second row decoder being provided closer to the third memory cell as compared with the fourth memory cell when viewed in the third direction,
   wherein
   during a first read operation to judge data stored in the first memory cell and the second memory cell,
      a first voltage is applied to a gate of the first transistor, and
      a second voltage different from the first voltage is applied to a gate of the second transistor, and
   during a second read operation to judge data stored in the third memory cell and the fourth memory cell,
      the second voltage is applied to the gate of the first transistor, and
      the first voltage is applied to the gate of the second transistor.

2. The semiconductor memory device according to claim 1, wherein
   the first row decoder and the second row decoder are provided on opposite sides in the first direction when viewed in the third direction.

3. The semiconductor memory device according to claim 2, wherein
   the first row decoder is activated during the first read operation, and
   the second row decoder is activated during the second read operation.

4. The semiconductor memory device according to claim 1, wherein
   the first word line includes a first connection portion at one end thereof in the first direction,
   the second word line includes a second connection portion at one end thereof in the first direction, the one end of the first word line and the one end of the second word line being provided on opposite sides in the first direction when viewed in the third direction,
   the first row decoder is connected to the first connection portion of the first word line, and
   the second row decoder is connected to the second connection portion of the second word line.

5. The semiconductor memory device according to claim 1, further comprising;

a fifth memory cell being connected between the first
memory cell and the first bit line;
a sixth memory cell being connected between the second
memory cell and the second bit line;
a third word line provided above the first word line in the
third direction, the third word line includes a third
connection portion at one end thereof in the first
direction such that the first connection portion of the
first word line is exposed from the third connection
portion of the third word line when viewed in the third
direction;
wherein
the first row decoder is connected to the first connection
portion of the first word line and the third connection
portion of the third word line.

6. The semiconductor memory device according to claim 5, further comprising;
a seventh memory cell being connected between the third memory cell and the first bit line;
an eighth memory cell being connected between the fourth memory cell and the second bit line;
a fourth word line provided above the second word line in the third direction, the fourth word line includes a fourth connection portion at one end thereof in the first direction such that the second connection portion of the second word line is exposed from the fourth connection portion of the fourth word line when viewed in the third direction;
wherein
the second row decoder is connected to the second connection portion of the second word line and the fourth connection portion of the fourth word line.

7. The semiconductor memory device according to claim 1, wherein
the first voltage is increased with a first rate and decreased with a second rate, and
the second voltage is increased with the first rate and decreased with a third rate gentler than the second rate.

8. The semiconductor memory device according to claim 1, wherein
each of the first voltage and the second voltage has a waveform which is increased and thereafter gradually decreased, and
the first voltage is decreased faster than the second voltage.

9. The semiconductor memory device according to claim 1, wherein
each of the first voltage and the second voltage has a waveform which is increased and thereafter decreased in a stepwise manner, and
the first voltage is decreased faster than the second voltage.

10. The semiconductor memory device according to claim 1, further comprising;
a controller;
a first signal line connected between the controller and the gate of the first transistor of the first sense amplifier; and
a second signal line connected between the controller and the gate of the second transistor of the second sense amplifier.

11. The semiconductor memory device according to claim 10, wherein
the controller includes a first sub controller and a second sub controller,
the first signal line is connected between the first sub controller and the gate of the first transistor of the first sense amplifier, and
the second signal line is connected between the second sub controller and the gate of the second transistor of the second sense amplifier.

12. The semiconductor memory device according to claim 10, wherein
the first signal line and the second signal line are disconnected from each other.

13. A method for controlling a semiconductor memory device,
the semiconductor memory including;
a first word line extending in a first direction;
a second word line provided on one side of the first word line in a second direction and extending in the first direction, the first and second direction crossing each other;
a first memory cell, a gate of the first memory cell being connected to the first word line;
a second memory cell, a gate of the second memory cell being connected to the first word line, the second memory cell being positioned at one side in the first direction with respect to the first memory cell;
a third memory cell, a gate of the third memory cell being connected to the second word line, the third memory cell being positioned at the one side in the second direction with respect to the first memory cell;
a fourth memory cell, a gate of the fourth memory cell being connected to the second word line, the fourth memory cell being positioned at the one side in the first direction with respect to the third memory cell;
a first bit line connected to one end of the first memory cell and one end of the third memory cell, the first bit line extending in the second direction;
a second bit line connected to one end of the second memory cell and one end of the fourth memory cell, the second bit line extending in the second direction;
a first sense amplifier including a first transistor, the first transistor being connected to the first bit line; and
a second sense amplifier including a second transistor, the second transistor being connected to the second bit line,
a first row decoder connected to the first word line, the first row decoder being provided closer to the first memory cell as compared with the second memory cell when viewed in a third direction, the first to third directions crossing one another;
a second row decoder connected to the second word line, the second row decoder being provided closer to the third memory cell as compared with the fourth memory cell when viewed in the third direction,
the method comprising;
performing a first read operation to judge data stored in the first memory cell and the second memory cell, by applying a first voltage to a gate of the first transistor, and applying a second voltage different from the first voltage to a gate of the second transistor; and
performing a second read operation to judge data stored in the third memory cell and the fourth memory cell, by applying the second voltage to the gate of the first transistor, and applying the first voltage to the gate of the second transistor.

* * * * *